(12) United States Patent
Maeda

(10) Patent No.: US 7,257,790 B2
(45) Date of Patent: Aug. 14, 2007

(54) LAYOUT STRUCTURE OF SEMICONDUCTOR INTEGRATED CIRCUIT AND METHOD FOR FORMING THE SAME

(75) Inventor: Jun Maeda, Mihama-ku (JP)

(73) Assignee: Kawasaki Microelectronics, Inc., Chiba (JP)

(*) Notice: Subject to any disclaimer, the term of this patent is extended or adjusted under 35 U.S.C. 154(b) by 405 days.

(21) Appl. No.: 10/951,864

(22) Filed: Sep. 29, 2004

(65) Prior Publication Data

US 2005/0076320 A1    Apr. 7, 2005

(30) Foreign Application Priority Data

Oct. 2, 2003    (JP)    ............... 2003-344777

(51) Int. Cl.
*G06F 17/50*    (2006.01)
(52) U.S. Cl. ............... 716/10; 716/8; 716/19; 716/21
(58) Field of Classification Search ............ 716/10, 716/19, 21, 8
See application file for complete search history.

(56) References Cited

U.S. PATENT DOCUMENTS

| | | | |
|---|---|---|---|
| 5,066,997 A | 11/1991 | Sakurai et al. | |
| 5,278,105 A | 1/1994 | Eden et al. | |
| 5,534,724 A | 7/1996 | Nagamine et al. | |
| 5,705,301 A | 1/1998 | Garza et al. | |
| 5,723,233 A | 3/1998 | Garza et al. | |
| 5,885,856 A | 3/1999 | Gilbert et al. | |
| 5,923,969 A | 7/1999 | Oyamatsu et al. | |
| 6,189,136 B1 | 2/2001 | Bothra | |
| 6,503,667 B1 * | 1/2003 | Kobayashi | 430/5 |
| 6,563,148 B2 | 5/2003 | Kawashima et al. | |
| 6,567,964 B2 | 5/2003 | Shin et al. | |
| 6,603,162 B1 | 8/2003 | Uchiyama et al. | |
| 6,635,935 B2 | 10/2003 | Makino | |
| 6,693,315 B2 | 2/2004 | Kuroda et al. | |
| 6,727,028 B2 * | 4/2004 | Kotani et al. | 430/5 |
| 2001/0004122 A1 | 6/2001 | Ito | |
| 2002/0108098 A1 * | 8/2002 | Igeta | 716/21 |
| 2003/0152873 A1 * | 8/2003 | Tainaka et al. | 430/313 |

FOREIGN PATENT DOCUMENTS

| | | |
|---|---|---|
| JP | A-61-214559 | 9/1986 |
| JP | A-7-335844 | 12/1995 |
| JP | A-9-289251 | 11/1997 |
| JP | A-2001-144171 | 5/2001 |
| JP | A-2002-009161 | 1/2002 |

\* cited by examiner

*Primary Examiner*—Sun James Lin
(74) *Attorney, Agent, or Firm*—Oliff & Berridge, PLC

(57) ABSTRACT

In an exemplary layout structure of a semiconductor integrated circuit manufactured by a photolithographic process using an exposing light having a wavelength $\lambda$, a peripheral circuit region is formed by arranging a plurality of peripheral circuit cells, each having peripheral circuit patterns, along a side of an internal circuit region. A proximity dummy region is formed by arranging a plurality of proximity dummy cells, each having a proximity dummy pattern, along at least one side of the peripheral circuit region. The proximity dummy region includes a line-and-space repetition structure including, and having the regularity of, two or more pairs of lines and spaces between the lines every $8\lambda$. The repetition structure in the proximity dummy region reduces the dimensional deviation in the outermost portion of the peripheral circuit region.

28 Claims, 22 Drawing Sheets

LAYOUT STRUCTURE OF SEMICONDUCTOR INTEGRATED CIRCUIT AND METHOD FOR FORMING THE SAME

BACKGROUND OF THE INVENTION

1. Field of the Invention

This invention relates to a layout structure of a semiconductor integrated circuit formed by using a photolithographic process, a method of forming the layout structure, and a photomask for use in the photolithographic process to form the layout structure.

2. Description of the Related Art

Semiconductor memory integrated circuits such as RAM (Random Access Memory), ROM (Read Only Memory), or the like, generally have a memory cell array and various kinds of peripheral circuits arranged around the memory cell array. In the memory cell array, a specific number of memory cells, each of which is a unit for storing information, are generally two-dimensionally arranged. The peripheral circuits read and write information from and to the desired memory cells within the memory cell array.

In such semiconductor memory, which includes the memory cell array and the peripheral circuits, peripheral circuit regions are formed by one-dimensionally arranging a number of various types of "peripheral circuit cells", along the corresponding sides of the memory-cell array. Each of the peripheral circuit cells includes a device pattern for forming a circuit for interfacing with a corresponding number (usually, 1, 2, 4, 8, 16, . . . , $2^n$; wherein n is an integer not less than zero) of rows or columns of the memory cell array.

In general, the process margin is constantly decreasing with the rapid advance of fine patterning used for manufacturing semiconductor integrated circuits. In particular, while processing in an area where the patterns having the same dimension are arranged with a uniform density can be made with relative ease, it is generally extremely difficult to make processing with sufficient precision in an area where the patterns have low uniformity.

When an exposing light irradiates a semiconductor substrate having a positive-type photo resist layer through a patterned mask, ideally, the exposing light does not irradiate the area where the mask pattern is provided. Therefore, the resist layer on these masked areas is not exposed.

However, in reality, some of the exposing light reaches the area on the semiconductor substrate where the patterned mask is provided, due to scattering of the exposing light passing through the space between the mask patterns. As a result, the resist in the area, which is not to be exposed, is partially exposed. With the decrease of the pattern dimension, such unintended exposure of the resist layer becomes a significant problem.

Even in such a situation, the region having high uniformity of pattern density and high pattern regularity, such as, for example, the inner region of the memory cell array, can be processed with sufficient precision. That is, correction of the mask pattern by giving consideration to the resist pattern deformations due to the scattered light, or an optical proximity correction (OPC), can be effectively performed on a region having high uniformity of pattern density and high pattern regularity. In addition, the optimization of exposing conditions may also be effective for such a region.

However, at the outermost portion of the memory cell array, the pattern regularity is lost and the uniformity of pattern density is markedly degraded. As a result, the processing at the outermost portion of the memory cell array often leads to an insufficient precision.

Accordingly, a conventional method has been made in which "dummy cells" having the same pattern as the memory cell, and which are not required for realizing logical functions of the semiconductor integrated circuit, are arranged along the outer perimeter of the memory cell array. Thereby, the pattern density around the outer perimeter of the memory cell array is improved. See Japanese Unexamined Patent Application Publication No. 61-214559 (Patent Document 1), which is incorporated herein by reference.

As described above, for the memory cell array in which a plurality of cells, each having the same device pattern, the uniformity of pattern density can be improved by arranging dummy cells having the same pattern as the cells. On the other hand, for a semiconductor integrated circuit having various device patterns for providing various logical functions, a technique has been proposed in which dummy patterns different from the device pattern are arranged in the region with low pattern density, i.e., the region having no device pattern. See Japanese Unexamined Patent Application Publication No. 2002-9161 (Patent Document 2), which is also incorporated herein by reference.

According to the technique disclosed in Patent Document 2, two data are separately created on a CAD tool. The first one is a data in which the dummy pattern cells, each having a dummy pattern, are arranged over the entire chip area where the device structures of the semiconductor integrated circuit is to be formed. The second one is a data in which device patterns for realizing logical functions of the semiconductor integrated circuit, such as active region patterns, well patterns, gate electrode patterns, and the like, are arranged in the same chip area. Subsequently, these two data of the chip area are superimposed by logical synthesis, whereby a data of the chip area, in which both of the device patterns and the dummy cells are arranged, is created. It should be noted that, in the logical synthesis, the dummy cells that overlap the device patterns are deleted. In general, on the chip area thus designed, the dummy cells are arranged so as to surround the device patterns.

However, according to the technique disclosed in Patent Document 1, no measure is provided for improving the uniformity of pattern density in the peripheral circuit region, leading to marked irregularities in the pattern density at the perimeter of the peripheral circuit region, thus often resulting in pattern formation with insufficient precision.

Furthermore, each peripheral circuit cell has a large area as compared with the memory cell. Therefore, a simple application of the technique disclosed in Patent Document 1, i.e., arranging dummy cells each having the same device pattern as with the peripheral circuit cell around the perimeter of the peripheral circuit region, would require an excessively large waste of the area on the chip.

It would be also possible to employ the technique disclosed in Patent Document 2 for improving the uniformity of pattern density at the perimeter of the peripheral circuit region.

However, in the technique disclosed in Patent Document 2, there is a need to maintain a margin between the dummy pattern and the device pattern for ensuring adequate electrical insulation between the two patterns and for accounting for the error in the mask alignment. Accordingly, dummy cells are deleted over a region larger than the region where the device patterns are arranged by a certain margin. This procedure leads to the creation of gaps between the device patterns and the dummy cells.

Furthermore, there is no relationship between the layout of the dummy cells and the layout of the device pattern. That is, there is no relationship between the grids used in the CAD tool on which the dummy cells are placed and the grids on which the device patterns are placed. Accordingly, the size of the gap between the device pattern and the dummy cell remaining after they are superimposed on each other differs for each device pattern.

Accordingly, even if the dummy pattern arranging technique disclosed in Patent Document 2 is applied to arrange dummy cells around the perimeter of the peripheral circuit region, gaps with varying sizes will form between the device patterns at the outermost portion of the peripheral circuit region and the dummy patterns. With such a layout, while the uniformity of the pattern density is improved compared to a layout having no dummy patterns, the uniformity is not sufficiently improved for advanced fine-patterning technology.

Furthermore, the dummy pattern layout technique disclosed in Patent Document 2 was proposed to improve the uniformity of pattern density, not to improve the pattern regularity.

In many cases, the peripheral circuit region includes at least one layer in which a plurality of line-shaped patterns are arranged in parallel with each another with generally the same interval, whereby a line-and-space repetition structure is formed along a certain direction. The inventor has discovered through experiments that the exposure process is affected by the pattern regularity formed by such repetition structure, as well as by the uniformity of pattern density. Especially, when forming fine patterns with a width of half or less than the wavelength of the exposing light of 248 nm or less, the process is greatly affected by pattern regularity.

However, the exemplary dummy pattern disclosed in Patent Document 2 has the shape of a simple rectangle. Such dummy pattern would not provide the pattern regularity of the same level of regularity at the internal portion of the peripheral circuit region. Accordingly, even if the dummy pattern layout technique disclosed in Patent Document 2 improves the uniformity of pattern density, this technique does not improve the pattern regularity.

Accordingly, even if the dummy pattern arranging technique disclosed in Patent Document 2 is applied to the peripheral circuit region, significant pattern deformations would occur at the outermost portion of the peripheral circuit region due to poor uniformity of pattern density and poor pattern regularity. Thus, it becomes difficult to perform processing with the high precision required for advanced fine-patterning technology in the future.

It should be appreciated that an extensive OPC may be made so as to correct the significant deformation of the pattern occurring at the region where the pattern is formed with low uniformity and regularity. However, such extensive correction generally leads to a reduction of process margin, that is, the resist pattern becomes susceptible to significant dimensional deviation due to deviation in the exposing light intensity, the deviation of the focus, and the like, over the exposed area. As a result, the resist pattern is formed with extremely poor precision around the perimeter of the peripheral circuit region.

Furthermore, with the technique disclosed in Patent Document 2, logical synthesis processing, which requires a great deal of calculation, is required, leading to a long processing time for the layout design.

SUMMARY OF THE INVENTION

This invention has been made in order to solve the aforementioned problems. It is an object of this invention to provide a layout structure of a semiconductor integrated circuit having dummy patterns for improving the pattern regularity as well as improving the uniformity of pattern density in the outermost portion of the peripheral circuit region. It is also an object of this invention to provide a method of forming a layout structure, or a layout design method, of a semiconductor integrated circuit having the above-mentioned dummy patterns. It is a further object of this invention to provide a photomask for manufacturing a semiconductor integrated circuit having the above-mentioned layout structure.

Furthermore, it is another object of this invention to provide a layout method for designing the layout structure of a semiconductor integrated circuit in a short period of time with little or no logical synthesizing.

According to an exemplary embodiment of this invention, a layout structure of a semiconductor integrated circuit formed on a semiconductor substrate by a photolithographic process using an exposing light having a wavelength of $\lambda$ includes an internal circuit region, a peripheral circuit region and a proximity dummy region.

An exemplary internal circuit region includes a cell array formed by arranging a plurality of unit cells in rows and columns, and an outer perimeter of the internal circuit region has an internal side. The exemplary peripheral circuit region is formed by arranging a plurality of peripheral circuit cells along the internal side. Each of the peripheral circuit cells is different from the unit cell and includes a peripheral circuit pattern in at least one layer, and an outer perimeter of the peripheral circuit region has a peripheral side that does not face the internal side. Also, the exemplary proximity dummy region is formed by arranging a plurality of proximity dummy cells along the peripheral side. Each exemplary proximity dummy cell has a proximity dummy pattern, which does not contribute to a logical function of the semiconductor integrated circuit, in the at least one layer.

Furthermore, the proximity dummy patterns in the plurality of proximity dummy cells arranged along the peripheral side form, in the at least one layer, a line-and-space repetition structure extending along the peripheral side and including two or more pairs of lines and spaces between the lines every $8 \times \lambda$ at any position within the proximity dummy region.

Here, the layout structure of the exemplary semiconductor integrated circuit includes patterns in a plurality of layers for forming the semiconductor integrated circuit arranged in a chip area of the semiconductor integrated circuit. The layout structure is designed using a CAD tool, which is a computer system for designing a pattern layout. At this stage, the layout structure is formed as a logical layout structure stored in a storage device, having a data structure that is readable by a computer system.

Photomasks for use in the photolithographic process are produced based on the logical layout structure. These exemplary masks are used to form a semiconductor integrated circuit on a semiconductor substrate having a physical layout structure corresponding to the logical layout structure. Accordingly, the layout structure of the semiconductor integrated circuit according to an exemplary embodiment of this invention is realized as the logical layout structure in a storage device using a CAD tool, and is also realized as the physical layout structure within a semiconductor integrated circuit formed on a semiconductor substrate.

Accordingly, the layout structure according to this invention may be a physical layout structure formed on a semiconductor substrate, and also may be a logical layout structure to be later formed on a semiconductor substrate.

Forming a proximity dummy region, which improves the pattern regularity as well as the uniformity of pattern density, along a side of the peripheral circuit region is found to be effective to reduce the deviation in the pattern size at the outermost portion of the peripheral circuit region.

In the peripheral circuit region, in general, a plurality of line-shaped patterns are arranged in at least one layer, e.g., in a gate layer, in parallel with each another with generally the same interval, whereby a line-and-space repetition structure is formed. Furthermore, formation of a proximity dummy region, which also includes a line-and-space repetition structure formed of a plurality of line-shaped proximity dummy patterns in the same layer, along the perimeter of the peripheral circuit region improves the pattern regularity as well as the uniformity of pattern density. Thereby, dimensional deviation in the fine patterns is effectively reduced.

According to various exemplary embodiments, the proximity dummy region having the line-and-space repetition structure may preferably formed along the entire length of a side of the peripheral circuit region, but may also be formed only along specific portions of the side of the peripheral circuit region.

In many cases, the peripheral circuit region includes the line-and-space repetition structure with a pattern regularity of two or more pairs of lines and spaces between the lines every length of $8\times\lambda$. Accordingly, the proximity dummy region may also be formed with the line-and-space repetition structure having the pattern regularity of two or more pairs of lines and spaces every $8\times\lambda$. Preferably, the line-and-space repetition structure in the proximity dummy region has such regularity at any position within the proximity dummy region in order to the improve the pattern regularity at any position around the outermost portion of the peripheral circuit region along at least a portion of the side of the peripheral circuit region along which the proximity dummy region is formed.

Furthermore, in the layout structure of the semiconductor integrated circuit, in many cases, the peripheral circuit pattern in the peripheral circuit region has portion with small dimensions that require the OPC. However, the layout structure of the proximity dummy region is preferably designed with the minimum dimension that does not require the OPC.

Usually, the peripheral circuit region of the layout structure is formed with a fine pattern size generally the same as the minimum dimension permitted by the photolithographic process, e.g., approximately a half of the wavelength of exposing light. In the portions of the mask pattern for forming such fine patterns, OPC is performed to reduce the deviation in the pattern size.

On the other hand, the proximity dummy patterns are designed with a minimum dimension that does not require the OPC. In other words, no OPC is required for any of the portions of the patterns in the proximity dummy region. As a result, the amount of processing for creating the mask data from the layout data, the size of the mask data, and the costs and time for designing the masks can be reduced.

Preferably, the peripheral side of the peripheral circuit region is opposite to the internal circuit region.

In general, there is a large area having no device patterns along the side of the peripheral circuit region opposite to the internal circuit region. At the outermost portion of the peripheral circuit region near such side, a large deviation in the pattern size often occurs. Therefore, it is desirable to form the proximity dummy region along such side to improve the uniformity of the pattern density and the pattern regularity, thereby reducing the deviation in the pattern size.

The line-and-space repetition structure in the proximity dummy region preferably extends in parallel with the line-and-space repetition structure in the peripheral circuit region. That is, the line-and-space repetition structure in the proximity dummy region is preferably formed with dummy patterns arranged in the same direction as with the line-shaped patterns forming the line-and-space repetition structure in the peripheral circuit region, thereby more effectively improving the pattern regularity in the outermost portion of the peripheral circuit region.

Furthermore, the line-and-space repetition structure in the proximity dummy region is preferably formed with the regularity of three or more pairs of lines and spaces every $8\times\lambda$, and is more preferably formed with four or more pairs of lines and spaces every $8\times\lambda$.

Also, a distance, in the direction perpendicular to the peripheral side, between the line-and-space repetition structure in the proximity dummy region and a portion of the peripheral circuit pattern having the dimension that requires the OPC closest to the peripheral side is preferably not larger than $4\times\lambda$. More preferably, the distance is not larger than $3\times\lambda$, or not larger than $2\times\lambda$.

According to an exemplary embodiment, the line-and-space repetition structure in the proximity dummy region preferably has a height of not less than $4\times\lambda$ in the direction perpendicular to the peripheral side. Preferably, the line-and-space repetition structure in the proximity dummy region has a height of not less than $5\times\lambda$, or a height of not less than $6\times\lambda$.

In the layout structure of the semiconductor integrated circuit according to an exemplary embodiment of this invention, a memory-cell array may be employed as the cell array. On the other hand, a sense amplifier, a write driver, a column decoder, a word driver, a row decoder, an address prerecorder, or timing generator, may be employed as the peripheral circuit.

According to another exemplary embodiment of this invention, the proximity dummy region is formed by arranging a proximity dummy cell along the peripheral side of the peripheral circuit region. The peripheral circuit patterns in the peripheral circuit cells arranged along the internal side and the proximity dummy pattern in the proximity dummy cell arranged along the peripheral side form, in the at least one layer, a continuous line-and-space repetition structure including lines and spaces between the lines. The line-and-space repetition structure includes one of the lines, in each of the peripheral circuit region and the proximity dummy region, within $4\times\lambda$ from a first one of the lines in the peripheral circuit region closest to the peripheral side.

According to this exemplary embodiment, the proximity dummy region is formed along at least one of the sides of the peripheral circuit region by arranging the proximity dummy pattern in the proximity dummy cell such that the peripheral circuit patterns arranged in the peripheral circuit region and the proximity dummy pattern arranged along the side of the peripheral circuit region form a continuous line-and-space repetition structure. As a result, the uniformity of pattern density and the pattern regularity improve at the outermost portion of the peripheral circuit region near the side along which the proximity dummy region is formed.

According to an exemplary embodiment, the line-and-space repetition structure preferably includes two lines in the proximity dummy region within $4\times\lambda$ from the first one of the lines.

According to an exemplary embodiment of this invention, a method of forming, on a computer system, a layout structure of a semiconductor integrated circuit on a semiconductor substrate by a photolithographic process using an exposing light having a wavelength of $\lambda$, includes preparing, in a library, a unit cell, a peripheral circuit cell, and a proximity dummy cell. The peripheral circuit cell is different from the unit cell and includes a peripheral circuit pattern in at least one layer. The exemplary proximity dummy cell includes a proximity dummy pattern, which does not contribute to a logical function of the semiconductor integrated circuit, in the at least one layer.

The exemplary method of forming a layout structure further includes forming an internal circuit region by arranging a plurality of unit cells in rows and columns, an outer perimeter of the internal circuit region having an internal side; forming a peripheral circuit region by arranging a plurality of peripheral circuit cells along the internal side, an outer perimeter of the peripheral circuit region having a peripheral side that does not face the internal side; and forming a proximity dummy region by arranging a plurality of proximity dummy cells along the peripheral side, such that the proximity dummy patterns in the plurality of proximity dummy cells arranged along the peripheral side form, in the at least one layer, a line-and-space repetition structure extends along the peripheral side. Furthermore, the line-and-space repetition structure includes two or more pairs of lines and spaces between the lines every $8\times\lambda$ at any position within the proximity dummy region.

In the exemplary method of forming a layout structure according to an exemplary embodiment, preferably, each of the peripheral circuit cell and the proximity dummy cell prepared in the library includes a well pattern in a well layer, and the forming of the proximity dummy region is performed such that the well pattern in each of the plurality of proximity dummy cells arranged along the peripheral side merge with the well pattern in the corresponding peripheral circuit cell.

Furthermore, preferably, the photolithographic process utilizes an optical proximity correction (OPC), the peripheral circuit pattern includes portions having dimensions that require the OPC, and the proximity dummy pattern has a minimum dimension that does not require the OPC.

According to another exemplary embodiment of this invention, the method of forming a layout structure includes forming an internal circuit region by arranging a plurality of unit cells in rows and columns, an outer perimeter of the internal circuit region having an internal side; forming a peripheral circuit region by arranging a plurality of peripheral circuit cells along the internal side, an outer perimeter of the peripheral circuit region having a peripheral side that does not face the internal side; and forming a proximity dummy region by arranging the proximity dummy cell along the peripheral side.

The exemplary proximity dummy region is formed such that the peripheral circuit patterns in the peripheral circuit cells arranged along the internal side and the proximity dummy pattern in the proximity dummy cell arranged along the peripheral side form, in the at least one layer, a continuous line-and-space repetition structure including lines and spaces between the lines. Furthermore, the line-and-space repetition structure includes one of the lines, in each of the peripheral circuit region and the proximity dummy region, within $4\times\lambda$ from a first one of the lines in the peripheral circuit region closest to the peripheral side.

In the exemplary method of forming the layout structure, preferably, each of the peripheral circuit cell and the proximity dummy cell prepared in the library includes a well pattern in a well layer, and the forming of the proximity dummy region is performed such that the well pattern in the proximity dummy cell arranged along the peripheral side merge with the well pattern in corresponding peripheral circuit cell.

According to another exemplary method of forming a layout structure of a semiconductor integrated circuit includes preparing a unit cell and a combined peripheral circuit cell in a library. The combined peripheral circuit cell includes a peripheral circuit pattern, in at least one layer, adjacent to a first side of a frame of the combined peripheral circuit cell, and a plurality of proximity dummy patterns, which do not contribute to a logical function of the semiconductor integrated circuit, in the at least one layer, adjacent to a second side of the frame opposite to the first side.

The exemplary method of forming a layout structure further includes arranging a plurality of unit cells in rows and columns to form an internal circuit region, an outer perimeter of the internal circuit region having an internal side; and arranging a plurality of combined peripheral circuit cells along the internal side with the first sides of their frames facing the internal side. The combined peripheral circuit cells are arranged such that the peripheral circuit patterns in the plurality of combined peripheral circuit cells form a peripheral circuit region; and the proximity dummy patterns in the plurality of combined peripheral circuit cells form a proximity dummy region having, in the at least one layer, a line-and-space repetition structure extending in a direction parallel to the internal side and including two or more pairs of lines and spaces between the lines every $8\times\lambda$ at any position within the proximity dummy region.

According to the exemplary method of forming a layout structure described above, a peripheral circuit cell including the proximity dummy patterns is prepared as a combined peripheral circuit cell. This allows the user to make a layout design without proximity dummy cells separately prepared, thereby facilitating layout design of the layout structure having the proximity dummy region. As a result, it becomes unnecessary to prepare a separate proximity dummy cell for forming the proximity dummy region.

Also, by arranging the combined peripheral circuit cells, the proximity dummy region is formed simultaneously with the formation of the peripheral circuit region. Accordingly, a step for forming the proximity dummy region can be omitted.

According to an exemplary embodiment of this invention, a photomask includes a mask pattern for forming one of a plurality of layers in a layout structure of a semiconductor integrated circuit by producing a reduced image of the mask pattern on a semiconductor substrate using an exposing light having a wavelength of $\lambda$. The layout structure includes an internal circuit region, a peripheral circuit region, and a proximity dummy region.

The exemplary internal circuit region includes a cell array formed by arranging a plurality of unit cells in rows and columns, an outer perimeter of the internal circuit region having an internal side. The peripheral circuit region is formed by arranging a plurality of peripheral circuit cells along the internal side, each of the peripheral circuit cells is different from the unit cell and includes a peripheral circuit pattern in the one of the plurality of layers, an outer perimeter of the peripheral circuit region having a peripheral side that does not face the internal side. The exemplary proximity dummy region is formed by arranging a plurality of proximity dummy cells along the peripheral side, each proximity dummy cell has a proximity dummy pattern, which does not contribute to a logical function of the semiconductor integrated circuit, in one of the plurality of layers.

Furthermore, the exemplary proximity dummy patterns in the plurality of proximity dummy cells arranged along the peripheral side form, in the one of the plurality of layers, a line-and-space repetition structure extending along the peripheral side and including two or more pairs of lines and spaces between the lines every $8 \times \lambda$ at any position within the proximity dummy region.

According to another exemplary embodiment of this invention, a photomask includes a mask pattern for forming one of a plurality of layers in a layout structure of a semiconductor integrated circuit by producing a reduced image of the mask pattern on a semiconductor substrate using an exposing light having a wavelength of $\lambda$. The layout structure includes an internal circuit region, a peripheral circuit region, and a proximity dummy region.

The exemplary proximity dummy region is formed by arranging a proximity dummy cell along the peripheral side. Furthermore, the peripheral circuit patterns in the peripheral circuit cells arranged along the internal side and the proximity dummy pattern in the proximity dummy cell arranged along the peripheral side form, in the one of the plurality of layers, a continuous line-and-space repetition structure including lines and spaces between the lines, and the line-and-space repetition structure includes one of the lines, in each of the peripheral circuit region and the proximity dummy region, within $4 \times \lambda$ from a first one of the lines in the peripheral circuit region closest to the peripheral side.

In these exemplary photomasks, preferably, an optical proximity correction (OPC) is performed for a first portion of the mask pattern for forming the peripheral circuit region, but not performed for a second portion of the mask pattern for forming the proximity dummy region. More preferably, $\lambda$ is not larger than 248 nm, and the OPC is performed for, within the first portion, third portions of the mask pattern for forming portions of the peripheral circuit region having dimensions less than a critical dimension which is less than about $\lambda$.

The exemplary embodiment of this invention provides a layout structure of a semiconductor integrated circuit including a peripheral circuit region with improved pattern regularity as well as improved uniformity of pattern density even at the outermost portion thereof. This exemplary embodiment further provides a method of forming the aforementioned layout structure of the semiconductor integrated circuit. This exemplary embodiment further provides a photomask used for manufacturing the aforementioned layout structure of the semiconductor integrated circuit on a semiconductor substrate.

DESCRIPTION OF THE PREFERRED EMBODIMENTS

This invention was first disclosed in Japanese Patent Application No. 2003-344777, hereby incorporated by reference in its entirety.

Description will be made below regarding exemplary embodiments according to this invention with reference to the drawings.

Figure 1:
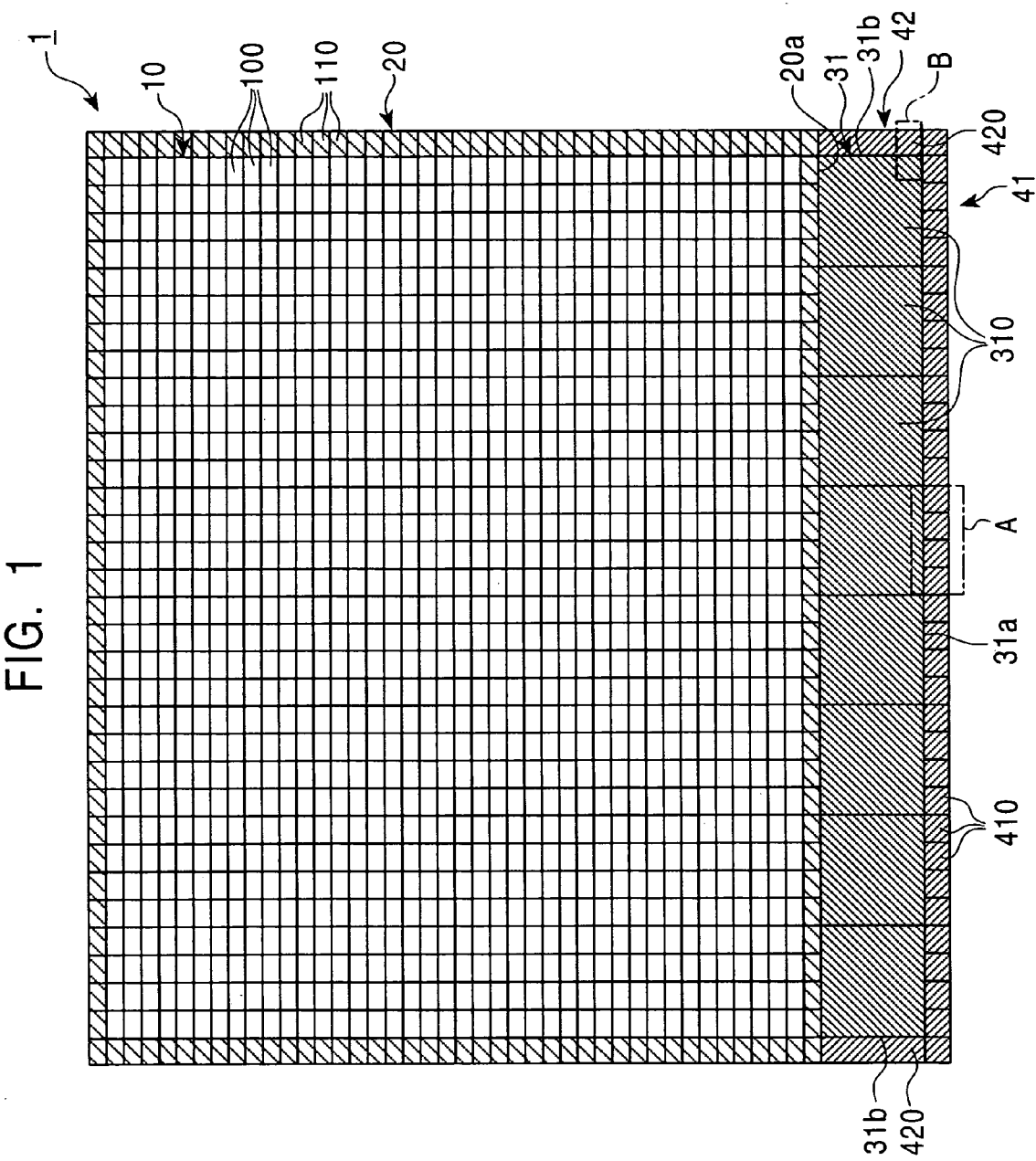
FIG. 1 is a diagram illustrating an exemplary layout structure of a semiconductor integrated circuit according to an embodiment of the present invention.

FIG. 1 is a diagram illustrating the principal components of an exemplary layout structure 1 of a semiconductor integrated circuit according to an embodiment of this invention. In the layout structure shown in FIG. 1, a plurality of memory cells 100 are arranged in rows and columns to form a memory cell array 10, and dummy memory cells 110, having the same size as with the memory cell 100, are arranged along the perimeter of the memory cell array 10, whereby an internal circuit region 20 is formed. Also, first peripheral circuit cells 310 are arranged along the entire length of the lower side 20a of the internal circuit region 20, whereby a peripheral circuit region 31 is formed.

Exemplary proximity dummy cells 410 are arranged along the entire length of the side 31a of the peripheral circuit region 31, whereby a proximity dummy region 41 is formed. The side 31a is the outer side, or the side of the peripheral circuit region 31 opposite to the lower side 20a of the internal circuit region 20. Moreover, the proximity dummy cell 420 is arranged along the entire length of each of the left and right sides 31b of the peripheral circuit region 31, whereby proximity dummy regions 42 are formed.

The proximity dummy region 41 formed along the outer side 31a of the peripheral circuit region 31 will be referred to as an "outer proximity dummy region", and the proximity dummy regions 42 formed along the left and right sides 31b of the peripheral circuit region 31 will be referred to as "side proximity dummy regions" hereafter, as necessary.

In the exemplary layout shown in FIG. 1, the memory cells 100 are closely arranged in horizontal and vertical directions to form the memory cell array 10 without making any gaps between them. However, the layout of the memory cells 100 is not limited to such arrangement. For example, the memory cell array may be divided into an upper block and a lower block, and twisting cells for twisting bit lines and inverse bit lines are arranged between the upper and lower blocks. Furthermore, filler cells for forming well contacts may be inserted at every certain number of rows of memory cells in the horizontal direction.

The memory cell 100 and the dummy memory cell 110 shown in FIG. 1 are examples of unit cells according to this invention. The exemplary dummy memory cell 110 shown in FIG. 1 has the same size as the memory cell 100. However, the dummy memory cell 110 may have various sizes that are different from that of the memory cell 100. For example, the dummy memory cell 110 may have the same height (the dimension in the vertical direction in the drawing) as the memory cell 100 and half the width (the dimension in the horizontal direction in the drawing) of the memory cell 100. Furthermore, the dummy memory cell 110 may have half the height of the memory cell 100 and the same width as the memory cell 100.

The exemplary peripheral circuit cell 310 shown in FIG. 1 is formed with a width of four times the width of the memory cell 100, and with a height greater than the height of the memory cell 100. The size of the peripheral circuit cell 310 is not limited to the case shown in FIG. 1. The peripheral circuit cell 310 may have a width of eight times the width of the memory cell 100, or sixteen times the width of the memory cell 100, for example.

In the exemplary layout structure shown in FIG. 1, the first peripheral circuit cells 310 are arranged along the entire length of the lower side 20a of the internal circuit region 20, whereby the peripheral circuit region 31 is formed. However, the layout structure is not limited to that shown in FIG. 1. For example, when the memory cell array 10 includes filler cells, the peripheral circuit cells 310 are arranged at positions other than the positions corresponding to the filler cells.

Of the proximity dummy cells shown in FIG. 1, the proximity dummy cell 410 forming the outer proximity dummy region 41 has the same width as the memory cell 100, i.e., a quarter of the width of the peripheral circuit cell 310.

In the exemplary layout structure shown in FIG. 1, the proximity dummy cells 410 are arranged along the entire length of the lower side 31a of the peripheral circuit region 31, whereby the outer proximity dummy region 41 is formed. However, the layout structure is not limited to the example shown in FIG. 1. For example, when the memory cell array 10 includes filler cells and the peripheral circuit cells 310 are arranged only at positions other than the positions corresponding to the filler cells, it may be possible to arrange the proximity dummy cells 410 only at positions where the peripheral circuit cells 310 are arranged.

On the other hand, the exemplary proximity dummy cell 420 forming the side proximity dummy region 42 has the same height as that of the peripheral circuit cell 310.

The exemplary layout structure such as the structure shown in FIG. 1 is formed or designed using a CAD tool, which is a kind of a computer system for designing the layout. In this stage, the layout structure is formed as a logical layout structure having a data structure that can be read by a computer system, and can be stored in a storage device. Also, masks are produced based upon the logical layout structure for the photolithographic processing, and a semiconductor integrated circuit having a physical layout structure is formed on a semiconductor substrate corresponding to the logical layout structure using the masks.

Thus, the layout structure of the semiconductor device according to an exemplary embodiment of this invention is formed as a physical layout structure formed on a semiconductor substrate, as well as a logical layout structure formed on a CAD tool and stored in a storage device. In other words, the logical layout structure is formed or designed on a CAD tool to be later formed on a semiconductor substrate as the physical layout structure.

The physical layout structure of the semiconductor integrated circuit has a multi-layered structure in which patterns in a plurality of layers such as an active layer, a gate layer, a wiring layer, and the like, are stacked on a semiconductor substrate. Accordingly, the logical layout structure stored in the storage device also composed of data for a plurality of layers. At the time of producing the masks, the logical layout structure data composed of the data for a plurality of layers is separated into a plurality of data sets, each corresponding to a single-layer structure data. Also, a plurality of masks each for forming patterns in the physical layout structure is produced based upon each of the single-layer structure data sets thus separated from the logical layout structure data.

In some cases, however, the layers in the logical layout structure on a CAD tool and the mask layers do not correspond to each other. For example, in an exemplary layout structure, patterns in the P+ active layer and in the N+ active layer are arranged separately. At the time of creating the mask data on the CAD tool, both the pattern data of the P+ active layer and the N+ active layer are merged, whereby a common active layer mask pattern is formed. In addition, a P+ implantation mask and an N+ implantation mask are formed based upon the pattern data of the P+ active layer and the N+ active layer. The implantation masks are used to make portions of the active regions formed using the common active region mask into P+ active regions, and the other portions into N+ active regions.

Figure 2:
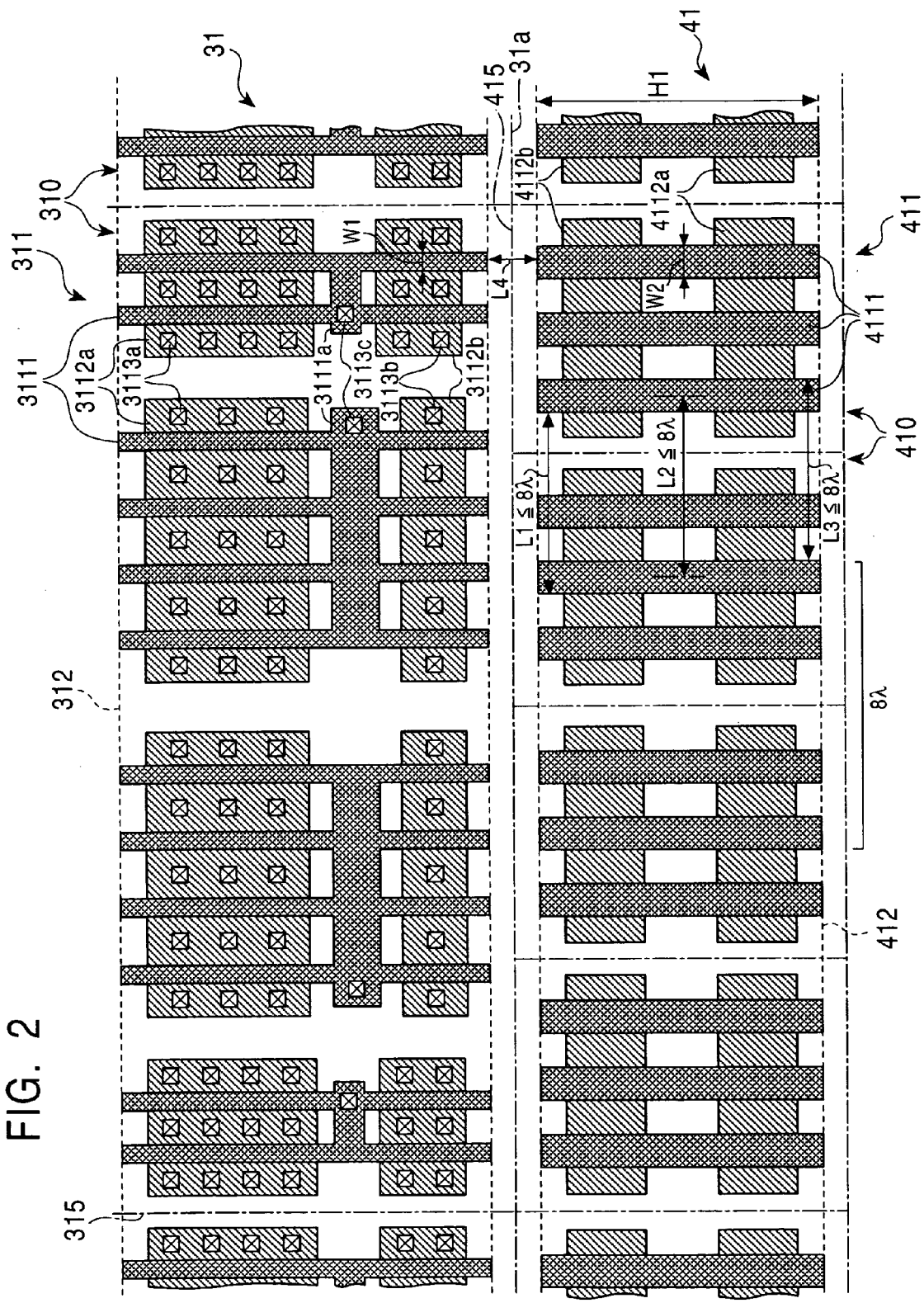
FIG. 2 is a diagram illustrating an exemplary pattern layout in the layout structure shown in FIG. 1 within a region A surrounded by alternating long and short dashed lines.

FIG. 2 shows the detail of the region A surrounded by an alternating long and short dashed line in the exemplary layout structure of the semiconductor integrated circuit shown in FIG. 1. FIG. 2 only shows patterns in some of the layers, i.e., patterns in active layer, gate layer, and patterns in contact layer, for connecting the patterns in the active and gate layers to patterns in wiring layer. Patterns in well layer, wiring layer, and so on, are not shown in FIG. 2.

FIG. 2 shows a pattern layout in a portion remote from the internal circuit region 20 of the patterns (peripheral circuit patterns) in three peripheral circuit cells 310. These three peripheral circuit cells 310 are arranged adjacent to each other along the lower side 20a of the internal circuit region. It should be appreciated that for the left and right two peripheral circuit cells, only portions of the patterns near the boundaries between the middle peripheral circuit cell are shown in the drawing. Also, FIG. 2 shows the patterns (proximity dummy patterns) 411 of the plurality of proximity dummy cells 410 arranged along the lower side 31a (see FIG. 1) of the peripheral circuit region 31.

The drawing such as shown in FIG. 2 shows an exemplary pattern layout which is part of the layout structure of the semiconductor integrated circuit designed on a CAD tool, as well as part of the layout structure of the semiconductor integrated circuit formed on a semiconductor substrate, which is formed by using photomasks produced based upon the layout structure designed on the CAD tool.

However, the patterns cannot be transferred onto the semiconductor substrate with exactly the same shape and size as with the original pattern shown in the drawing such as the one in FIG. 2 due to limitations in the processing technology. Furthermore, in some cases, the pattern on a semiconductor substrate is intentionally formed with a size that is different from that of the corresponding pattern in the layout structure on a CAD tool.

For example, for the gate pattern, which determines the characteristics of the MOSFET, the size of the mask pattern may be adjusted, i.e., made lager or smaller than the corresponding size of the pattern on the CAD tool. Thereby, the size of the gate pattern on the semiconductor substrate is optimized. Furthermore, a so-called trimming process may be performed in order to form a gate pattern with a size that is smaller than the lower limit of the photolithographic process. Accordingly, the size of the resist pattern formed by the photolithographic process may be reduced by the exposure to oxygen plasma, and then a conductive material film is etched using the resist pattern with the reduced pattern size as a mask to form the gate pattern.

It should be appreciated that specific dimensions disclosed in this specification are the dimensions in the logical layout structure on a CAD tool, except when noted otherwise. Furthermore, the following exemplary description assumes that the photolithographic process is performed using an exposing light with a wavelength of 248 nm.

The peripheral circuit pattern 311 shown in FIG. 2 includes a plurality of sets of P+ active patterns 3112a and N+ active patterns 3112b arranged in the vertical direction in the drawing. Furthermore, the peripheral circuit pattern 311 includes a plurality of line-shaped gate patterns 3111 extending in the vertical direction in the drawing so as to be stacked over the active region patterns.

Each of the exemplary line-shaped gate patterns 3111 is formed with a length in the vertical direction sufficient to fully overlap the P+ active pattern 3112a and the N+ active pattern 3112b arranged in the vertical direction. As such, the gate pattern 3111 extends beyond the upper side of the P+ active pattern 3112a, which is positioned on the upper side of the N+ active pattern, and further extends beyond the lower side of the N+ active pattern 3112b, which is positioned on the lower side of the P+ active pattern 3112a.

In the semiconductor integrated circuit, stacking a gate pattern over an active pattern, as shown in FIG. 2, forms a MOSFET. The width (see W1 in FIG. 2) of the gate pattern 3111, which overlaps the active pattern, determines the gate length of the MOSFET. In the peripheral circuit, the gate pattern is formed with a width of, for example, 0.12 µm, which is approximately half of the wavelength of the exposing light. As described later, optical proximity correction (OPC) is performed to mask patterns for forming such fine patterns.

The plurality of exemplary line-shaped gate patterns 3111 extends in the vertical direction in parallel with each other and arranged in the horizontal direction in the peripheral circuit cell 310. The spaces between the line-shaped gate patterns 3111 are set to be equal to or approximately equal to the minimum space determined by the layout design rule. Specifically, the layout design rule concerning the minimum spaces between the gate pattern 3111 and patterns in other layer for forming MOSFETs in combination with the gate pattern 3111, i.e., the well pattern (not shown), the active pattern 3112a, 3112, the contact pattern 3113a, 3113b, 3113c, and between adjacent patterns in these layers determines the minimum space. Accordingly, although the line-shaped gate patterns 3111 are not arranged with exactly the same interval, they are arranged with generally the same interval.

The exemplary peripheral circuit region 31 includes a plurality of peripheral circuit cells 310 arranged in the horizontal direction such that the left and right sides of the frames 315 of the peripheral circuit cells are in contact with each other. Accordingly, such arrangement of the line-shaped gate patterns 3111 with generally the same interval extends over the entire width (the dimension in the horizontal direction) of the peripheral circuit region 31. As a result, in the region along the lower side of the peripheral circuit region 31 surrounded by the dashed line in FIG. 2, a line-and-space repletion structure 312 extending over the entire length in the horizontal direction of the peripheral circuit region 31 is formed. That is, the line-shaped gate patterns 3111 form the lines in the repetition structure 312, and the spaces between the line-shaped gate patterns 3111 form the spaces in the repetition structure.

It should be appreciated that the peripheral circuit pattern 311 shown in FIG. 2 includes relatively wide connecting patterns 3111a, in the gate layer, between the P+ active pattern and the N+ pattern region, in addition to the line-shaped gate patterns 3111. The connecting pattern 3111a connects the line-shaped gate patterns 3111 with each other, and serves as regions for placing contacts 3113c for connecting the gate patterns 3111 to unshown wiring patterns. Nonetheless, the gate pattern of the peripheral circuit region has an overall layout structure in which a plurality of line-shaped patterns, each extending in the vertical direction, is arranged over the entire width in the horizontal direction.

On the other hand, the exemplary proximity dummy region 41 shown in FIG. 2 includes a plurality of proximity dummy cells 410 arranged in the horizontal direction along the lower side 31a of the peripheral circuit region 31. The lower side 31a of the peripheral circuit region 31 is formed with the lower sides of the frames 315 of the individual peripheral circuit cells 31 arranged in the horizontal direction. That is, the exemplary individual proximity dummy cells 410 are arranged along the lower side 31a of the peripheral circuit region 31, i.e., are arranged such that the upper side of the frame 415 is in contact with the lower side 31a of the peripheral circuit region 31.

It should be appreciated that, in the exemplary layout structure shown in FIG. 2, the proximity dummy cells 410 are arranged in the horizontal direction at a quarter pitch of the pitch of the arrangement of the first peripheral circuit cells 310.

Each exemplary proximity dummy cell 410 has a P+ active pattern 4112a and an N+ active pattern 4112b, arranged in the vertical direction in the drawing. Each proximity dummy cell 410 further includes three line-shaped gate patterns 4111 extending in the vertical direction and arranged in the horizontal direction with the same interval.

The gate pattern 4111 is formed with a width W2 of 0.25 μm, for example. The width W2 is generally the same as with the wavelength of the exposing light, and is relatively large as compared with the width W1 of the line-shaped gate pattern 3111 of the peripheral circuit pattern 311. Specifically, the width W2 is approximately twice the width W1. There is no need to perform OPC for such wide patterns.

The active patterns and the gate patterns within the proximity dummy cell 410 serve as "dummy patterns", that is, these dummy patterns are electrically floating, and do not contribute to logical functions of the semiconductor integrated circuit.

The exemplary proximity dummy region 41 includes a plurality of proximity dummy cells 410 having such proximity dummy pattern 411. Also, the plurality of proximity dummy cells 410 are arranged in the horizontal direction such that the left and right sides of the frames 415 of the proximity dummy cells 410 are in contact with each other. As a result, the plurality of line-shaped dummy gate patterns 4111 is arranged in the horizontal direction with generally the same interval over the entire width (the length in the horizontal direction) of the exemplary proximity dummy region 41.

Accordingly, the region surrounded by the broken line in the drawing has a line-and-space repetition structure 412, which is formed by the plurality of line-shaped dummy gate patterns 4111 arranged in the horizontal direction, extending in the horizontal direction over the entire width of the proximity dummy region 41. That is, the line-shaped dummy gate patterns 4111 arranged in the horizontal direction form the lines in the repletion structure, and the spaces between the line-shaped dummy gate patterns 4111 form the spaces in the repetition structure.

The exemplary line-and-space repetition structure 412 in the proximity dummy region 41 shown in FIG. 2 includes, or has a regularity of, two or more pairs of lines and spaces every 1.984 μm, or eight times the wavelength of the exposing light, at any position along the entire length of the lower side 31a of the peripheral circuit region 31. That is, the distance L2 between the centerlines of any adjacent two line-shaped dummy gate patterns 4111 is 8×λ or less (λ represents the wavelength of the exposing light).

It should be appreciated that in this case, all the exemplary proximity dummy patterns 411 are formed with the same width. Accordingly, the distance between the left sides L1 and the right sides L3 of adjacent two dummy gate patterns is the same as the distance between the centerlines of two adjacent dummy gate patterns.

The exemplary dummy gate pattern 4111 shown in FIG. 2 has a length in the vertical direction (height) H1 of 2.1 μm. Thus, the line-and-space repetition structure 412 has a height of 8×λ or more, along the direction perpendicular to the lower side 31a of the peripheral circuit region 31 along which the proximity dummy cells 410 are arranged.

In the exemplary proximity dummy region 41 shown in FIG. 2, the distance along the vertical direction (see the arrow L4) between the line-and-space repetition structure 412, or the line-shaped dummy gate patterns 4111 forming the repetition structure 412, and the line-shaped gate patterns 3111 in the peripheral circuit region 31, is 0.36 μm. That is, the distance between the portion of the line-shaped gate patterns 3111 within the peripheral circuit region 31 closest to the lower side 31a, along which the proximity dummy cells 410 are arranged, and the line-and-space repetition structure 412 in the proximity dummy region 41 is 2×λ or less.

It should be appreciated that at the portion of the exemplary line-shaped gate patterns 3111 closest to the lower side 31a in the peripheral circuit region 31, the gate patterns are formed with a small width (W1) that requires the OPC to correct pattern deformation occurring at the exposure process.

The exemplary line-and-space repetition structure 412 in the proximity dummy region 41 is formed with the regularity, size, and positional relationship to the gate pattern in the peripheral circuit region as explained above. Such repetition structure improves the uniformity of the pattern density and pattern regularity at the outermost portion near the lower side 31a of the peripheral circuit region 31.

Improvement in the uniformity of pattern density and in the pattern regularity due to the line-and-space repetition structure 412 is detailed below.

The exemplary peripheral circuit region 31 has the gate patterns with relatively high pattern density not only at the outermost portion near the lower side 31a shown in FIG. 2, but also over the entire portions thereof. Accordingly, the internal portion of the peripheral circuit region 31 has high uniformity of pattern density in the gate layer. However, when the proximity dummy region 41 is not formed along the lower side 31a of the peripheral circuit region 31, i.e., when the dummy gate patterns 4111 are not arranged along the lower side 31a of the peripheral circuit region 31, the uniformity of pattern density is degraded at the outermost portion of the peripheral circuit region 31 along the lower side 31a as compared with that in the internal portion.

On the other hand, in the layout structure shown in FIG. 2, the exemplary proximity dummy region 41 formed along the lower side 31a of the peripheral circuit region 31 maintains high uniformity of the pattern density at the outermost portion of the peripheral circuit 31 region near the lower side 31a.

Furthermore, the exemplary peripheral circuit region 31 has a plurality of line-shaped gate patterns arranged generally in the horizontal direction, not only in the outermost portion near the lower side 31a shown in FIG. 2, but also over the entire portions thereof. Accordingly, the internal portion of the peripheral circuit region 31 has high pattern regularity in the gate layer. However, when the proximity dummy region 41 is not formed along the lower side 31a of the peripheral circuit region 31, i.e., when the line-and-space repetition structure 412 is not formed along the lower side 31a, the pattern regularity is lowered at the outermost portion of the peripheral circuit region.

On the other hand, in the layout structure shown in FIG. 2, the exemplary proximity dummy region 41 is formed along the lower side 31a of the peripheral circuit region 31, and the line-and-space repetition structure 412 is formed in the proximity dummy region 41. Thus, high pattern regularity is maintained at the outermost portion near the lower side 31a of the peripheral circuit region 31.

As described above, the line-and-space repetition structure 412 improves the uniformity of pattern density and the pattern regularity, thereby reducing dimensional deviation in the fine gate patterns 3111 at the outermost portion near the lower side 31a of the peripheral circuit region 31 as described later in detail.

It should be appreciated that "uniformity of pattern density" or "pattern regularity" as used here means the average uniformity or regularity over a certain range that affects pattern size deviation in the exposing process. As will be shown later with reference to experimental results, the range that affects the pattern size deviation in the exposing process is about four to eight times the wavelength of the exposing light.

Figure 3:
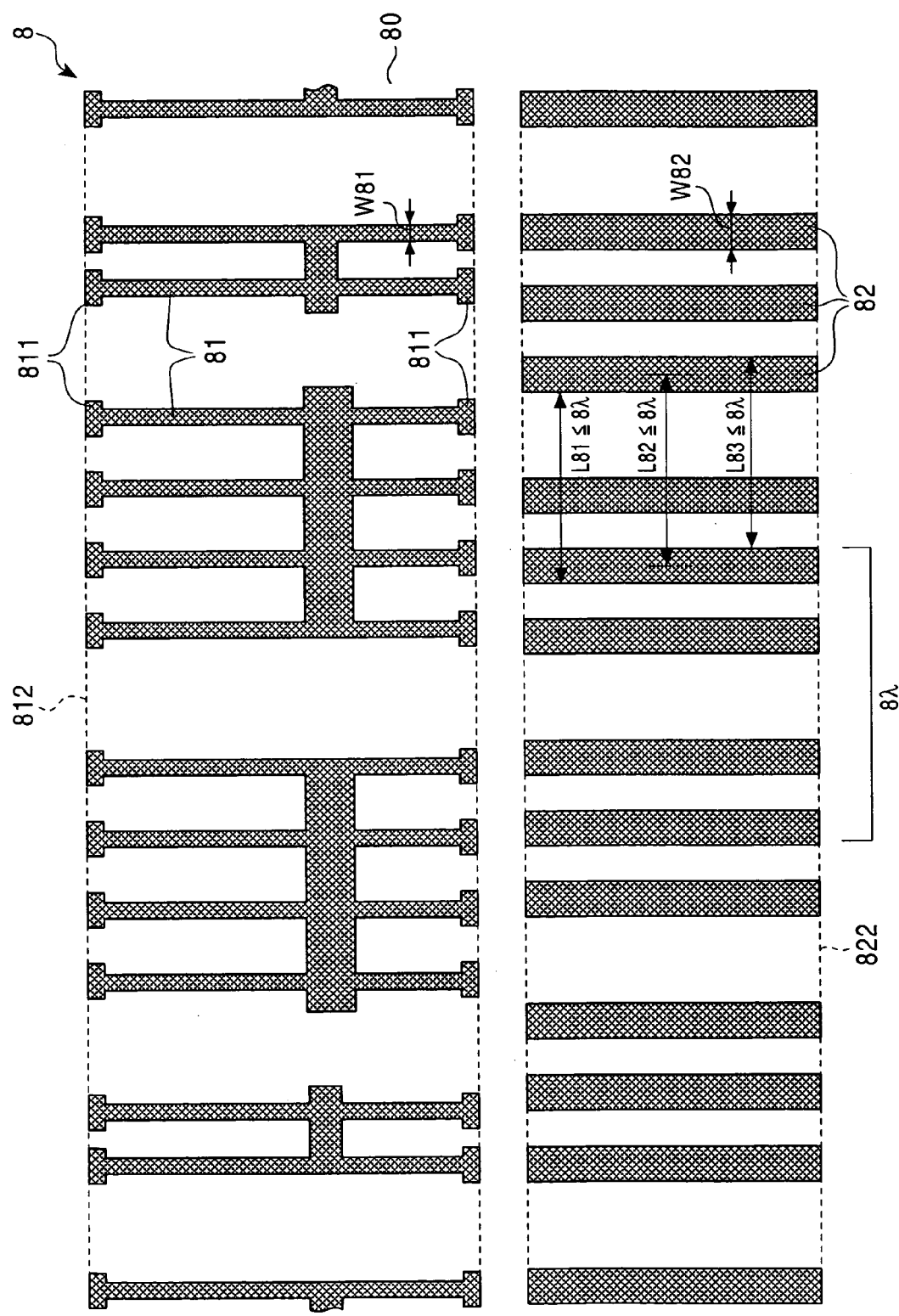
FIG. 3 is a diagram illustrating an exemplary mask pattern layout of a part of a photomask corresponding to the region shown in FIG. 2 and produced based upon the layout structure shown in FIG. 1.

Exemplary photomasks according to this invention are described below. FIG. 3 is a diagram illustrating a part of one of the exemplary photomasks corresponding to the part shown in FIG. 2, which are formed based upon the exemplary layout structure of the semiconductor integrated circuit shown in FIG. 1.

The photomask 8 shown in FIG. 3 is used for exposing a positive-type resist layer to form a resist pattern. The resist pattern thus formed is used as a mask for etching a conductive material film to form the gate pattern shown in FIG. 2. The exemplary photomask 8 has mask patterns 81 and 82 formed of a masking film such as a chromium film, or the like, on a quartz-glass substrate, or the like. The mask patterns 81 and 82 correspond to the gate patterns 3111 and 3111a within the peripheral circuit region 31 and the dummy gate patterns 4111 within the proximity dummy region 41, respectively, in the pattern layout shown in FIG. 2.

In manufacturing the semiconductor integrated circuit, the 1/m times reduced patterns of these mask patterns 81 and 82 are projected onto a semiconductor substrate having a resist layer using exposing light having a wavelength of λ. The reduction ration m is typically 4. The exposed resist layer is then developed to form a resist pattern. Subsequently, etching is performed for a conductive material film such as a polysilicon film, or the like, using the resist pattern formed by the exposing process as a mask. Thus, the gate pattern, which is a part of the layout structure of the semiconductor integrated circuit shown in FIG. 2, is formed.

Other layers are processed in the same way using the photomasks having corresponding mask patterns, whereby a semiconductor integrated circuit having the layout structure shown in FIGS. 1 and 2 is formed.

The exemplary photomask 8 shown in FIG. 3 has the mask pattern 81 corresponding to the gate pattern 3111 within the peripheral circuit region and the mask pattern 82 corresponding to the dummy gate pattern 4111 within the proximity dummy region shown in FIG. 2. As described above, the gate pattern 3111 shown in FIG. 2 is formed with the fine width W1 that requires OPC to correct the pattern deformation during the exposing process for transferring the mask pattern onto a semiconductor substrate. Specifically, the mask pattern 81 is designed such that each end of the line-shaped portion has a correction pattern 811, which is formed in the shape of a hammerhead as shown in FIG. 3.

The exemplary layout structure shown in FIG. 2 does not include such correction patterns 811. In the processing for creating the mask pattern data based upon the layout pattern data, a critical dimension is determined and portions having pattern sizes less than the critical dimension are extracted from the pattern data. Subsequently, OPC is performed for the portions thus extracted so as to include the correcting patterns for correcting pattern deformation during the exposing process. Thus, the mask pattern data is created.

Practically, the critical dimension is preferably determined to be less than the wavelength λ of the exposing light. Specifically, the critical dimension of 0.2 μm is employed in the case that the wavelength of the exposing light is 248 nm, for example. In the exemplary embodiment, OPC is performed for the portions with dimensions less than the critical dimension thus determined so as to correct the pattern deformation. As described above, the gate pattern 3111 has the width W of 0.12 μm, and accordingly, OPC is performed.

It is also possible to make the proximity dummy patterns outside of the processing to extract the portions to be corrected. For example, it is possible to provide layers for arrange the proximity dummy patterns separately from those for arranging device patterns, i.e., the peripheral circuit patterns and patterns for forming the internal circuit region. More specifically, for the gate layer, it is possible to provide a dummy-gate layer for arranging the proximity dummy patterns separately form a device-gate layer for arranging the gate patterns in the peripheral circuit region and the internal circuit region. Arranging the dummy patterns in separate layers makes it possible to extrude the dummy patterns from the processing to extract the portions to be corrected, and to shorten the processing time.

Needless to say, it is necessary to design the proximity dummy pattern to have a minimum dimension that does not require the OPC in order to make it unnecessary to perform the extraction processing. However, the minimum dimension of the proximity dummy pattern needs not to be the dimension that ensures the processing precision, without the OPC, sufficient for the device patterns. Rather, the minimum dimension of the proximity dummy pattern may be the dimension that only ensures the processing precision, without the OPC, sufficient for the proximity dummy pattern that does not contribute to the logical function of the semiconductor integrated circuit.

Thus, arranging the dummy patterns in separate layers further enables to perform an extensive OPC to the device patterns that would also be performed to the proximity dummy patterns if the proximity dummy patterns were arranged within the same layers.

As explained above, in the logical layer structure on a CAD tool, the device patterns (peripheral circuit patterns and patterns of the internal circuit region) and the proximity dummy patterns may be arranged in separate layers. For example, gate patterns in the peripheral circuit region and the dummy gate patterns in the proximity dummy region are separately arranged in the device-gate layer and in the dummy-gate layer, respectively. However, these separate layers are associated with each other, or included in the same layer, i.e., the gate layer in the case of the device-gate layer and the dummy-gate layer. That is, during the processing to create the mask data, pattern data in the device-gate layer and in the dummy-gate layer are merged to form the mask data for the gate layer.

Thus, for the purpose of this invention, it is considered that the device patterns, such as the gate patterns 3111, and the dummy patterns arranged for reducing the dimensional deviation of the device pattern, such as the dummy gate patterns 4111, are considered to be included in the same layer, even if they are arranged in separate layers in the logical layout structure.

Further, even if the gate patterns 3111 and the dummy gate patterns 4111 are arranged in separate layers in the logical layout structure, both the mask patterns 81 corresponding to the gate patterns 3111 and the mask patterns 82 corresponding to the dummy gate patterns 4111 are included in the same photomask, i.e., the gate layer photomask, as shown in FIG. 3. Similarly, in the physical layout structure of a semiconductor integrated circuit formed on a semiconductor substrate using such photomask, both the gate patterns 3111 and the dummy gate patterns 4111 are included in the same layer, i.e., the gate layer, as shown in FIG. 2.

In the example shown in FIG. 3, the OPC is performed according to a rule in which each end of line-shaped patterns with widths less than the critical dimension is formed in the shape of a hammerhead. As such, the patterns are corrected according to the rule-based OPC. However, the manner of correcting the mask pattern is not limited to the formation of such hammerhead portions 811. Rather, the correction may be made in various manners. For example, forming serifs, scattering bars, mask biasing, and the like, may be employed as the OPC. Furthermore, the pattern may be corrected according to the simulation-based OPC.

On the other hand, all the dummy gate patterns 4111 shown in FIG. 2 are formed with the same width (W2), or the minimum dimension of the dummy gate pattern. Specifically, in the exemplary layout pattern shown in FIG. 2, the width of the dummy gate patterns 4111 is set to be 0.25 µm, which does not require the OPC. In other words, the dummy gate patterns 4111 are formed with a minimum dimension equal to or more than the critical dimension.

Accordingly, the exemplary mask patterns 82 corresponding to the dummy gate patterns 4111 are designed without performing OPC. Accordingly, the mask patterns 82 thus designed have a shape similar to the shape of the dummy gate patterns 4111, i.e., the mask patterns 82 include no correcting portions such as the hammerhead portion 811.

As described above, the 1/m reduced patterns of these mask patterns 81 and 82 are projected onto a semiconductor substrate. Accordingly, portions of the mask pattern at which the correction is not performed are formed with approximately m times the pattern size of the corresponding pattern of the layout structure shown in FIG. 2.

In some cases, however, the size of the mask pattern in a particular layer is adjusted so as to compensate for the change in the pattern size in the photolithographic process and/or in the etching process, independent of the OPC performed for portions with dimensions less than the critical dimension. Accordingly, in such cases, the mask patterns 81 and 82 may not be formed with exactly m times the pattern sizes of the corresponding patterns 3111 and 4111 in the layout structure shown in FIG. 2, even at portions of the mask patterns designed without OPC.

In the exemplary photomask 8 shown in FIG. 3, similarly to the layout structure of the semiconductor integrated circuit shown in FIG. 2, mask patterns 81 and 82 form line-and-space repetition structures 812 and 822, respectively. Each of these repetition structures 812 and 822 has a pattern regularity of two or more pairs of lines and spaces every 8×m×λ along the direction of the repetition, or the horizontal direction, at any position within the repetition structure. Specifically, thge distance between the centerlines of the left and right ones of any sets of three adjacent mask patterns 82 in the repetition structure 822 is 8×m×λ or less (see the arrow L82 in FIG. 3).

It should be appreciated that in this case, the distance between the left sides or the right sides of the left and right ones of three adjacent mask patterns 82 is the same as the distance between the centerlines of the left and right ones of the three adjacent mask patterns 82 (see the arrows L81 and L83 in FIG. 3).

As described above, the photomask for the gate layer is designed based upon the layout structure shown in FIG. 2 such that the mask patterns 82 are formed corresponding to the dummy gate patterns, whereby the line-and-space repetition structure 822 is formed. The line-and-space repetition structure 822 improves the uniformity of the pattern density and the pattern regularity around the mask pattern 81 corresponding to the gate pattern 3111 in the peripheral circuit region. This reduces adverse effects of the scattered light during the projection of the mask pattern 81 onto a semiconductor substrate, thereby reducing dimensional deviation in the resist pattern.

An evaluation is made regarding the improvement in the uniformity of pattern density and the pattern regularity, and resulting reduction in the dimensional deviation, by forming the line-and-space repetition structure in the proximity dummy region. A suitable range for effectively reducing the dimensional deviation is discussed below.

Figure 4:
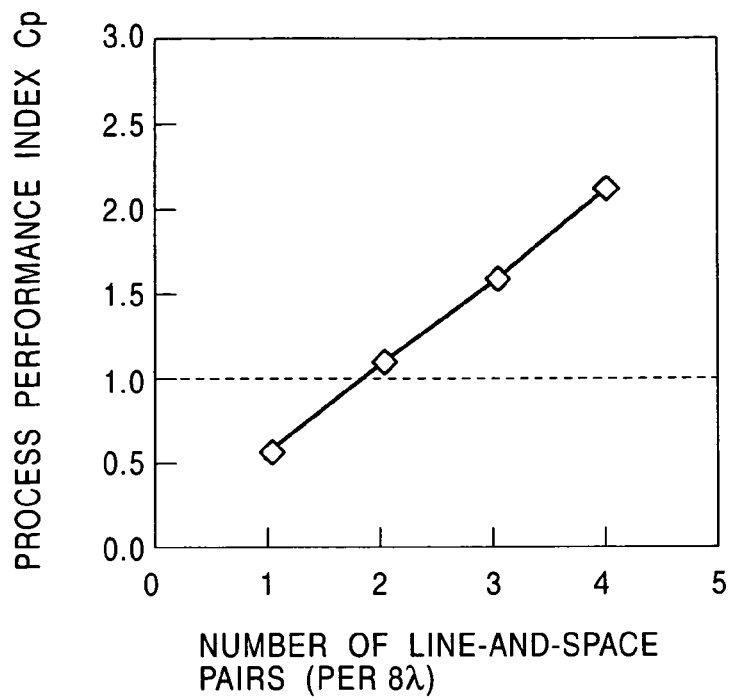
FIG. 4 is a chart illustrating a process performance index (Cp) of the exposing process in relation to the number of pairs of lines and spaces every $(8 \cdot \lambda)$ in the proximity dummy region.

FIG. 4 is a chart showing the process performance index (Cp) of the exposing process in relation to the number of pairs of lines and spaces every 8×λ in the line-and-space repetition structure in the proximity dummy region. The vertical axis represents the process performance index (Cp) of the exposing process for forming resist patterns corresponding to the line-shaped gate patterns 3111. Specifically, the process performance index for forming the resist pattern corresponding to the portion of the gate pattern 3111 denoted by W1 (see FIG. 2) is evaluated. The horizontal axis represents the number of pairs of lines and spaces every 8×λ in the line-and-space repetition structure 412 in the proximity dummy region 410.

The process performance index (Cp) represents dimensional deviation in the resist pattern formed by the exposing process corresponding to the portion denoted by W1. In general, it is known that the process performance index Cp of 1 or more represents sufficient process performance (see, for example, New Edition of Quality Control Handbook, second edition, p. 118, Edited by T. Asaka et al., Japan Quality Association).

It should be appreciated that the gate pattern 3111 of the peripheral circuit region 31, which is evaluated, and the line-and-space repetition structure 412 in the proximity dummy region 41, are arranged with the distance, along the vertical direction, between them of 0.36 μm (see the arrow L4 shown in FIG. 2), the dummy gate patterns are formed with the height (the length in the vertical direction) of 2.6 μm (see the arrow H1 shown in FIG. 2), exposure is made using an exposing light with a wavelength of 248 nm (KrF exposure), and the line-and-space repetition structure is formed with a line-to-space ratio of 1:1.

As can be understood from the chart shown in FIG. 4, the line-and-space repetition structure 412 formed in the proximity dummy region 41, with a regularity of two or more pairs of lines and spaces every 8×λ, achieves the process performance index Cp of 1 or more. That is, the line-and-space repetition structure 412 with such regularity reduces dimensional deviation in the resist pattern corresponding to the gate patterns in the outermost portion of the peripheral circuit region within a range that causes no practical problems. Thereby, a sufficient process performance is realized.

Further evaluations are made regarding various line-and-space ratios, wavelengths of the exposing light, exposure conditions, and so on. In any of the evaluated cases, the process performance index Cp of 1 or more is achieved with the line-and-space repetition structure 412 with the pattern regularity of two or more pairs of lines and spaces every 8×λ.

Furthermore, as can be understood from the chart shown in FIG. 4, the greater the number of pairs of lines and spaces every 8×λ is, the greater the process performance index Cp is. This suggests that the number of pairs of lines and spaces is preferably increased.

In order to increase the number of pairs of lines and spaces every 8×λ in the line-and-space repetition structure 412, it needs to reduce the width or the minimum dimension of the line-shaped dummy patterns 4111. Specifically, the line-and-space repetition structure 412 is preferably designed with a minimum dimension of 2×λ or less, and more preferably with a minimum dimension of λ or less. It should be noted that, in the exemplary layout structure shown in FIG. 2 in which line-shaped patterns with a uniform width are arranged as the dummy patterns, the pattern width and the minimum dimension are the same (see array W2 in FIG. 2).

In an example shown in FIG. 2, the line-and-space repetition structure 412 in the proximity dummy region 41 includes three or more pairs of lines and spaces every 8×λ. Accordingly, the line-shaped dummy patterns 4111 are designed with a minimum dimension (width denoted by W2 in FIG. 2) of 0.25 μm, which is generally the same as the wavelength of the exposing light of 248 nm.

However, the practical number of pairs of lines and spaces has an upper limit. For example, with the wavelength λ of the exposing light of 248 nm, and with the critical dimension below which the OPC is performed of 0.2 μm, the upper limit of the number of pairs of lines and spaces every 8×λ is four pairs as shown in FIG. 4. This limitation is determined under the condition that the dummy gate patterns 4111 need to be designed with a width not smaller than the critical dimension, and with the line-and-space ratio of 1:1.

The number of pairs of lines and spaces can be further increased beyond this upper limit if the width of the dummy gate pattern 4111 is reduced below the critical dimension. In this case, however, it is required to perform OPC to the dummy gate patterns 4111. This leads to an increased calculation amount required for creating the mask pattern data from the pattern data of the logical layout structure, resulting in increased time and costs for creating the mask. Accordingly, in practical applications, the dummy gate patterns 4111 are preferably designed with a minimum dimension equal to or greater than the critical dimension so that OPC is not required for the dummy gate patterns 4111.

In other words, the line-and-space repetition structure 412 is designed such that the number of pairs of lines and spaces every 8×λ is within a range between the upper limit required for obviating the necessity of OPC to the dummy gate patterns, and the lower limit required for achieving the sufficient process performance index Cp.

It should be appreciated that the chart shown in FIG. 4 shows the case that the line-and-space repetition structure 412 in the proximity dummy region 41 is formed with a line-and-space ratio of 1:1. Therefore, there is no difference in the pattern density irrespective of the number of pairs of lines and spaces. In other words, even in the region of the number of pairs of lines and spaces that exhibits insufficient process performance index Cp (less than 1), the pattern density is the same as in the region that exhibits sufficient process performance index (1 or more).

This result suggests that, in order to reduce the deviation in the pattern size for achieving a sufficient process performance, it is important that the line-and-space repetition structure 412 is formed not only to improve the uniformity of pattern density, but also to improve the pattern regularity.

As described above, in the example shown in FIG. 4, the line-and-space repetition structure 412 in the proximity dummy region 41 is formed with a line-and-space ratio of 1:1. Accordingly, the numbers of pairs of lines and spaces of 2, 3, and 4, every 8×λ correspond to the numbers of pairs of lines and spaces of 1, 1.5, and 2, every 4×λ. Accordingly, the relationship shown in FIG. 4 can also be understood by the fact that the line-and-space repetition structure with the regularity of one or more pairs of lines and spaces every 4×λ achieve the sufficient process performance index.

It should be appreciated that, however, the line-and-space ratio of 1:1 of the line-and-space repetition structure 412 in the proximity dummy region 41 is not indispensable to this invention. In fact, in the example shown in FIG. 2, the exact line-and-space ratio in not equal to 1:1.

An evaluation is made regarding suitable range of the distance (see the distance denoted by L4 in FIG. 2) between the fine gate patterns 3111, having a width less than the critical dimension that requires OPC, and the line-and-space repetition structure 412 in the proximity dummy region.

Figure 5:
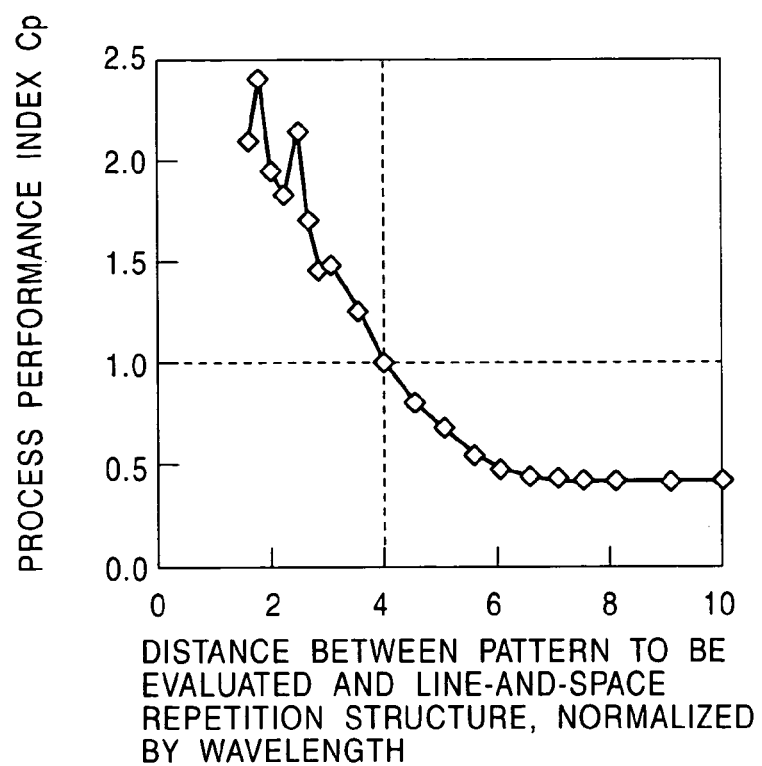
FIG. 5 is a chart illustrating the process performance index (Cp) of the exposing process in relation to the distance between the line-and-space repetition structure in the proximity dummy region and the patterns in the peripheral circuit region.

FIG. 5 is a chart showing the process performance index (Cp) of the exposing process in relation to the distance denoted by L4 shown in FIG. 2. The vertical axis represents the process performance index (Cp) for the exposing process for forming a resist pattern corresponding to the portion of the gate pattern 3111 denoted by W1 in FIG. 2. The horizontal axis represents the distance, in the vertical direction, between the portions of the fine gate patterns 3111 closest to the lower side 31a of the peripheral circuit region 31, or the lower end of the gate pattern 3111 near the lower side 31a, and the line-and-space repetition structure 412 in the proximity dummy region. It should be appreciated that in the chart shown in FIG. 5, the horizontal axis represents the distance normalized by the wavelength of the exposing light.

In the evaluation shown in FIG. 5, the proximity dummy pattern 411 is designed with the width of the dummy gate pattern 4111 (denoted by the arrow W2 in FIG. 2) of 0.24 μm, the space between the dummy gate patterns 4111 of 0.24 μm, and the height (a length in the vertical direction) of the dummy gate pattern 4111 (denoted by the arrow H1 shown in FIG. 2) of 2.6 μm.

As can be understood from the chart shown in FIG. 5, the distance between the gate pattern 3111 in the peripheral circuit region 31 and the line-and-space repetition structure 412 in the proximity dummy region of four times the wavelength of the exposing light or less results in a process performance index of 1 or more. That is, it is shown that the line-and-space repetition structure 412 in the proximity dummy region 41 is preferably arranged within a distance of 4×λ or less from the fine gate pattern 3111 in the peripheral circuit region 31. The exemplary layout with such distance improves the uniformity of pattern density and the pattern regularity around the outermost portion along the lower side 31a of the peripheral circuit region 31, and achieves sufficient process performance.

Furthermore, as can be understood from the chart shown in FIG. 5, the smaller the distance between the gate pattern and the line-and-space repetition structure, the greater the process capability index Cp. However, the layout structure shown in FIG. 2 must be designed such that the gate pattern 3111 in the peripheral circuit region and the dummy gate pattern 4111 in the proximity dummy region are arranged with a space equal to or greater than the lower limit according to the layout design rule. That is, the gate pattern and the line-and-space repetition structure cannot be arranged with an interval less than a certain lower limit. In general, the practical lower limit of λ or more is employed, for example.

An evaluation is made regarding a suitable range of the height (see the length denoted by the arrow H1 shown in FIG. 2) of the line-and-space repetition structure 412 in the proximity dummy region in the vertical direction, i.e., in the direction perpendicular to the lower side 31a of the peripheral circuit region 31 along which the proximity dummy region 41 is formed.

Figure 6:
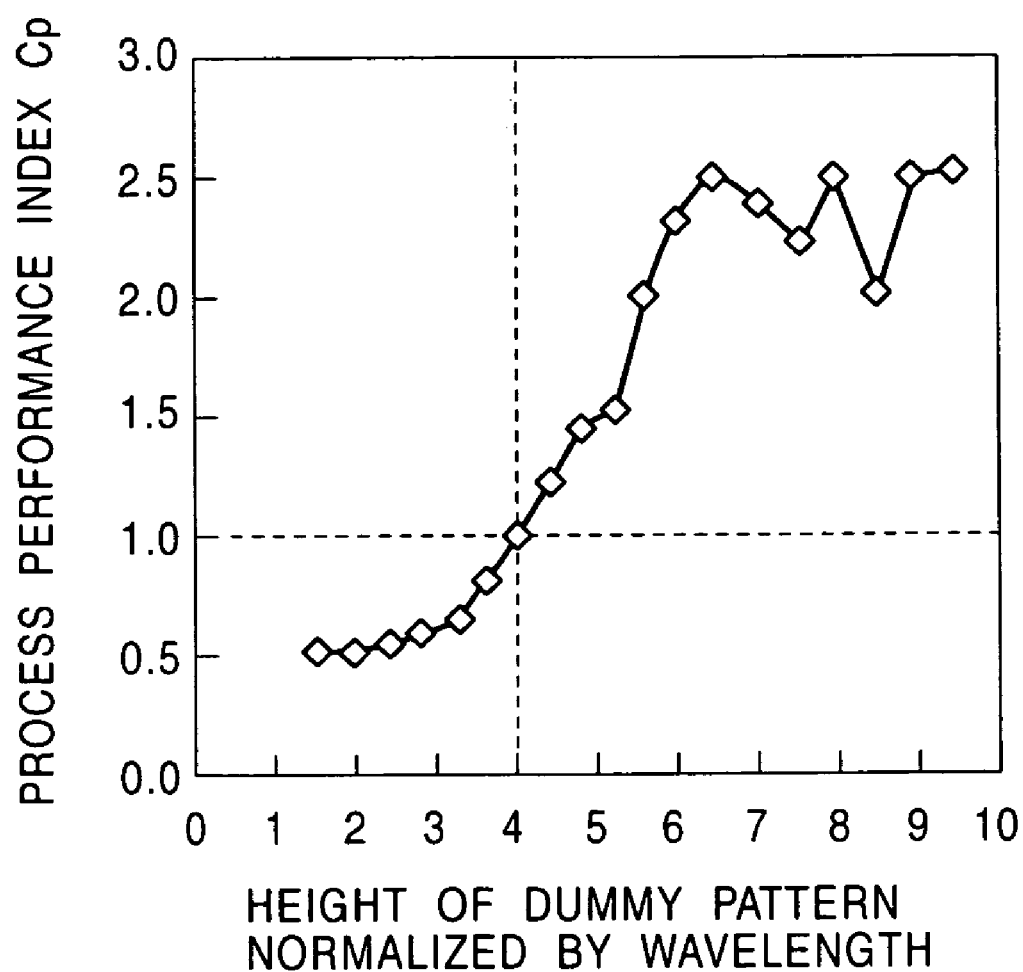
FIG. 6 is a chart illustrating the process performance index (Cp) of the exposing process in relation to the height of the proximity dummy patterns forming the line-and-space repetition structure in the proximity dummy region.

FIG. 6 is a chart showing the process performance index (Cp) in relation to the height of the line-and-space repetition structure 412 in the proximity dummy region. The vertical axis represents the process performance index Cp of the exposing process for forming the resist pattern corresponding to the portion of the gate pattern 3111 denoted by W1 shown in FIG. 2. The horizontal axis represents the height of the line-and-space repetition structure 412, i.e., the height of the line-shaped dummy gate pattern 4111 shown in FIG. 2 normalized by the wavelength of the exposing light.

In this evaluation, the gate pattern 3111 in the peripheral circuit region, which is to be evaluated, and the line-and-space repetition structure 412 are arranged with the distance (see the arrow L4 shown in FIG. 2) of 0.36 µm. Further, the dummy gate pattern 4111 in the proximity dummy region is designed with the width (see the arrow W2 shown in FIG. 2) of 0.24 µm, and the space of 0.24 µm.

As can be understood from the chart shown in FIG. 6, the dummy gate patterns with the length in the vertical direction (height) of four times the wavelength of the exposing light or more achieves the process performance index of 1 or more. Accordingly, the line-and-space repetition structure 412 in the proximity dummy region 41 is preferably formed with a length in the vertical direction (height) of 4×λ or more. Such arrangement improves the uniformity of pattern density and the pattern regularity at the outermost portion near the lower side 31a of the peripheral circuit region 31, and reduces the deviation in the pattern size.

Furthermore, as can be understood from the chart shown in FIG. 6, the increase in the height of the line-and-space repetition structure further improves the process performance index. However, the improvement of the process performance index Cp by the increase of the height of the line-and-space repetition structure exhibits saturation above around six times the wave length of the exposing light.

While adjusting various conditions can increase the threshold of the height above which the improvement saturates, the process performance index cannot be monotonously improved by increasing the height of the line-and-space repetition structure 412 without saturation.

Accordingly, formation of the dummy gate patterns 4111 with an excessively large height beyond the threshold leads to increased dead space without advantages. In general, the dummy gate patterns 4111 are preferably formed with a height not larger than around 10×λ, or, even in case a sufficient margin is added, not larger than around 12×λ to 15×λ. For example, in the example shown in FIG. 2, the line-and-space repetition structure 412 in the proximity dummy region 41a is formed with a height of 2.1 µm, i.e., approximately 8×λ, or more precisely, approximately 8.5×λ.

The results shown in FIGS. 5 and 6 indicate that the deviation in the pattern size occurring in the exposing process is affected by the uniformity of pattern density and the pattern regularity in a relatively small range. Specifically, it can be understood that the deviation in the pattern size is affected by the uniformity of pattern density and the pattern regularity in the range with a radius of approximately 4×λ to 8×λ from the facts that i) the distance between the gate pattern 3111 of the peripheral circuit region and the line-and-space repetition structure 412 in the proximity dummy region is 0.36 µm, or approximately 1.5×λ, ii) the height of the dummy gate pattern of around 3×λ or more improves the process performance index Cp, and iii) the improvement of the process performance index by the increase of the height of the dummy gate pattern exhibits saturation above around 6×λ.

A different exemplary layout structures in the region A surrounded by the alternating long and short dashed line shown in FIG. 1 including a proximity dummy region formed of proximity dummy cells different from those shown in FIG. 2 is explained below. It should be noted that the same components will be denoted by the same reference characters hereafter.

Figure 7:
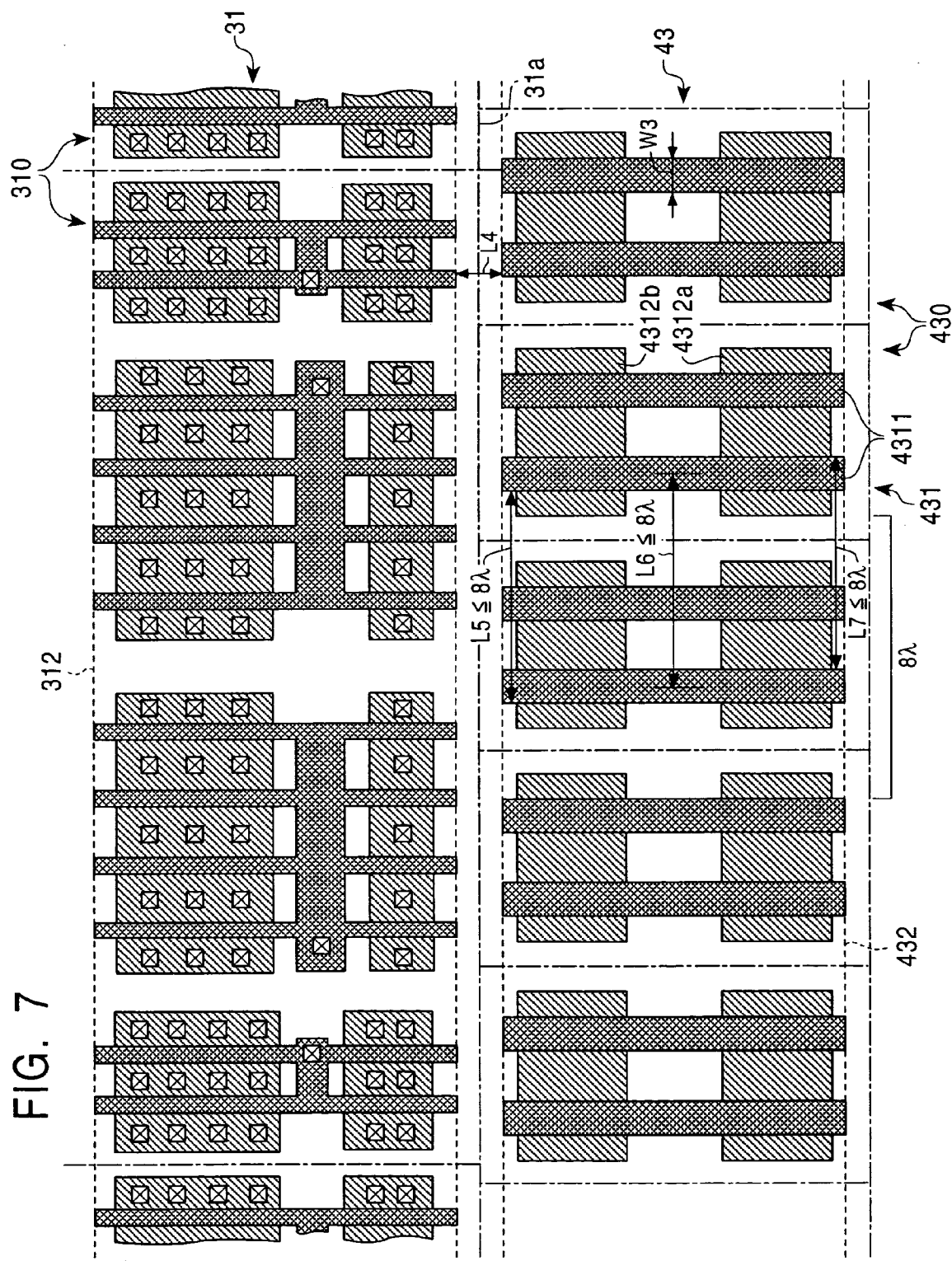
FIG. 7 is a diagram illustrating an exemplary pattern layout in the layout structure shown in FIG. 1 within the region A.

FIG. 7 is a layout diagram illustrating another exemplary layout structure in which a proximity dummy region 43 is formed of proximity dummy cells 430 each including two dummy gate patterns. It should be appreciated that, in the exemplary layout structure shown in FIG. 7, the pitch with which the peripheral circuit cells 310 are arranged is not equal to n times the pitch with which the proximity dummy cells 430 are arranged, where n is an integer not smaller than one. This relationship between the pitches of the arrangements of the peripheral circuit cells and the proximity dummy cells is different from that in the layout structure shown in FIG. 2, in which the peripheral circuit cells 310 are arranged with a pitch along the horizontal direction of four times the pitch with which the proximity dummy cells 410 are arranged.

As shown in FIG. 7, the dummy gate patterns 4311 included in the proximity dummy patterns 431 of the proximity dummy cells 430 form a line-and-space repetition structure 432 in the gate layer with a regularity of two or more pairs of lines and spaces every length of 1.984 µm (eight times the wavelength of the exposing light). See the lengths denoted by the arrows L5 through L7 shown in FIG. 7.

The dummy gate patterns 4311 shown in FIG. 7 have a width W3 of 0.25 µm. This width W3 is greater than the critical dimension, and accordingly, OPC is not required for the dummy gate patterns 4311. It should be appreciated that active patterns 4312a and 4312b and the gate patterns 4311 in each proximity dummy cell 430 serve as dummy patterns.

That is, these patterns are electrically floating, and accordingly, do not contribute to the logical function for the semiconductor integrated circuit.

In the exemplary layout structure shown in FIG. 7, the fine gate pattern 3111 in the peripheral circuit region 31 and the line-and-space repetition structure 432 in the proximity dummy region 43 are arranged with a distance (see the arrow L4 in FIG. 7) of 0.36 μm. Further, the line-and-space repetition structure 432 in the proximity dummy region 43 is formed with a height of 2.6 μm.

In the exemplary layout structure shown in FIG. 7, similar to the case shown in FIG. 2, the line-and-space repetition structure 432 formed in the proximity dummy region 43 improves the uniformity of pattern density and the pattern regularity at the outermost portion along the lower side 31a of the peripheral circuit region 31. This reduces the deviation in the resist pattern size for forming the gate patterns 3111 at the outermost portion of the peripheral circuit region 31 within a range that causes no practical problems.

Another different exemplary layout structure in the region A surrounded by the alternating long and short dashed line shown in FIG. 1 including a proximity dummy region formed of proximity dummy cells different from those shown in FIGS. 2 and 7 will be explained.

Figure 8:
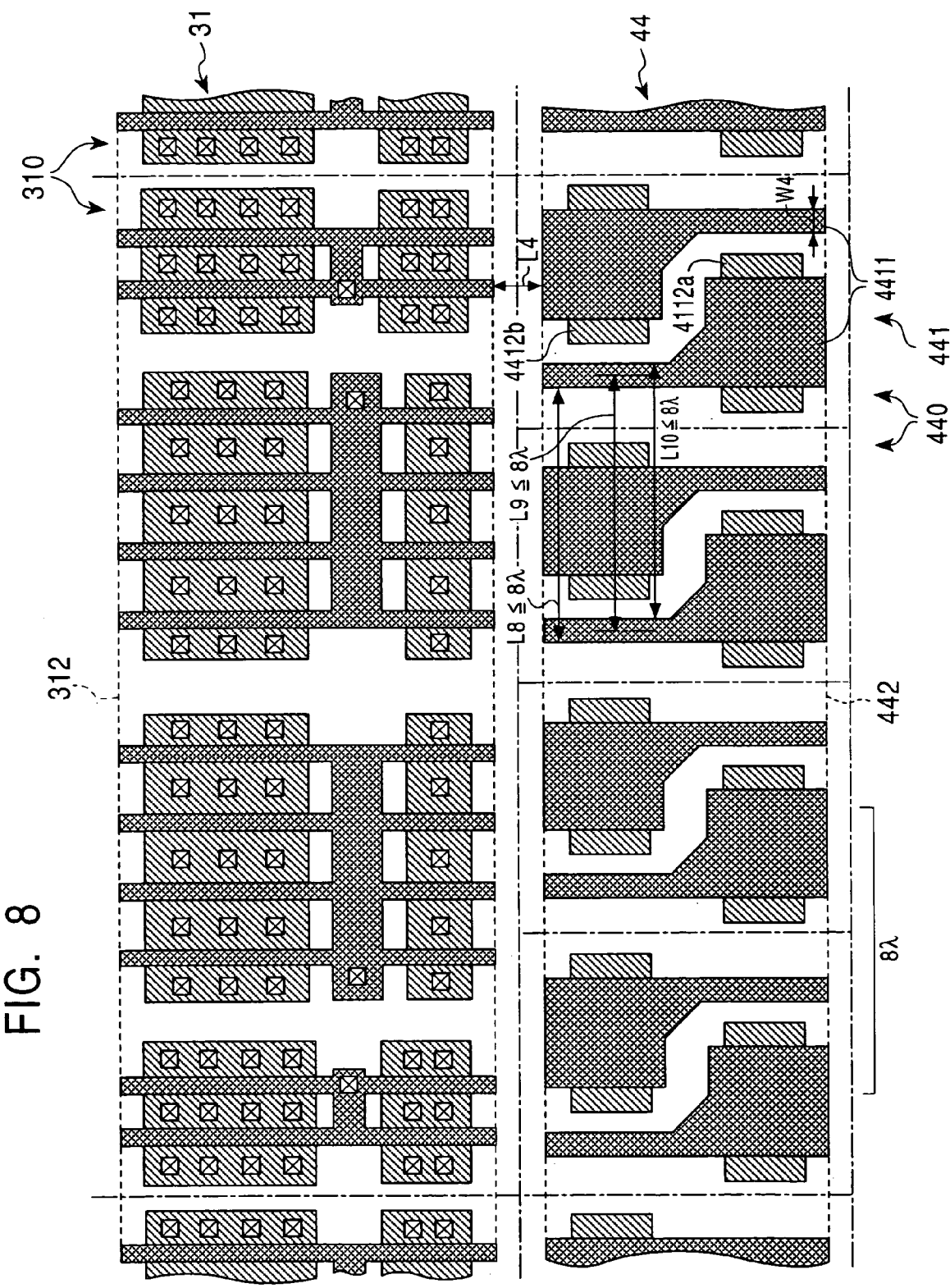
FIG. 8 is a diagram illustrating an exemplary pattern layout in the layout structure shown in FIG. 1 within the region A.

FIG. 8 is a layout diagram showing still another exemplary layout structure in which a proximity dummy region 44 is formed of proximity dummy cells 440 each including a pair of dummy gate patterns formed generally in the shape of "L". It should be appreciated that in the exemplary layout structure shown in FIG. 8, the proximity dummy cells 440 are arranged in the horizontal direction with a pitch of a quarter of the pitch with which the peripheral circuit cells 310 are arranged, in the same way as the exemplary layout structure shown in FIG. 2.

As described above, the proximity dummy pattern 441 of each proximity dummy cell 440 shown in FIG. 8 includes a pair of dummy gate patterns 4411 generally in the shape of an "L". For the purpose of this invention, the dummy gate patterns 4111 can be regarded as line-shaped patterns extending generally in the vertical direction. Accordingly, in the proximity dummy region 44 shown in FIG. 8, a line-and-space repetition structure 442 is formed in the region surrounded by the dotted line, as well.

In the exemplary layout structure shown in FIG. 8, the proximity dummy region 44 includes the line-and-space repetition structure 442 with a regularity of two or more pairs of lines and spaces every length of 1.984 μm (eight times the wavelength of the exposing light). See the lengths denoted by the arrows L8 through L10 shown in FIG. 8.

The generally L-shaped dummy gate patterns 4411 are formed with a minimum width, or a minimum dimension, W4 as shown in FIG. 4. Specifically, the dimension W4 is 0.2 μm, which is not smaller than the critical dimension (e.g., 0.2 μm), and accordingly, OPC is not required for the generally L-shaped dummy gate patterns 4411. Further, in the exemplary layout structure shown in FIG. 8, the fine gate pattern 3111 in the peripheral circuit region 31 and the line-and-space repetition structure 442 in the proximity dummy region 44 are arranged with a distance (see the arrow L4 shown in FIG. 8) of 0.36 μm, same as the layout structures shown in FIGS. 2 and 7.

Similar to the layout structures shown in FIGS. 2 and 7, the line-and-space repetition structure 442 in the proximity dummy region 44 shown in FIG. 8 improves the uniformity of pattern density and the pattern regularity at the outermost portion along the lower side 31a of the peripheral circuit region 31. This reduces the deviation in the size of the resist pattern for forming of the gate patterns 3111 at the outermost portion of the peripheral circuit region 31 within a range that causes no practical problems.

As described above, according to various exemplary embodiments, the proximity dummy cells are arranged along the lower side 31a of the peripheral circuit region 31, whereby the region A shown in FIG. 1 includes the proximity dummy region having the line-and-space repetition structure as shown in FIGS. 2, 7, and 8. In each of these examples, the outer most portion of the peripheral circuit region 31 near the lower side 31a, along which the proximity dummy region is formed, includes fine line-shaped gate patterns 3111 each extending in the vertical direction, or in the direction perpendicular to the lower side 31a. The line-shaped gate patterns 3111 are arranged in the horizontal direction, or in the direction parallel to the lower side 31a. Thereby, the line-and-space repletion structure 312 extending in the horizontal direction, or in the direction parallel to the lower side 31a is formed.

Similarly, line-shaped dummy gate patterns 4111, 4311, or 4411, each extending generally in the vertical direction, are arranged in the proximity dummy region 41, 43, or 44, whereby the line-and-space repetition structure 412, 432, or 442 extending in the horizontal direction is formed. That is, both the outermost portion of the peripheral circuit region 31 near the lower side 31a, along which the proximity dummy region is formed, and the proximity dummy region include the line-and-space repetition structures extending in parallel with each other.

Such relationship, where the line-and-space repetition structures in the proximity dummy region and in the outermost portion of the peripheral circuit region extend in parallel with each other is preferably employed in order to more effectively improve the pattern regularity at the outermost portion of the peripheral circuit region, and to more effectively reduce the deviation in the pattern dimension.

Accordingly, when the outermost portion of the peripheral circuit region 31 includes line-shaped gate patterns extending in the direction parallel to the lower side 31a so as to form a line-and-space repletion structure extending in the direction perpendicular to the lower side 31a, the proximity dummy region formed along the lower side 31a preferably includes dummy gate patterns extending in the direction parallel to the lower side 31a so as to form a line-and-space repetition structure extending in the direction vertical to the lower side 31a, as well.

It should be appreciated that in this case, the layout structure is not limited to the case that the line-and-space repetition structures in the proximity dummy region and in the peripheral circuit region are separately formed. Rather, at least one line-shaped dummy gate patterns formed in the proximity dummy region and the plurality of line-shaped gate patterns arranged in the peripheral circuit region may form a continuous line-and-space repetition structure extending from the peripheral circuit region up to the proximity dummy region, as described later regarding the side proximity dummy region provided in the region B surrounded by the alternate long and short dashed line shown in FIG. 1.

Description is made below regarding the side proximity dummy region 42 provided in the region B surrounded by the alternate long and short dashed line shown in FIG. 1.

Figure 9:
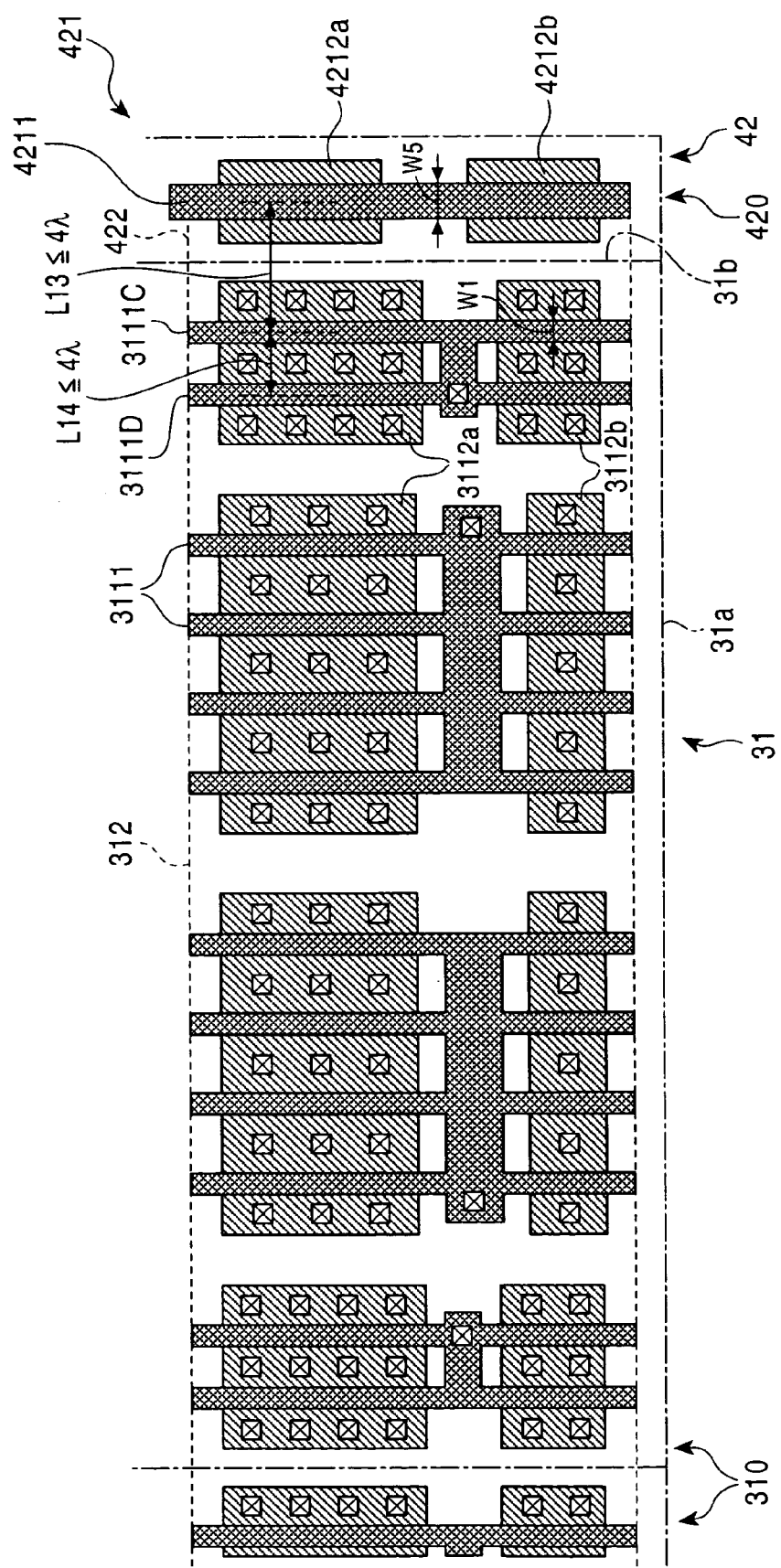
FIG. 9 is a diagram illustrating an exemplary pattern layout in the layout structure shown in FIG. 1 within the region B surrounded by an alternating long and short dashed line.

FIG. 9 is an exemplary layout diagram illustrating the outermost portion of the peripheral circuit region 31 near the right side 31b thereof, and a portion of the proximity dummy region 42 formed along the right side 31b in the exemplary layout structure shown in FIG. 1. It should be appreciated that FIG. 9 only shows patterns in the active layer, the gate layer, and the contact layer, as in the case of FIG. 2. Furthermore, descriptions will be made assuming that the layout structure is to be formed on a semiconductor substrate using an exposing light with a wavelength of 248 nm, in the same way as in FIG. 2.

As described above, FIG. 9 shows portions of the peripheral circuit region 31 and the proximity dummy region 42. Specifically, FIG. 9 shows the outermost portions opposite to the internal circuit region 20 of the peripheral circuit cells 310 arranged near the right side 31b (see FIG. 1) of the peripheral circuit region 31. FIG. 9 also shows a portion of the proximity dummy cell 420 arranged in the proximity dummy region 42 along the right side 31b (see FIG. 1) of the peripheral circuit region 31.

The peripheral circuit cell 310 shown in FIG. 9 has the same configuration as in FIG. 2. That is, the peripheral circuit cell 310 includes a plurality of pairs of P+ active patterns 3112a and the N+ active patterns 3112b, which are arranged in the vertical direction. The peripheral circuit cell 310 also includes a plurality of line-shaped gate patterns 3111 stacked over the active patterns so as to extend in the vertical direction in the drawing. The gate patterns 3111 are formed with the width W1 of 0.12 μm, for example.

The line-shaped gate patterns 3111 are arranged in the horizontal direction with generally the same interval, whereby a line-and-space repetition structure 312 is formed in the gate layer so as to extend in the horizontal direction in the drawing. It should be noted that both the FIGS. 2 and 9 show different portions of the same line-and-space repetition structure 312.

The line-and-space repetition structure in the peripheral circuit region 31 is formed with the pattern regularity of two or more pairs of lines and spaces every 8×λ. Specifically, the line-and-space repetition structure shown in FIG. 9 has a regularity of three or more pairs of lines and spaces every 8×λ. Locally, the right-most gate pattern 3111C in the peripheral circuit region 31 closest to the right side 31b and the second gate pattern 3111D on the left side of the right-most gate pattern 3111C are arranged with an interval (the distance between their centerlines) L14 of 4×λ or less.

On the other hand, the proximity dummy region 42 includes a proximity dummy pattern 421 having at least one pair of a P+ active pattern 4212a and an N+ active pattern 4212b arranged in the vertical direction in the drawing, and at least one line-shaped gate pattern 4211 extending in the vertical direction and stacked over the active patterns 4212a and 4212b. These active patterns and the gate patterns are electrically floating, and accordingly, do not contribute to the logical function of the semiconductor integrated circuit.

The exemplary dummy gate pattern 4211 in the proximity dummy cell 420 is formed with the minimum dimension, i.e., the width W5, of 0.24 μm, for example. The minimum dimension of the dummy gate pattern 4211 is greater than the critical dimension, and accordingly, OPC is not required. Furthermore, the dummy gate pattern 4211 is arranged such that the distance L13 between the centerline of the dummy gate pattern 4211 and the centerline of the right-most gate pattern 3111C is 4×λ or less.

As shown in FIG. 9, the peripheral circuit region 31 includes a plurality of line-shaped gate patterns 3111 arranged in the horizontal direction, and the proximity dummy region 42 includes the dummy gate pattern 4211 extending along the right side 31b of the peripheral circuit region 31. Thereby, a continuous line-and-space repetition structure 422 is formed so as to extend in the horizontal direction from the peripheral circuit region 31 up to the proximity dummy region 42.

While description has been made regarding the proximity dummy region 42 formed along the right side 31b of the peripheral circuit region 31 with reference to FIG. 9, the proximity dummy region 42 is preferably formed along the left side of the peripheral circuit region 31 as shown in FIG. 1, as well. In this case, the continuous line-and-space repetition structure 422 is formed over the entire width from the left-side proximity dummy region up to the right-side proximity dummy region through the peripheral circuit region 31.

The line-and-space repetition structure 422 extends in the horizontal direction, or along the lower side 31a of the peripheral circuit region 31. Further, the line-and-space repetition structure 422 has a regularity of two or more pairs of lines and spaces every 8×λ along the horizontal direction, or along the direction to which the repetition structure extends, at any places within the repetition structure. Accordingly, high uniformity of pattern density and high pattern regularity are maintained for any of the plurality of line-shaped gate patterns 3111 arranged in the peripheral circuit region 31. Thereby, dimensional deviation in the exposing process is reduced.

Locally, the line-and-space repetition structure 422 includes, in each of the peripheral circuit region 31 and the proximity dummy region 42, one line within a length of 4×λ from the line formed by the right-most line-shaped gate pattern 3111C along the horizontal direction, or along the direction to which the repletion structure extends. In the exemplary layout structure shown in FIG. 9, in the peripheral circuit region 31, a line formed by the second line-shaped gate pattern 3111D is arranged within 4×λ from the centerline of the line formed by the right-most gate pattern 3111C. That is, the interval between the centerlines of the right-most gate pattern 3111C and the second gate pattern 3111D (see the interval L14 shown in FIG. 9) is equal to or less than 4×λ. While, in the proximity dummy region 42, a line formed by the dummy gate pattern 4211 is arranged within 4×λ from the centerline of the line formed by the right-most gate pattern 3111C. That is, the interval between the centerlines of the right-most gate pattern 3111C and the dummy gate pattern 4211 (see the interval L13 shown in FIG. 9) is equal to or less than 4×λ.

As described above, the right-most gate pattern 3111C in the peripheral circuit region 31 is positioned at the end of the line-and-space repetition structure 312. Accordingly, when the dummy gate pattern 4211 in the proximity dummy region 42 is not arranged near the right-most gate pattern 3111C, the uniformity of pattern density and the pattern regularity around the right-most gate pattern 3111C is degraded. As a result, the deviation of the pattern size of the right-most gate pattern 3111C increases.

On the other hand, in the layout structure shown in FIG. 9, the dummy gate pattern 4211 in the proximity dummy region 42 is arranged near the right-most gate pattern 3111C, and the line-and-space repetition structure 422 extending over the entire length from the peripheral circuit region 31 up to the proximity dummy region 42 is formed. The line-and-space repetition structure 422 improves the uniformity of pattern density and the pattern regularity over the entire region within the peripheral circuit region 31 including the region around the right-most gate pattern 3111C. Thereby the deviation in the resist pattern size is reduced.

An evaluation is made regarding the effect of the side proximity dummy region 42 including the line-shaped dummy gate patterns 4211 along the right side 31*b* of the peripheral circuit region 31 as shown in FIG. 9. Suitable number of the line-shaped dummy gate patterns in the proximity dummy region is also evaluated.

Figure 10:
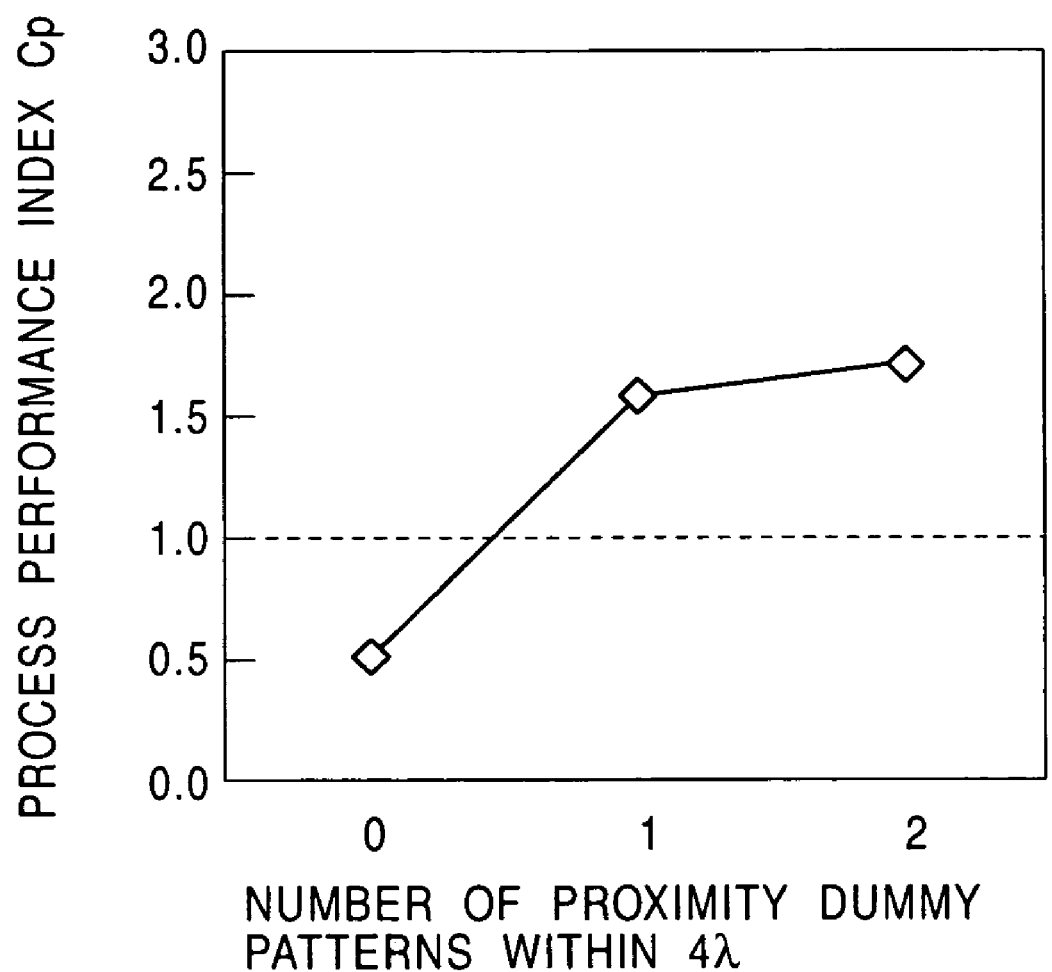
FIG. 10 is a chart illustrating the process performance index (Cp) in relation to the number of line-shaped dummy patterns within $4 \cdot \lambda$ from a right-most gate line in the peripheral circuit region.

FIG. 10 is a chart showing the process performance index (Cp) of the exposing process in relation to the number of the dummy gate patterns in the proximity dummy region 42. The vertical axis represents the process performance index Cp of the exposing process for forming the resist pattern corresponding to a portion of the right-most gate pattern 3111C denoted by the arrow W1 shown in FIG. 9. The horizontal axis represents the number of the dummy gate patterns 4211 with their centerlines positioned within a length of 4×λ along the horizontal direction from the centerline of the right-most gate pattern 3111C.

Here, the right-most line-shaped gate pattern 3111C, about which the process performance index Cp is evaluated, has the width W1 of 0.12 μm. Further, the second line-shaped gate pattern 3111D having the same width W1 is arranged within the length of 4×λ from the centerline of the right-most gate pattern 3111C as shown in FIG. 9. An exposing light with a wavelength of 248 nm is employed (KrF exposure), and each dummy gate pattern is formed with a uniform width of 0.24 μm. Furthermore, the layout structure includes the outer proximity dummy region 41 shown in FIG. 2 along the lower side 31*a* of the peripheral circuit region 31 as shown in FIG. 1, which is not shown in FIG. 9.

As can be understood from the chart shown in FIG. 10, the process performance index Cp exhibits 1 or more when the number of dummy gate patterns within 4×λ from the centerline of the right-most gate pattern 3111C is one or more. It is also found that the process performance index Cp exhibits 1 or more, as well, under various conditions of the width and line-and-space ratio of the dummy gate patterns, the wavelength of the exposing light, and the like, when the number of the dummy gate patterns within the length of 4×λ from the centerline of the right-most gate pattern 3111C is one or more.

FIG. 9 shows an exemplary layout structure in which only one line-shaped dummy gate pattern 4211 is arranged in the proximity dummy region 42. However, this invention is not limited to such example. The proximity dummy region 42 may include two or more dummy gate patterns 4211 so that two or more dummy gate patterns are arranged within 4×λ from the centerline of the right-most gate pattern 3111C.

As can be understood from the chart shown in FIG. 10, when the number of the dummy gate patterns within 4×λ from the right-most gate pattern 3111C is increased from one to two, the process performance index Cp slightly increases. Thus, the dimensional deviation in the gate pattern in the peripheral circuit region is further reduced by increasing the number of dummy gate patterns within 4×λ from the right-most gate pattern 3111C from one to two.

In order to design such a layout structure in which one or more line-shaped dummy gate patterns are arranged within the length of 4×λ from the right-most gate pattern 3111(C), in practice, the minimum dimension (width W5) of the dummy pattern 4211 is preferably made to be 2×λ or less, and more preferably, to be λ or less. However, in order to prevent the increase of the calculation amount for creating the mask data, the minimum dimension (width W5) of the dummy pattern 4211 is preferably made to be equal to or greater than the critical dimension below which the OPC is required.

As described above, the chart in FIG. 10 shows the process performance index Cp for the exemplary layout structure in which the second gate pattern 3111D in the peripheral circuit region 31 next to the right-most gate pattern 3111C is arranged within 4×λ from the centerline of the right-most gate pattern 3111C. Therefore, the evaluation result shown in FIG. 10 can also be understood that the process performance index of one or more can be achieved when the line-and-space repetition structure 422 has two or more lines within a range having a total length of 8×λ along the horizontal direction, which includes two ranges each having the length of 4×λ from the centerline of the line formed by the right-most gate pattern 3111C.

As described above, in the exemplary layout structure shown in FIG. 9, a plurality of line-shaped gate patterns 3111, each extends in the vertical direction, i.e., in the direction perpendicular to the lower side 20*a* of the inner circuit region 20 along which the peripheral circuit cells 310 are arranged, are arranged within the peripheral circuit region 31 in the horizontal direction, i.e., in the direction parallel to the lower side 20*a* of the inner circuit region 20. Furthermore, the exemplary proximity dummy regions 42 are formed by arranging the proximity dummy cells 420, each having the line-shaped dummy gate pattern 4211 extending in the vertical direction, along the left and right sides 31*b*, which are perpendicular to the lower side 20*a* of the internal circuit region 20, along which the peripheral circuit cells are arranged, of the peripheral circuit region. Thus, the plurality of line-shaped gate patterns 3111 and line-shaped dummy gate patterns 4211, each extending in the vertical direction, are arranged in the horizontal direction, whereby the line-and-space repetition structure 422 is formed over the entire length from the peripheral circuit region 31 up to the proximity dummy regions 42.

In the same way, a plurality of line-shaped gate patterns, each extending in the horizontal direction, i.e., in the direction parallel to the lower side 20*a* of the inner circuit region 20 along which the peripheral circuit cells 310 are arranged, may be arranged within the peripheral circuit region 31 in the vertical direction, i.e., in the direction perpendicular to the lower side 20*a* of the internal circuit region 20 along which the peripheral circuit cells 310 are arranged. In this case, the outer proximity dummy region 41 is preferably formed along the lower side 31*a* of the peripheral circuit region 31 by arranging proximity dummy cells, each having line-shaped dummy gate patterns each extending in the horizontal direction. Thus, the plurality of line-shaped gate patterns and the line-shaped dummy gate patterns, each extending in the horizontal direction, are arranged in the vertical direction, whereby a line-and-space repetition structure extending in the vertical direction is formed from the peripheral circuit region 31 up to the outer proximity dummy region 41.

In this case, one or more lines are preferably included within the length of 4×λ from the centerline of the line formed by the lower-most gate pattern closest to the lower side 31*a* of the peripheral circuit region. Thereby, the process performance index of the exposing process is increased, and the dimensional deviation in resist pattern is reduced, as well.

Description is made below regarding photomasks for forming the exemplary layout structure of the semiconductor integrated circuit shown in FIG. 9 on a semiconductor substrate.

Figure 11:
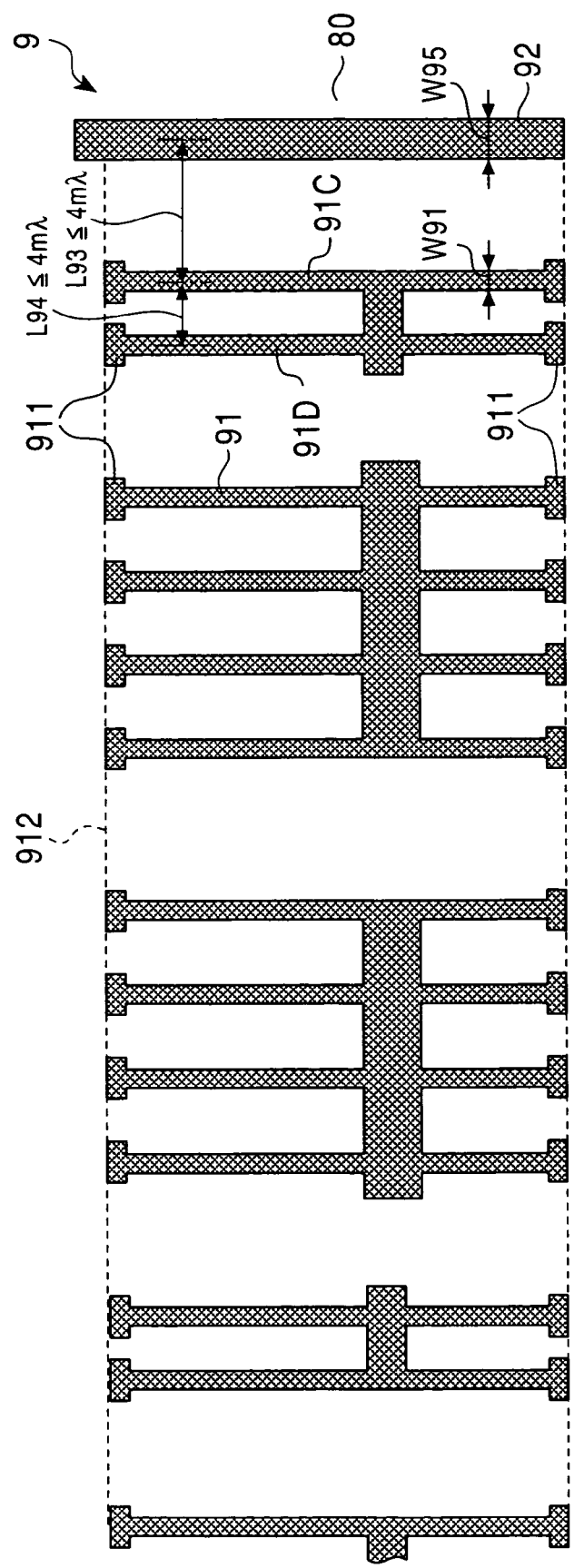
FIG. 11 is a diagram illustrating an exemplary mask pattern layout of a part of the photomask corresponding to the region shown in FIG. 8 produced based upon the layout structure shown in FIG. 1.

FIG. 11 shows a part of one of the photomasks corresponding to the part shown in FIG. 9, which is formed based upon the exemplary layout structure of the semiconductor integrated circuit shown in FIG. 1. The exemplary photomask 9 shown in FIG. 11 is used for forming a resist pattern in a positive resist layer using a 1/m reduction projection exposing process. The resist pattern thus formed is used as a mask for etching a conductive material film to form the gate pattern shown in FIG. 9.

The photomask 9 is a part, different from the part of the photomask 8 shown in FIG. 3, of the same photomask formed on the common substrate 80. Specifically, mask patterns 91 and a mask pattern 92 corresponding to the gate patterns 3111 and the dummy gate pattern 4111, respectively, are formed of a chromium masking film on the common substrate 80.

In the exemplary layout structure shown in FIG. 9, each line-shaped gate pattern 3111 within the peripheral circuit region 31 has the width W1 of 0.12 µm, for example, which is less than the critical dimension. Accordingly, the OPC is performed for the mask patterns 91 corresponding to the gate patterns 3111. Specifically, each end of the mask pattern 91 is designed in the shape of a hammerhead by adding a correction pattern 911.

On the other hand, the dummy-gate pattern 4112 has a minimum dimension, i.e., the width W5, equal to or greater than the critical dimension below which the OPC is required. Accordingly, the mask pattern 92 corresponding to the dummy gate pattern 4211 is designed without the OPC. Therefore, the mask pattern 92 does not have a correction pattern.

As with the case of the photomask 8 shown in FIG. 3, the mask pattern of the photomask 9 shown in FIG. 11 has a shape generally similar to the shape of the gate pattern of the layout structure shown in FIG. 9 and with approximately m times the pattern size. Accordingly, the line-shaped mask pattern 91 corresponding to the line-shaped gate pattern 3111 in the peripheral circuit region 31 shown in FIG. 9 has a width W91 approximately m times the width W1 of the line-shaped gate pattern 3111, except for both ends. On the other hand, the line-shaped mask pattern 92 corresponding to the line-shaped dummy gate pattern 4211 in the proximity dummy region 42 shown in FIG. 9 has a width W95 approximately m times the width W5 of the line-shaped dummy gate pattern 4211.

Furthermore, in the mask pattern of the photomask 9 shown in FIG. 11, a plurality of line-shaped mask patterns 91 corresponding to the line-shaped gate patterns 3111 in the peripheral circuit region and the line-shaped mask pattern 92 corresponding to the dummy gate pattern 4211 in the proximity dummy region form a line-and-space repetition structure 912. The line-and-space repetition structure 912 has a pattern regularity of two or more pairs of lines and spaces every length of 8×m×λ along the direction of the repetition (horizontal direction in the drawing) at any place within the repetition structure.

Locally, one line is included, in each of the regions corresponding to the peripheral circuit region 31 and the proximity dummy region 42, within a length of 4 m×λ in the direction that the repetition structure 912 extends (horizontal direction in the drawing) from the line formed by the mask pattern 91C corresponding to the right-most gate pattern 3111C. Specifically, in the region corresponding to the peripheral circuit region, the line formed by the second line-shaped mask pattern 91D corresponding to the second gate pattern 3111D is arranged within 4 m×λ from the centerline of the line formed by the right-most mask pattern 91C. That is, the interval between the centerlines of the right-most mask pattern 91C and the second mask pattern 91D (see the interval L94 shown in FIG. 11) is equal to or less than 4 m×λ. While, in the region corresponding to the proximity dummy region, the line formed by the mask pattern 92 corresponding to the line-shaped dummy gate pattern 4112 is arranged within 4 m×λ from the centerline of the line formed by the mask pattern 91C. That is, the interval between the centerlines of the right-most mask pattern 91C and the dummy mask pattern 92 (see the interval L93 shown in FIG. 11) is equal to or less than 4 m×λ.

The line-and-space repetition structure 912 having such regularity improves the uniformity of pattern density and the pattern regularity around the right-most mask pattern 91C corresponding to the right-most gate pattern 3111C within the peripheral circuit region closest to the right side 31b. As a result, adverse effects due to scattered light in the exposing process for projecting the right-most mask pattern 91C onto a semiconductor substrate is reduced. Thereby, the dimensional deviation in the resist pattern is reduced.

As described above, the dummy gate pattern 4211 shown in FIG. 9 preferably has the width W5 equal to or smaller than 2×λ, and more preferably equal to or smaller than λ. Accordingly, the line-shaped mask pattern 92 of the photomask 9 shown in FIG. 11 preferably has the width W95 equal to or smaller than 2 m×λ, and more preferably equal to or smaller than m×λ.

As described above, the photomask shown in FIG. 11 is used for forming a resist pattern, which is to be used for forming a gate pattern by etching a conductive material film using the resist pattern as a mask, by exposing a positive-type resist layer. In this case, as can be understood from the comparison between the layout structures shown in FIGS. 9 and the mask pattern shown in FIG. 11, the line-shaped mask pattern 91 and 92, which form lines in the line-and-space repetition structure 912 of the mask pattern shown in FIG. 11, are arranged at positions corresponding to the positions of the gate patterns 3111 and the dummy gate pattern 4211, which form the lines in the line-and-space repetition structure 4211 in the layout structure shown in FIG. 9.

The situation may be different in different types of photomasks. For example, in a photomask for forming a resist pattern, which is to be used for etching a conductive material film, by exposing a negative-type resist layer, portions of the mask pattern corresponding to lines in the layout structure shown in FIG. 9 become spaces.

Even in a case where a photomask is used for exposing a positive-type resist layer, the resist pattern formed by the exposure may be used in a damascene process, i.e., for forming a groove in an insulating layer within which a conductive material is filled. In a photomask for use in such a process, portions of the mask pattern corresponding to lines in the layout structure shown in FIG. 9 become spaces.

Even in such cases, a line-and-space repetition structure is formed in a portion of the mask pattern corresponding to the regions from the peripheral circuit region 31 up to the proximity dummy region 42 in the layout structure shown in FIG. 9. The repetition structure in the mask pattern has a regularity of two or more pairs of lines and spaces every 8×λ at any position along the direction of the repetition, in the same way as the mask pattern shown in FIG. 11.

In such a photomask, one space is arranged in a length of 4 m×λ on each side of the space, which corresponds to the line in the layout structure formed by the right-most line-shaped gate pattern 3111C in the layout structure shown in FIG. 9. Specifically, in the region corresponding to the peripheral circuit region 31, a space corresponding to the line in the layout structure formed by the second gate pattern 3111D is arranged within the 4 m×λ from the centerline of the space corresponding to the line in the layout structure formed by the right-most gate pattern 3111C. In addition, in the region corresponding to the proximity dummy region 42, a space corresponding to the line in the layout structure formed by the dummy gate pattern 4211 is arranged within 4 m×λ from the centerline of the space corresponding to the line in the layout structure formed by the right-most gate pattern 3111C.

Description has been made above regarding exemplary pattern layouts in the regions denoted by alternating long and short dashed lines A and B in the layout structure of the semiconductor integrated circuit shown in FIG. 1, and exemplary mask pattern layouts corresponding to the regions A and B serving as a photomask for forming the semiconductor integrated circuit having the layout structure shown in FIG. 1. Description is made below regarding the layout structure of the semiconductor integrated circuit in a wider region than the region shown in FIG. 1.

Figure 12:
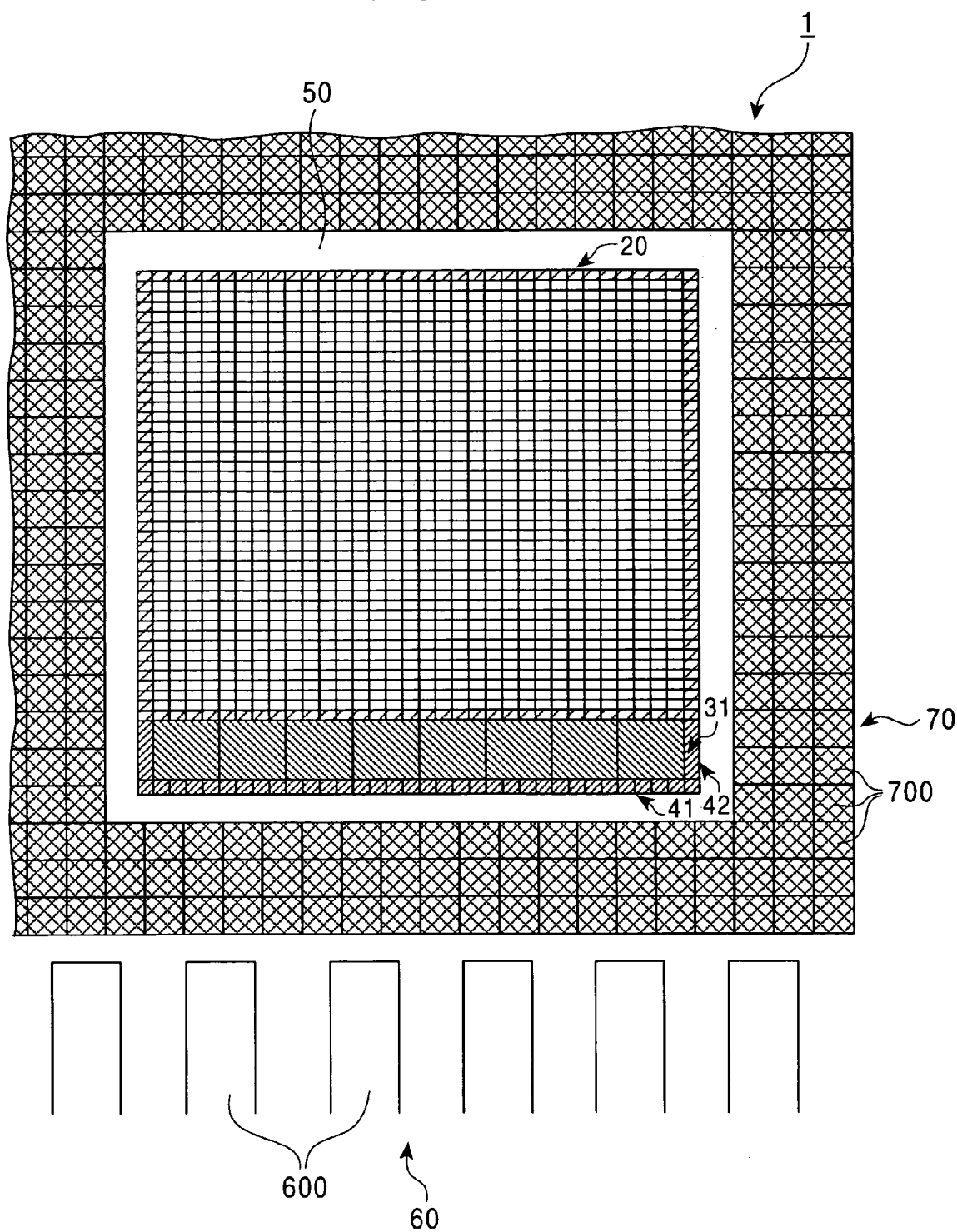
FIG. 12 is a diagram illustrating the exemplary layout structure of the semiconductor integrated circuit shown in FIG. 1 over a wider region.

FIG. 12 is a diagram illustrating the exemplary layout structure 1 of the semiconductor integrated circuit, of which the principal components are shown in FIG. 1, in a wider region than the region shown in FIG. 1. As shown in FIG. 12, the layout structure 1 includes, in addition to the internal circuit region 20, the peripheral circuit region 31, and the proximity dummy regions 41 and 42 shown in FIG. 1, an outer circuit region 60 including a plurality of outer circuit cells 600 arranged outside of the components shown in FIG. 1. An input/output circuit cell is employed as the outer circuit cell 600, for example.

Furthermore, the layout structure 1 includes a plurality of outer dummy cells 700 arranged so as to fill the space outside of the region shown in FIG. 1, i.e., the internal circuit region 20, the peripheral circuit region 31, and the proximity dummy regions 41 and 42, which is not filled by the outer circuit region 60. Thereby, an outer dummy region 70 is formed. Each outer dummy cell 700 has a dummy pattern, which is different from the dummy patterns of the proximity dummy cells 410 and 420, and does not contribute to the logical function of the semiconductor integrated circuit.

As described above, the exemplary proximity dummy regions 41 and 42 improve the uniformity of pattern density and the pattern regularity at the outermost portions of the peripheral circuit region near the sides thereof along which the proximity dummy regions are formed. Thereby, the dimensional deviation in the resist pattern formed by the exposing process is reduced.

In order to reduce the deviation in the exposing process described above, the uniformity of pattern density and the pattern regularity within a range of 4×λ to 8×λ from the pattern to be formed should be improved. For example, in the region shown in FIG. 2, the line-and-space repetition structure 412 having a height of 4×λ or more in the proximity dummy region 41 improves the uniformity of pattern density and the pattern regularity around the line-shaped gate patterns 3111 in the peripheral circuit region 31. As a result, the process performance index Cp of the exposing process of one or more is achieved, as shown in FIG. 6. Similarly, in the region shown in FIG. 9, the dummy gate pattern 4211 in the proximity dummy region 42 arranged within a length of 4×λ from the right-most line-shaped gate pattern 3111C improves the uniformity of pattern density and the pattern regularity around the line-shaped gate pattern 3111C.

The pattern layout with such improved local uniformity of pattern density and improved local pattern regularity reduces dimensional deviation in the resist pattern. However, the process performance of the etching process, which is performed using the resist pattern formed by the exposing process as a mask, is greatly affected by the uniformity of pattern density in a wider range.

Accordingly, the layout structure of the semiconductor integrated circuit preferably includes the outer dummy region 70 as well as the proximity dummy regions 41 and 42. The proximity dummy regions are formed along one or more sides of the peripheral circuit region and improve the uniformity of pattern density and the pattern regularity in the short range that affect the exposing process. The outer dummy region is formed outside of the proximity dummy region and improves the uniformity of pattern density in the long range.

Such an outer dummy region 70 is formed with the method disclosed in the Japanese Unexamined Patent Application Publication No. 2002-9161, for example. That is, at first, a layout data wherein the internal circuit region 20, the peripheral circuit region 31, the proximity dummy regions 41 and 42, and the outer circuit region 60, are arranged within the chip area, and a layout data wherein the outer dummy cells 700 are arranged over the entire chip are, are separately created. And, then, the two layout data sets are merged into a single data set using a logical synthesis to form the layout structure 1 of a semiconductor integrated circuit in which the outer dummy region 70 is formed by arranging the outer dummy cells 700 so as to fill the spaces outside of the internal circuit region 20, the peripheral circuit region 31, and the proximity dummy regions 41 and 42, which are not filled by the outer circuit region 60, as shown in FIG. 12.

The exemplary layout structure of a semiconductor integrated circuit shown in FIG. 12 includes the internal circuit block, which is formed of the internal circuit region 20, the peripheral circuit region 31 arranged along a side of the internal circuit region 20, and the proximity dummy regions 41 and 42, and the outer circuit region 60, and the outer dummy region 70 arranged so as to fill the space between the internal circuit block and the outer circuit region 60. However, the layout structure may include various types of functional blocks such as a logic block formed with standard cells, analog-macro block, and so on, as well as the internal circuit block such as a memory block, for example.

Figure 13:
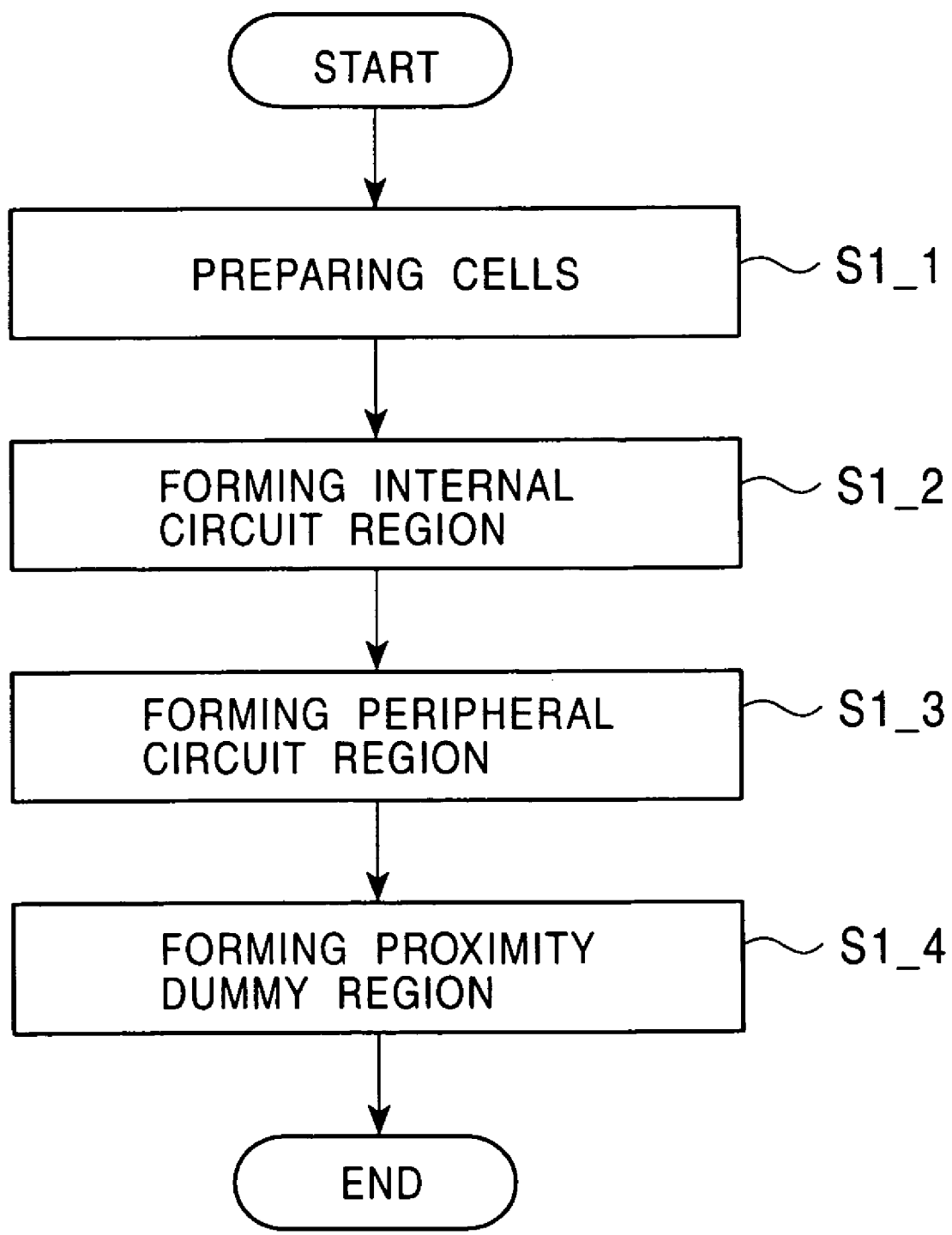
FIG. 13 is a flowchart illustrating a layout method of a semiconductor integrated circuit according to an exemplary embodiment of the present invention.

Description is made below regarding a method of forming, or a design method of a layout structure of a semiconductor integrated circuit 1 shown in FIG. 1 on a CAD tool with reference to FIGS. 1 and 13. FIG. 13 is a flowchart for describing the design method according to an exemplary embodiment of this invention.

During step S1_1, the memory cell 100, the dummy memory cell 110, the peripheral circuit cell 310, and the proximity dummy cells 410 and 420, shown in FIG. 1, are prepared and registered in a library of a CAD tool. Next, control continues to step S1_2.

During step S1-2, a plurality of the memory cell 100 registered in the library is arranged in the vertical and horizontal directions on the CAD tool to form the memory cell array 10. Furthermore, a plurality of the dummy memory cell 110 registered in the library is arranged along the outer perimeter of the memory cell array 10. As a result, the internal circuit region 20 is formed on the CAD tool as shown in FIG. 1. Next, control continues to step S1_3.

During step S1_3, a plurality of the peripheral circuit cell 310 registered in the library is arranged in a line in the horizontal direction along the lower side 20a of the internal circuit region 20 formed in Step S1_2, whereby the peripheral circuit region 31 is formed. Next, control continues to step S1_4.

During step S1_4, the a plurality of the proximity dummy cell 410 is arranged along the side (lower side) 31a of the peripheral circuit region 31 formed in Step S1_3, whereby the outer proximity dummy region 41 is formed. Furthermore, the proximity dummy cell 420 is arranged along each the left and right sides 31b of the peripheral circuit region 31, whereby the side proximity dummy regions 42 are formed.

As described above, performing the Steps S1_2 through S1_4 forms the principal part of the layout structure 1 of the semiconductor integrated circuit shown in FIG. 1 on a CAD tool.

Description is made below regarding the peripheral circuit cell 310 and the proximity dummy cell 410 for forming the outer proximity dummy region 41, which are prepared in Step S1_1.

Figure 14:
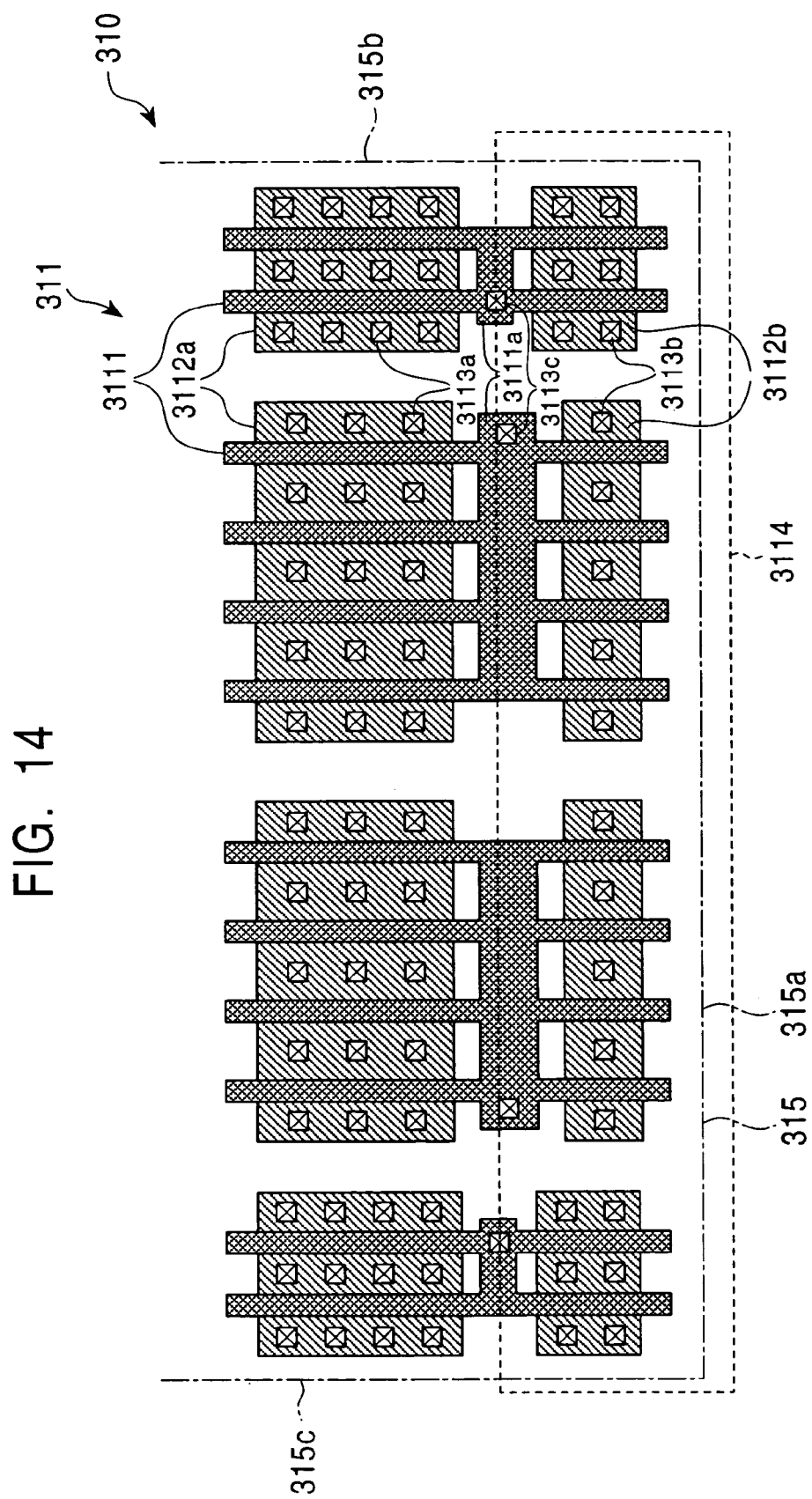
FIG. 14 is a schematic diagram illustrating a pattern layout in an exemplary peripheral circuit cell.

FIG. 14 shows a part of an exemplary pattern layout in the peripheral circuit cell 310. The exemplary pattern layout shown in FIG. 14 includes P-well patterns, P+ active patterns, N+ active patterns, gate patterns, contact patterns for connecting the active patterns and the gate patterns to the wiring patterns (not shown). Patterns in other layers are not shown in the drawing.

In FIG. 14, a peripheral circuit pattern 311 including a P-well pattern 3114, P+ active patterns 3112a, N+ active patterns 3112b, gate patterns 3111, and contact patterns 3113a, 3113b, and 3113c are arranged within a frame 315 denoted by alternating long and short dashed lines. Among them, P-well pattern 3114 extends beyond the left, right, and lower sides 315c, 315b, and 315a, of the frame 315.

At the time of arranging the cells for creating a layout structure of a semiconductor integrated circuit, the pattern that extends over the sides of the frame merge with patterns in the same layer in adjacent cells to form continuous pattern, as described later. Note that the region outside of the P-well pattern 3114 shown in the drawing serve as an N-well pattern. That is, following the completion of layout design on a CAD tool including merging of the patterns in adjacent cells described above, the pattern data is processed to create a mask pattern data for producing photomasks. During the processing to create the mask data, the pattern data of the P-well layer is inverted to create a N-well layer pattern data.

In this exemplary embodiment, the mask data of the N-well layer is created by such data processing, and accordingly, it is not necessary to arrange the N-well pattern at the time of designing the layout structure of the cell such as shown in FIG. 14. However, the cell is designed assuming that the N-well layer data will be created by such data processing, and accordingly, it can be considered that the layout data of the cell shown in FIG. 14 effectively includes a N-well pattern at the region outside of the P-well pattern 3114.

It should be appreciated that FIG. 14 only shows the left and right sides 315c and 315b, and the lower side 315a, and does not show the upper side of the peripheral circuit cell 310. That is, FIG. 14 shows only a portion of the pattern layout near the lower side 315a of the peripheral circuit cell 310.

Description is made below regarding a pattern layout of the proximity dummy cell 410 with reference to FIG. 15.

Figure 15:
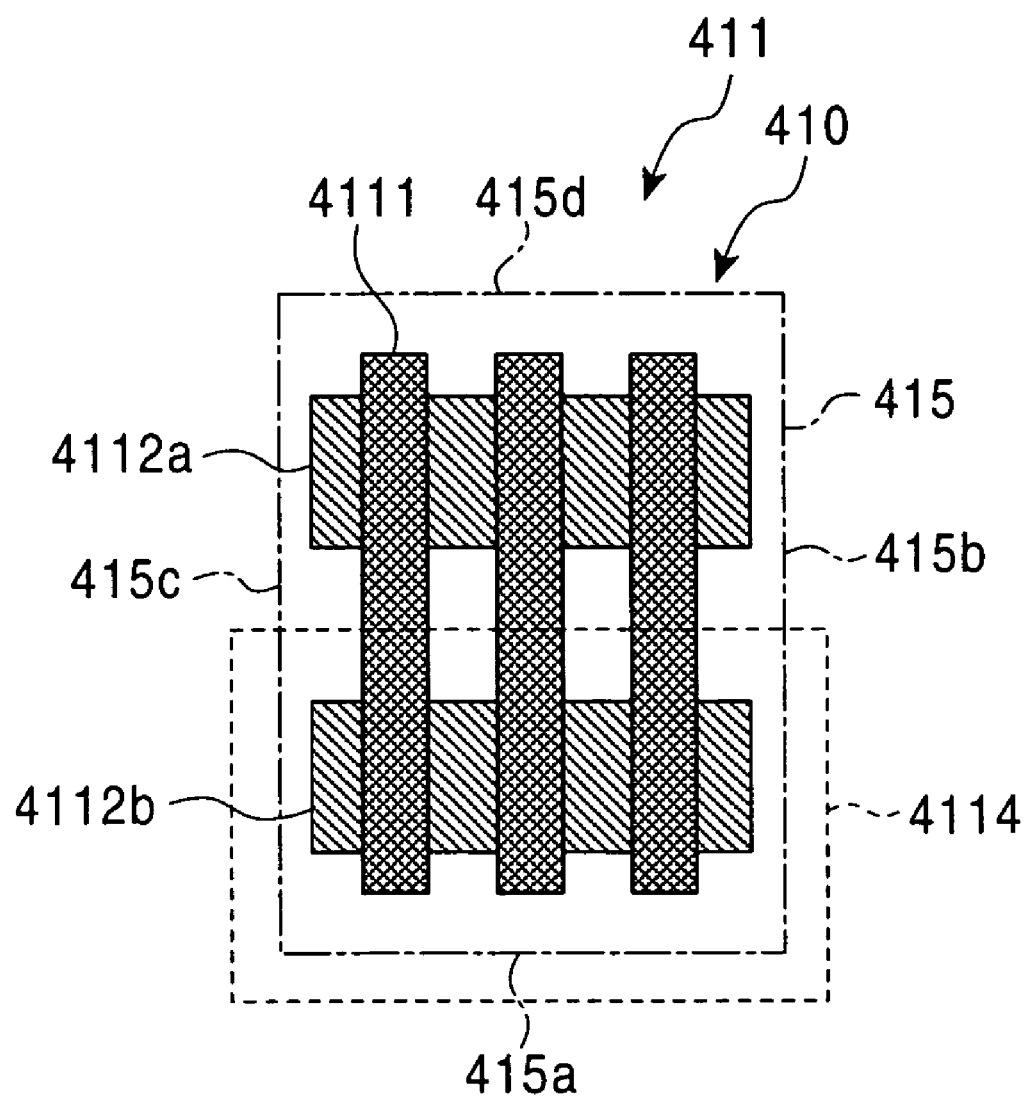
FIG. 15 is a schematic diagram illustrating a pattern layout of an exemplary proximity dummy cell for forming an outer proximity dummy region.

FIG. 15 shows an exemplary pattern layout in the proximity dummy cell 410. As shown in FIG. 15, the exemplary proximity dummy cell 410 includes a proximity dummy pattern 411 including a P-well pattern 4114, a P+ active pattern 4112a, the N+ active pattern 4112b, and gate patterns 4111, arranged within the frame 415 having the left, right, upper, and lower sides 415c, 415b, 415d, and 415a.

Among these patterns, the P-well pattern 4114 extends beyond the left, right, and lower sides 415c, 415b, and 415a, of the frame 415. At the time of arranging the proximity dummy cell 410 for creating a layout structure of a semiconductor integrated circuit, the pattern extending beyond the frame 415 merge with patterns in the same layer in adjacent cells (peripheral circuit cells and/or other proximity dummy cells) and form a continuous pattern. It should be appreciated that, in the pattern layout shown in FIG. 15, the region outside of the P-well pattern serve as an N-well pattern in the same way as with the peripheral circuit cell shown in FIG. 14.

The proximity dummy cell 410 shown in FIG. 15 has a width of a quarter of the width of the peripheral circuit cell 310 shown in FIG. 14. That is, the distance between the left and right sides 415c and 415b of the frame 415 of the proximity dummy cell 410 is a quarter of the distance between the left and right sides 315c and 315b of the frame 315 of the peripheral circuit cell 310.

During Step S1_3, the peripheral circuit cells 310 shown in FIG. 14 prepared in Step S1_1 are arranged in the horizontal direction such that the P-well pattern 3114 is positioned opposite to the lower side 20a of the internal circuit region 20 (see FIG. 1). That is, each peripheral circuit cell 310 is arranged with the direction as shown in FIG. 14.

On the other hand, in Step S1_4, the proximity dummy cells 410 are arranged such that the P-well pattern 4114 of each proximity dummy cell 410 faces the corresponding peripheral circuit cell 310. That is, each proximity dummy cell 410 is arranged with a vertically-flipped direction, i.e., with a vertically-flipped pattern layout of the layout shown in FIG. 15. Accordingly, the P-well patterns 3114 of the peripheral circuit cells 310 and the P-well patterns 4114 of the proximity dummy cells 410 merge into a continuous P-well pattern at the boundaries between them.

Description is made below regarding such merging of the well patterns with reference to FIG. 16.

Figure 16:
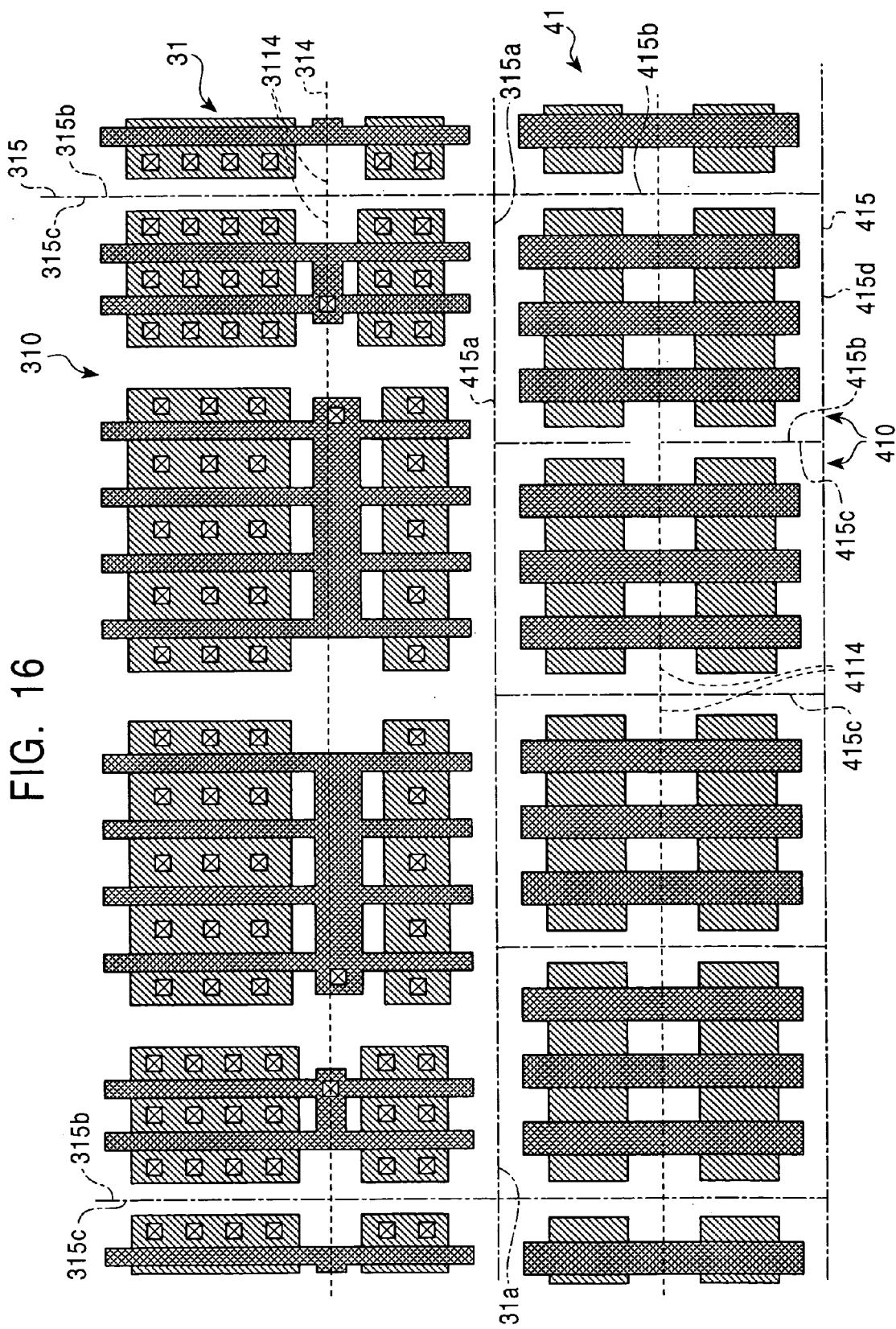
FIG. 16 is a diagram illustrating a pattern layout including the peripheral circuit region formed by arranging a plurality of peripheral circuit cells shown in FIG. 14, and the proximity dummy region formed by arranging a plurality of proximity dummy cells shown in FIG. 15.

FIG. 16 shows an exemplary pattern layout at a portion around the boundary between the peripheral circuit region 31 and the proximity dummy region 41 in the layout structure of the semiconductor integrated circuit after Step S1_4 (see FIG. 13). Arranging a plurality of peripheral circuit cells 310 shown in FIG. 14 forms the peripheral circuit region 31. Arranging a plurality of proximity dummy cells 410 shown in FIG. 15 forms the proximity dummy region 41. FIG. 16 shows the P-well patterns, the P+ active patterns, the N+ active patterns, the gate patterns, and the contact patterns, in the same way as in FIGS. 14 and 15.

As shown in FIG. 16, each peripheral circuit cell 310 is arranged with the direction shown in FIG. 14. That is, the peripheral circuit cell 310 is arranged such that the lower side 315a, beyond which the P-well pattern 3114 extends, faces the downward direction. Furthermore, in the horizontal direction, the peripheral circuit cells 310 are arranges without forming gaps between them, as shown in FIG. 16. That is, the plurality of peripheral circuit cells 310 is arranged in the horizontal direction such that the left and right sides 315c and 315b of the cells are in contact with each other. Accordingly, the P-well patterns 3114 of the plurality of peripheral circuit cells 310 arranged in the horizontal direction are merged with each other to form a continuous P-well pattern.

Also, as shown in FIG. 16, each proximity dummy cell 410 is arranged with the vertically-flipped pattern layout of the layout shown in FIG. 15. That is, the proximity dummy cell 410 is arranged such that the lower side 415a, beyond which the P-well pattern 4114 extends, faces the upward direction. In the horizontal direction, the plurality of proximity dummy cells 410 is arranged in the horizontal direction such that the left and right sides 415c and 415b of the cells are in contact with each other, in the same way as with the peripheral circuit cells 310. Thus, the P-well patterns 4114 of the plurality of proximity dummy cells 410 arranged in the horizontal direction are merged with each other to form a continuous P-well pattern.

Furthermore, each proximity dummy cell 410 is arranged such that the upper side 415*a* is in contact with the lower side 315*a* of the corresponding peripheral circuit cell 310. As a result, the P-well pattern 3114 in the peripheral circuit cell 310 and the P-well pattern 4114 in the proximity dummy cell 410 arranged in the vertical direction are merged with each other to form a continuous P-well pattern.

As a result, the P-well patterns 3114 and 4114 in the plurality of peripheral circuit cells 310 and the plurality of proximity dummy cells 410 thus two-dimensionally arranged, are merged with each other to form a continuous P-well pattern 314. The continuous P-well pattern 314 has a width (or a dimension in the horizontal direction in the drawing) that extends over the entire width of the peripheral circuit region 31. That is, the continuous p-well pattern 314 has a width that extends over the entire length of the lower side 31*a* of the peripheral circuit region 31, which is formed with the lower sides 315*a* of the plurality of peripheral circuit cells 310 arranged in the horizontal direction.

As described above, during Step S1_1, the proximity dummy cell is designed such that the well pattern can be merged with the well pattern in the peripheral circuit cell arranged adjacent to the proximity dummy cell. As a result, in the formation of the proximity dummy region in Step S1_4, the proximity dummy cell may be arranged with its side in contact with the side of corresponding peripheral circuit cell, i.e., without forming a gap between them. That is, the exemplary pattern layout according to this embodiment allows arranging the proximity dummy cell with its side in contact with the side of corresponding peripheral circuit cell while preventing formation of a small space between the well patterns that is not allowed by the layout design rule.

According to this exemplary embodiment, the peripheral circuit cells 310 and the proximity dummy cells 410 are arranged with their sides in contact with each other. Accordingly, the distance between the proximity dummy patterns, or the line-and-space repetition structure formed by the proximity dummy patterns, in the proximity dummy region, and the gate patterns in the peripheral circuit region can be minimized. Thereby the local uniformity of pattern density and the local pattern regularity are effectively improved.

Furthermore, according to this exemplary embodiment, the proximity dummy region is formed without a logical synthesis, thereby enabling layout design in a short period of time.

According to an exemplary embodiment of this invention, the proximity dummy cell is specifically designed for arranging along the lower side 31*a* of the peripheral circuit region 31, which is formed by arranging the peripheral circuit cells 310. Accordingly, the proximity dummy cell can be designed giving consideration to the patterns of the peripheral circuit cells.

For example, when the peripheral circuit cell includes a P-well pattern 3114 extending beyond the lower side 315*a* of the frame 315 of the peripheral circuit cell, as in the case shown in FIG. 14, the proximity dummy cell 410 is also designed to include a P-well pattern 4114 extending beyond the lower side 415*a* of the frame 415 of the proximity dummy cell 410. The thus designed proximity dummy cell 410 may be arranged along the lower side 31*a* of the peripheral circuit region 31 with the vertically-flipped pattern layout, with its lower side 415*a* in contact with the lower side 315*a* of the corresponding peripheral circuit cell 310, as in the case shown in FIG. 16. Thus, the layout design can be performed without using logical synthesis.

On the contrary, according to the technique disclosed in Japanese Unexamined Patent Application Publication No. 2002-9161, the dummy cell is designed so as to arrange around any circuit device pattern. Therefore, the dummy cell cannot be specifically designed to arrange along any of the circuit device patterns. As a result, logical synthesis is required to arrange the dummy cells.

Description is made below regarding the proximity dummy cell 420 for forming the side proximity dummy regions 42. The proximity dummy cell 420 is one of the cells prepared in Step S1_1 shown in FIG. 13.

Figure 17:
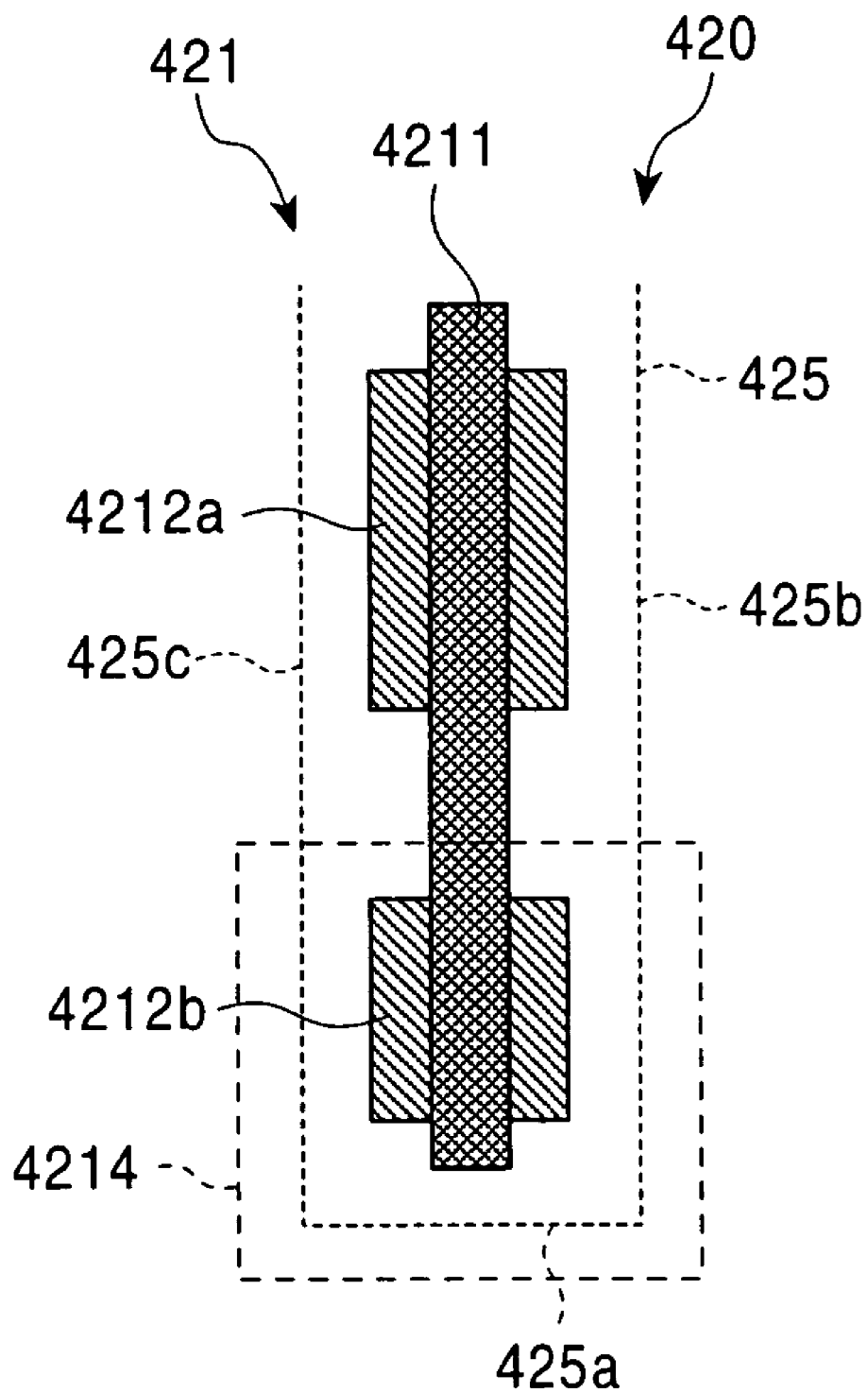
FIG. 17 is a schematic diagram illustrating an exemplary pattern layout of a proximity dummy cell for forming side proximity dummy regions.

FIG. 17 is a pattern layout diagram illustrating the patterns of the proximity dummy cell 420. FIG. 17 shows patterns in the P-well layer, the P+ active layer, the N+ active layer, and the gate layer.

As shown in FIG. 17, the proximity dummy cell 420 includes proximity dummy pattern 421 including a P-well pattern 4214, a P+ active pattern 4212*a*, an N+ active pattern 4212*b*, and a gate pattern 4211, within a frame 425 having the left, right, and lower sides 425*c*, 425*b*, and 425*a*. Among these patterns, the P-well pattern 4214 extends beyond the left, right, and lower sides 425*c*, 425*b*, and 425*a* of the frame 425. At the time of arranging the cells for forming the layout structure of a semiconductor integrated circuit, the pattern extending beyond the sides of the frame 425 merge with patterns in other cells arranged adjacent to the proximity dummy cell 420.

It should be appreciated that, same as the peripheral circuit cell 310 shown in FIG. 14 and as the proximity dummy cell 420 shown in FIG. 15, the region outside of the P-well pattern 4214 serves as a N-well pattern.

FIG. 17 does not show the upper side of the frame 425. That is, FIG. 17 shows a portion of the pattern layout of the proximity dummy cell 420 near the lower side 425*a* of the frame 425. The proximity dummy cell 420 is formed with an arbitrary width. That is, the width of the proximity dummy cell 420, or the distance between the left and right sides 425*c* and 425*b*, is not designed to have a specific relationship to the width of the peripheral circuit cell 310.

Figure 18:
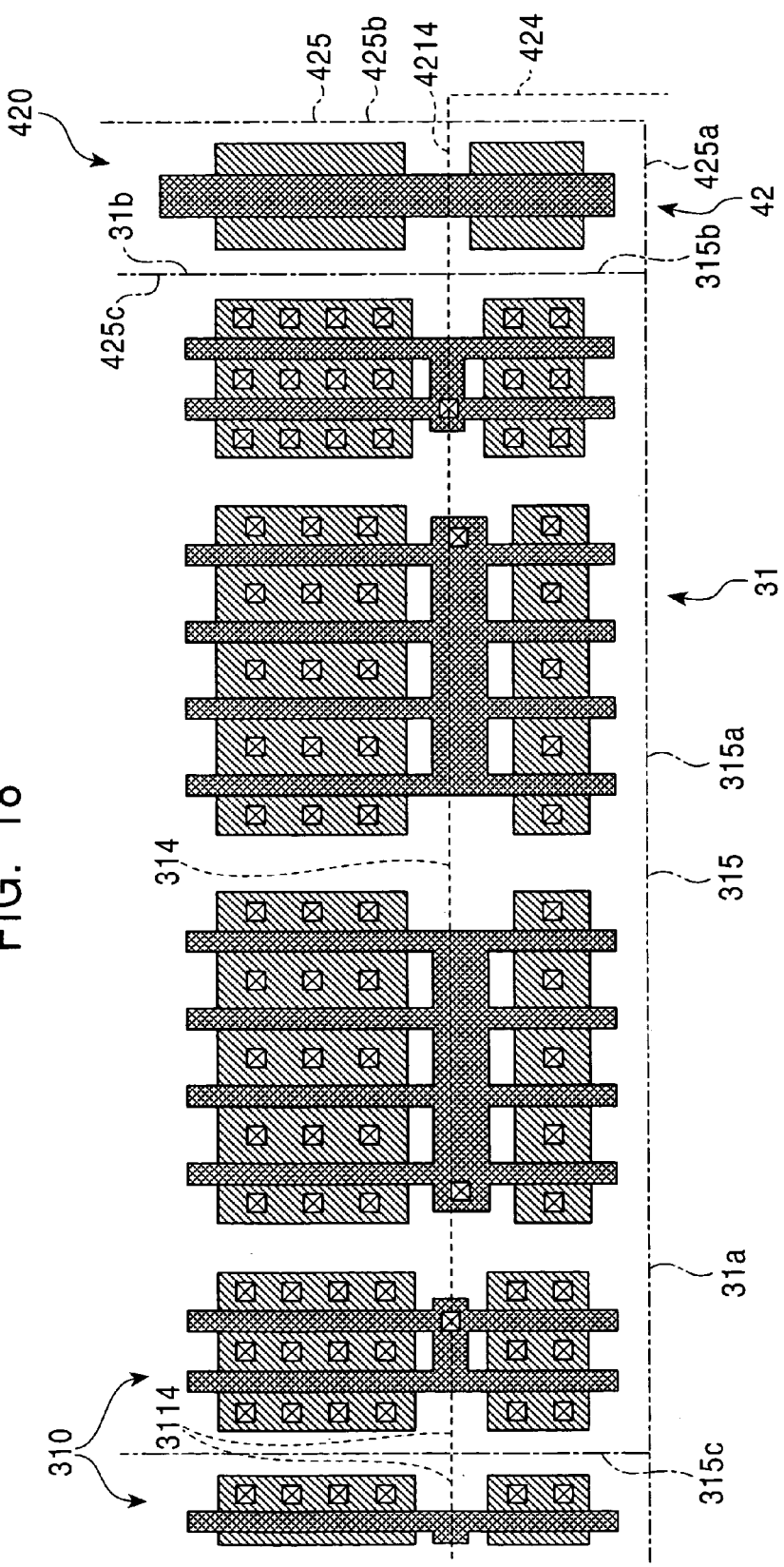
FIG. 18 is a schematic diagram illustrating an exemplary pattern layout in which the proximity dummy cell shown in FIG. 17 is arranged along the right side of the peripheral circuit region formed by arranging a plurality of peripheral circuit cells shown in FIG. 14.

FIG. 18 is an exemplary pattern layout diagram illustrating a part of the layout structure of a semiconductor integrated circuit after Step S1_4 shown in FIG. 13. As shown in FIG. 18, the proximity dummy cell 420 shown in FIG. 17 is arranged along the right side 31*b* of the peripheral circuit region 31, which is formed by arranging a plurality of peripheral circuit cells 310.

During Step S1_4, the proximity dummy cell 420 shown in FIG. 17 is arranged along the right side 31*b* of the peripheral circuit region 31 such that the left side 425*c* of the frame of the proximity dummy cell 420 is in contact with the right side 315*b* of the frame of the right-most peripheral circuit cell 310. Accordingly, the P-well pattern 3114 of the peripheral circuit cell 310 and the P-well pattern 4214 of the proximity dummy cell 420 are merged with each other and form a continuous P-well pattern.

The peripheral circuit cell 310 is arranged with the direction shown in FIG. 14. That is, the peripheral circuit cell 310 is arranged such that the P-well pattern 3114 faces the downward direction, as shown in FIG. 18. Accordingly, the proximity dummy cell 420 is also arranged with the direction shown in FIG. 17 so that the P-well pattern 4214 faces the downward direction.

Here, as shown in FIG. 16, the peripheral circuit region 31 includes a continuous P-well pattern formed with the P-well patterns 3114 of the plurality of peripheral circuit cells 310 arranged in the horizontal direction. Furthermore, the continuous P-well pattern thus formed and the P-well patterns 4114 of the plurality of proximity dummy cells 410 for forming the outer proximity dummy region 41, which are not shown in FIG. 18, merge with each other. As a result, a continuous P-well pattern 314 is formed so as to extend over the entire width (the dimension along the horizontal direction in the drawing) of the peripheral circuit region 31 in the horizontal direction along the lower side 31a of the peripheral circuit region 31.

Furthermore, as shown in FIG. 18, the continuous P-well pattern 314 thus formed and the P-well pattern 4214 in the proximity dummy cell 420 arranged along the left side 31b of the peripheral circuit region 31 merge with each other and form a continuous P-well pattern 424. Accordingly, the continuous P-well pattern 424 has a dimension in the horizontal direction in the drawing that extends over the entire region including the peripheral circuit region 31 and the side proximity dummy regions 42 formed along the left and right sides 31b of the peripheral circuit region 31.

According to the exemplary embodiment, in Step S1_1 shown in FIG. 13, the proximity dummy cell 420 is designed such that the well pattern in the proximity dummy cell arranged adjacent to the peripheral circuit cell 310 merge with the well pattern in the peripheral circuit cell. As a result, during Step S1_4, the proximity dummy cell 420 can be arranged with its side in contact with the side of the peripheral circuit cell 310 along which the proximity dummy cell 420 is arranged. In other words, the proximity dummy cell can be arranged along the peripheral circuit cell without forming a gap between the sides of the cells.

Such arrangement of the proximity dummy cell 420 ensures the positioning of the proximity dummy pattern in the proximity dummy cell within a length of 4×λ from the right-most gate pattern in the peripheral circuit cell 310. As a result, the uniformity of pattern density and the pattern regularity are improved. Furthermore, layout design without logical synthesis, and thus, in a short period of time, is enabled.

Description is made below regarding another example of the peripheral circuit cell prepared in Step S1_1 shown in FIG. 13.

Figure 19:
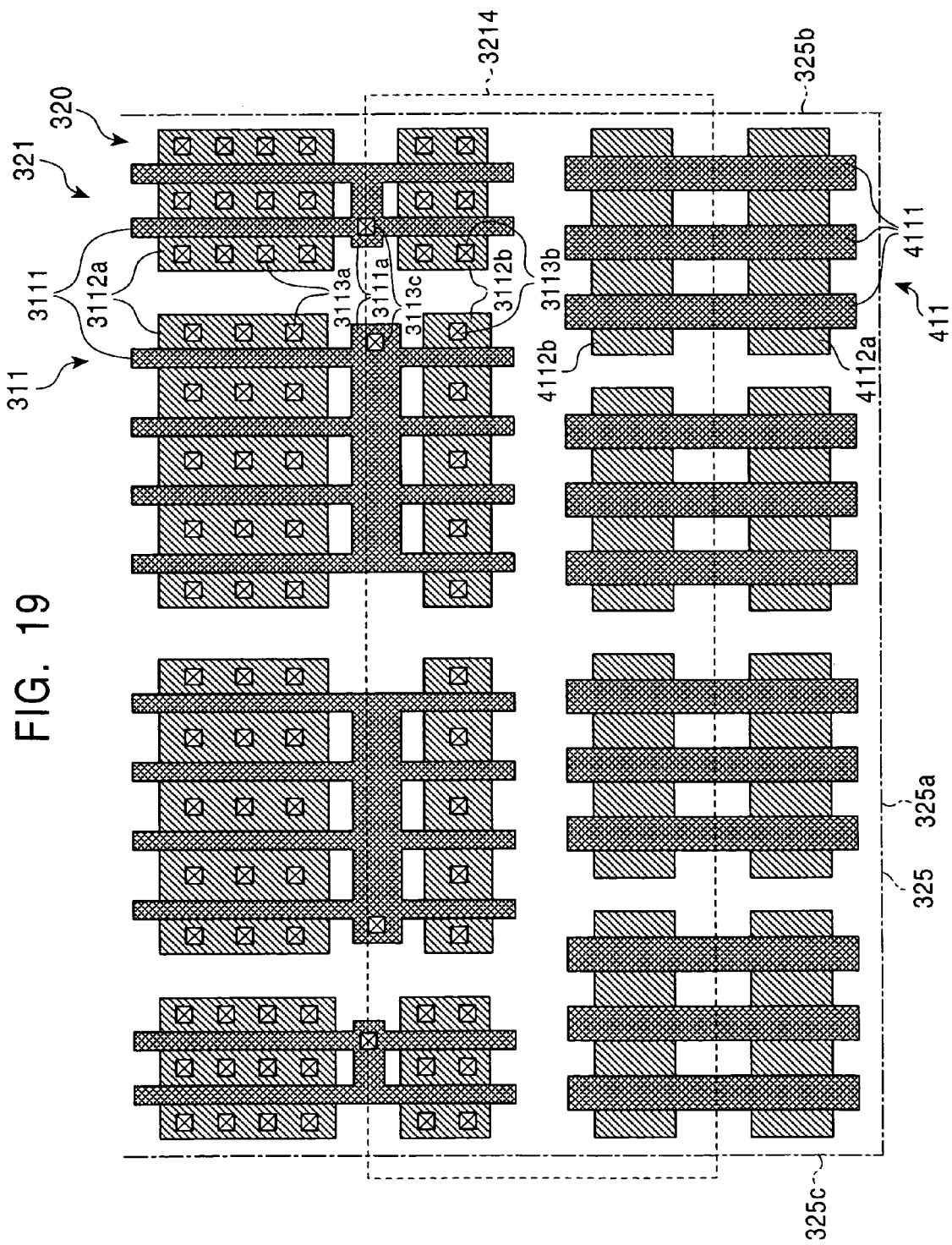
FIG. 19 is a schematic diagram illustrating an exemplary pattern layout of a combined peripheral circuit cell including proximity dummy patterns as well as a peripheral circuit pattern.

FIG. 19 is an exemplary pattern layout diagram illustrating an exemplary peripheral circuit cell 320 having a layout structure different from that shown in FIG. 14. FIG. 19 shows patterns in the P-well layer, the P+ active layer, the N+ active layer, the gate layer, and the contact layer.

The peripheral circuit cell 320 (which will be referred to as a "combined peripheral circuit cell" hereafter) shown in FIG. 19 includes a pattern (combined peripheral circuit pattern) 321, which is composed of both the peripheral circuit pattern 311 in the peripheral circuit cell 310 (which will be referred to as a "separate peripheral circuit cell" hereafter) shown in FIG. 14 and a plurality of the proximity dummy pattern 411 of the proximity dummy cell 410 shown in FIG. 15. Both of the patterns are arranged within the frame 325.

More precisely, the combined peripheral circuit cell shown in FIG. 19 includes a peripheral circuit pattern 311 included in the separate peripheral circuit cell 310 shown in FIG. 14 and four proximity dummy patterns 411 each included in the proximity dummy cell 410 shown in FIG. 15. The peripheral circuit pattern 311 is arranged with the same pattern layout as shown in FIG. 14. Also, the proximity dummy pattern 411 is arranged with the vertically-flipped pattern layout of that shown in FIG. 15.

The four exemplary proximity dummy patterns 411 are arranged with the same positional relationship to the peripheral circuit pattern 311 as that in the layout structure shown in FIG. 16, i.e., as if four proximity dummy cells 410, each including the proximity dummy pattern 411, are arranged such that the lower sides 415a of the proximity dummy cells are in contact with the lower side 315a of the separate peripheral circuit cell 310 and such that the right and left sides 415c and 415b of the proximity dummy cells are in contact with each other.

Further, in the combined peripheral circuit cell 19, the P-well pattern of the separate peripheral circuit cell 310 and the P-well patterns of the four proximity dummy cells 410 are merged into a continuous P-well pattern 3214.

As described above, according to an exemplary embodiment, the combined peripheral circuit cell including the proximity dummy patterns is prepared beforehand. Accordingly, it becomes unnecessary to prepare a separate proximity dummy cell for forming the outer proximity dummy region.

Furthermore, during Step S1_3 shown in FIG. 13, the outer proximity dummy region is formed simultaneously with the formation of the peripheral circuit region 31. Accordingly, in a case where the side proximity dummy regions 42 are not formed, Step S1_4 for forming the proximity dummy region can be omitted. Even in a case where the side proximity dummy regions 42 are formed, processing in Step S1_4 is reduced, thereby reducing the period of time for designing the layout structure.

Description is made below regarding another exemplary layout structure different from that of the semiconductor integrated circuit shown in FIG. 1.

Figure 20:
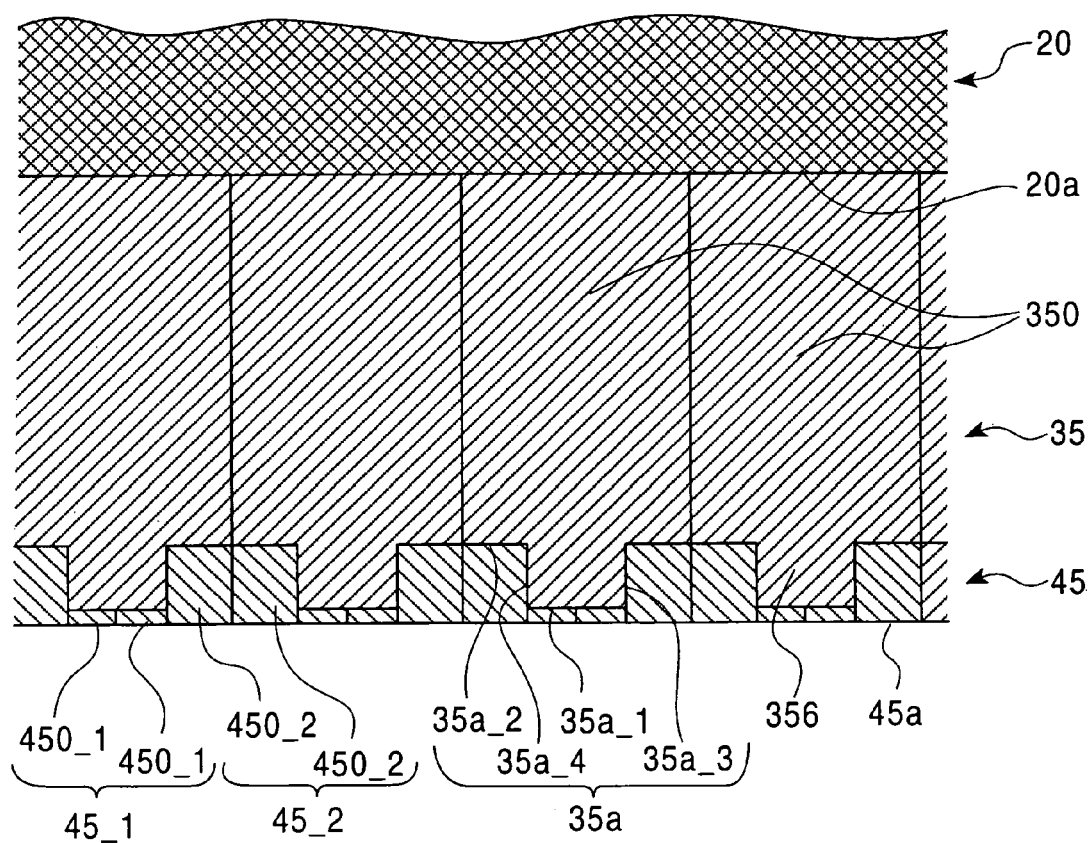
FIG. 20 is a schematic diagram illustrating a part of an exemplary layout structure of a semiconductor integrated circuit including a proximity dummy region formed along a side of a peripheral circuit region having protrusions and recesses.

FIG. 20 is a schematic diagram showing a part of an exemplary layout structure of a semiconductor integrated circuit different from that shown in FIG. 1.

Specifically, FIG. 20 shows a part of the internal circuit region 20, and parts of the peripheral circuit region 35 and the proximity dummy region 45 formed along the lower side 20a of the internal circuit region 20. In the layout structure of the semiconductor integrated circuit shown in FIG. 20, peripheral circuit cells 350 (first peripheral circuit cells) each having a protrusion 356 are arranged along the lower side 20a of the internal circuit region 20 for forming the peripheral circuit region 35. The proximity dummy region 45 is formed along the side 35a of the peripheral circuit region 35 opposite to the internal circuit region 20.

The side 35a opposite to the internal circuit region 20 is not straight, but has protrusions and recesses formed by the protrusions 356 of the first peripheral circuit cells 350. Specifically, the side 35a is divided into a plurality of unit sides including i) the first unit sides 35a_1 which are parallel to the lower side 20a of the internal circuit region 20 and are protruded outwardly from the lower side 20a, ii) second unit sides 35a_2 which are parallel to the lower side 20a of the internal circuit region 20 and are recessed inwardly to the lower side 20a, and iii) third and fourth unit sides 35a_3 and 35a_4 which are perpendicular to the lower side 20a of the internal circuit region 20 and serve as the left or right side of the protrusions 356.

In the exemplary layout structure shown in FIG. 20, a plurality of types of proximity dummy cells having shapes corresponding to the unit sides 35a_1 through 35a_4 are arranged to form the exemplary proximity dummy region 45.

That is, two first proximity dummy cells 450_1 are arranged along each of the first unit sides 35a_1 to form first unit proximity dummy regions 45_1. Furthermore, two second proximity dummy cells 450_2, each having a larger height (dimension in the vertical direction) than that of the first proximity dummy cell 450_1, are arranged along each of the second unit sides 35a_2 to form second unit proximity dummy regions 45_2.

The first unit proximity dummy regions 45_1 and the second unit proximity dummy regions 45_2 are alternately arranged in the horizontal direction to form the proximity dummy region 45 over the entire length of the side 35a of the peripheral circuit region having protrusions and recesses. In the exemplary layout structure shown in FIG. 20, the proximity dummy region 45 has a straight lower side 45a opposite to the peripheral circuit region 35.

Here, each second proximity dummy cell 450_2, which is arranged along the second unit side 35a_2, contacts the third and the fourth unit sides 35a_3 and 35a_4, as well.

For example, let us assume that the outermost portion of the peripheral circuit region 35, near the side 35a opposite to the internal circuit region 20, includes a plurality of fine line-shaped gate patterns, each extending in the vertical direction, i.e., in the direction perpendicular to the lower side 20a of the internal circuit region, arranged in the horizontal direction, i.e., in the direction parallel to the lower side 20a of the internal circuit region.

In this case, the proximity dummy region 45 preferably includes a line-and-space repetition structure formed of a plurality of line-shaped dummy gate patterns, each extending in the vertical direction, arranged in the horizontal direction. Thereby, the uniformity of pattern density and the pattern regularity around the outermost portion of the peripheral circuit region 35 are improved. Accordingly, each of the first proximity dummy cell 450_1 and the second proximity dummy cell 450_2 preferably includes a plurality of line-shaped dummy gate patterns, each extending in the vertical direction, arranged in the horizontal direction.

Description is made below of another layout structure with reference to FIG. 21. In the exemplary layout structure shown in FIG. 21, same as the case shown in FIG. 20, the side 35a of the peripheral circuit region 35 has protrusions and recesses. Different from the case shown in FIG. 20, however, the layout structure shown in FIG. 21 has the proximity dummy regions 46 only along the first and the second unit sides 35a_1 and 35a_2.

Specifically, two first proximity dummy cells 460_1 are arranged along each of the first unit side 35a_1 to form a first proximity dummy regions 46_1. Furthermore, two second proximity dummy cells 460_2 are arranged along each of the second unit side 35a_2 to form a second unit proximity dummy regions 46_2. It should be appreciated that no proximity dummy region is formed along the third and the fourth unit sides 35a_3 and 35a_4.

In some cases, the layout structure exhibits a poor process performance, or an impermissible dimensional deviation, only at some specific portions, depending upon the patterns arranged in the outermost portion of the peripheral circuit region 35 near the side 35a opposite to the internal circuit region 20. For example, let us assume that the layout structure exhibits the poor process performance only at the regions near the first and second unit sides 35a_1 and 35a_2. In this case, it is sufficient to form proximity dummy regions only along the first and second unit sides 35a_1 and 35a_2 in order to reduce the dimensional deviation, as in the case shown in FIG. 21.

Figure 21:
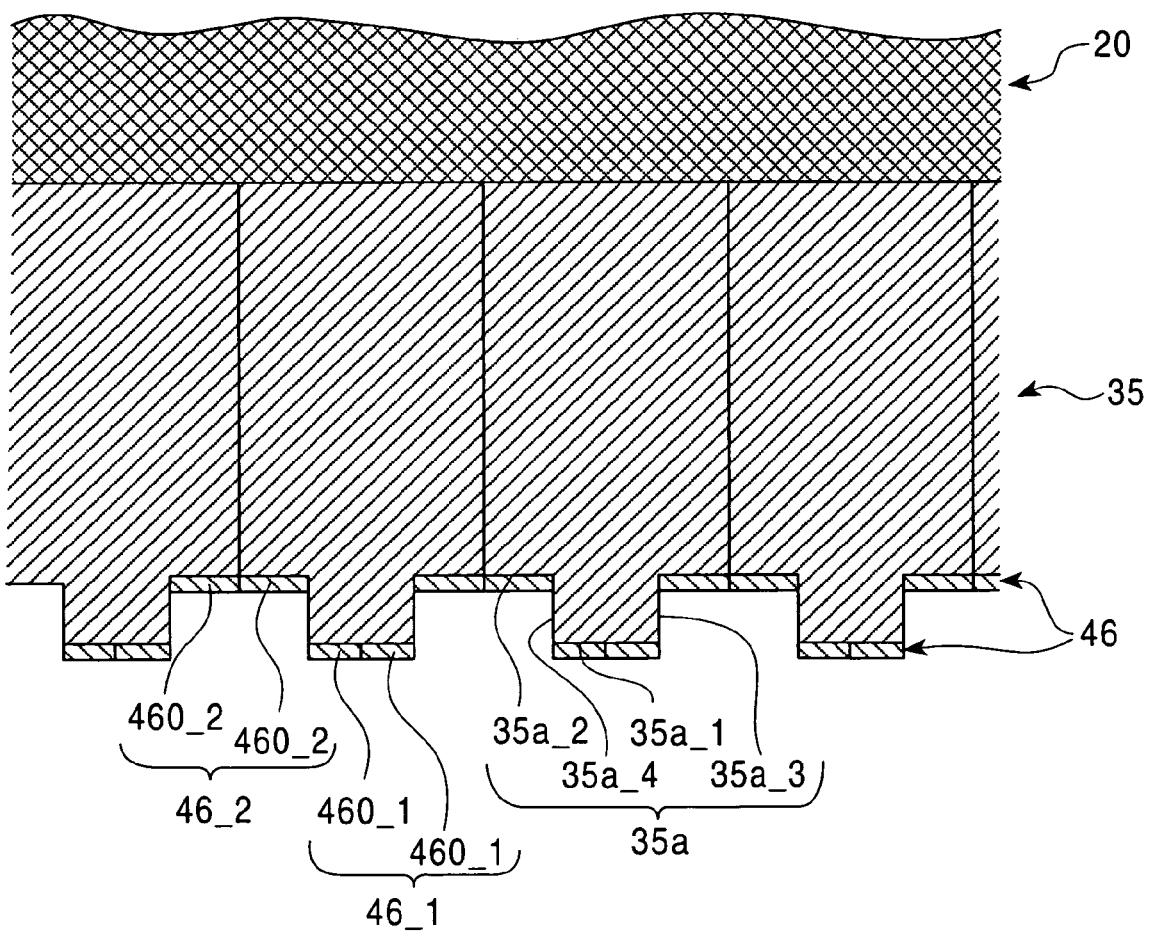
FIG. 21 is a schematic diagram illustrating a part of another exemplary layout structure of a semiconductor integrated circuit including a proximity dummy region formed along a side of a peripheral circuit region having protrusions and recesses.

In the example shown in FIG. 21, each of the first and second proximity dummy cells 460_1 and 460_2 may include a proximity dummy pattern having a plurality of line-shaped dummy gate patterns, each extending in the vertical direction, arranged in the horizontal direction, in the same way as the proximity dummy cell 410 shown in FIG. 2, for example. Thus, each of the first and second unit proximity dummy regions 46_1 and 46_2 include a line-and-space repetition structure with a regularity of two or more pairs of line-and-space patterns every length of 8×λ.

As described above, in the layout structure according to this invention, it is not always necessary to from the proximity dummy region along the entire length of the outer side, i.e., the side opposite to the internal circuit region, of the peripheral circuit region. Rather, it is possible to form the proximity dummy regions only along some specific portions, or the necessary portions, of the outer side of the peripheral circuit region.

In such case, a line-and-space repetition structure is formed within each of the proximity dummy regions formed along the portions of the outer side of the peripheral circuit region. The repetition structure has a regularity of two or more pairs of lines and spaces every length of 8×λ at any position within the corresponding proximity dummy region, i.e., at any position along the portion of the outer side along which the corresponding proximity dummy region is formed.

When the outermost portion of the peripheral circuit region 35 near the outer side 35a includes line-shaped gate patterns each extending in the vertical direction, it is also advantageous to arrange, in addition to arranging the proximity dummy cells along the first and the second unit sides 35a_1 and 35a_2, proximity dummy cells, each including at least one line-shaped dummy gate pattern extending in the vertical direction, in contact with the third and fourth unit sides 35a_3 and 35a_4 of the peripheral circuit region 35.

In this case, the line-shaped dummy gate pattern in the proximity dummy cell and the line-shaped gate patterns in the peripheral circuit region form a continuous line-and-space repetition structure. As a result, the uniformity of pattern density and the pattern regularity of the gate patterns at the portions of the peripheral circuit region near the third and fourth unit sides 35a_3 and 35a_4 are further improved.

Description is made below regarding other exemplary layout structures of the semiconductor integrated circuit according to this invention.

Figure 22:
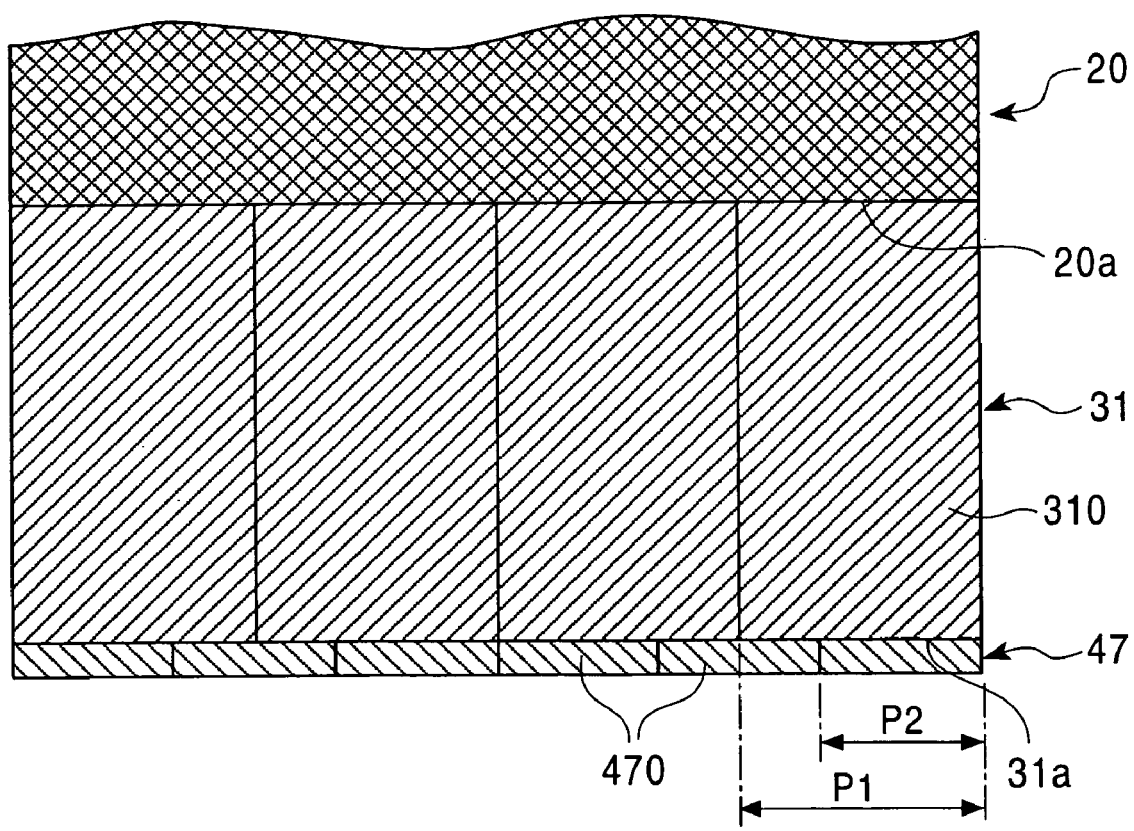
FIG. 22 is a schematic diagram illustrating a part of an exemplary layout structure different from those shown in FIGS. 1, 20, and 21.

FIG. 22 is a schematic diagram which shows a part of a layout structure different from those shown in FIGS. 1, 20, and 21. In the exemplary layout structure of the semiconductor integrated circuit shown in FIG. 22, the peripheral circuit cells 310 are arranged along the lower side 20a of the internal circuit region 20, with a first pitch (P1) in the horizontal direction, to form the peripheral circuit region 31. Furthermore, the proximity dummy cells 470 are arranged along the entire length of the lower side 31a of the peripheral circuit region 31, which is opposite to the internal circuit region 20, with a second pitch (P2) in the horizontal direction, to form the proximity dummy region 47.

Here, P1 is not equal to P2, and furthermore, P1 is not equal to any of P2×n, where n is an integer not lower than two. In the schematic layout structure of the semiconductor integrated circuit shown in FIG. 22, however, the total dimension of the proximity dummy region 47 in the horizontal direction is equal to the total dimension of the peripheral circuit region 31 in the horizontal direction.

Specifically, n1 (n1 is an integer of two or more, and four in the drawing) peripheral circuit cells 310 are arranged with the first pitch P1. That is, the total dimension of the peripheral circuit region 31 in the horizontal direction is P1×n1. On the other hand, n2 (which is an integer of two or more, and six in the drawing) proximity dummy cells 470 are arranged with the second pitch P2. That is, the total dimension of the proximity dummy region 47 in the horizontal direction is P2×n2. And P1×n1 is equal to P2×n2.

As described above, in the layout structure of the semiconductor integrated circuit according to this invention, it is not necessary to arrange the proximity dummy cells with the same pitch as that of the peripheral circuit cells. Furthermore, it is not necessary to arrange the proximity dummy cells with a pitch equal to 1/n times the pitch of the arrangement of the peripheral circuit cells, where n is an integer not less than 2.

However, the pitch (or the width of the cell in the direction of arranging the cell) of the proximity dummy cell is preferably determined such that the entire dimension of the peripheral circuit region is equal to the entire dimension of the proximity dummy region, as shown in FIG. 22. As a result, the proximity dummy region can be formed over the entire region that requires the proximity dummy patterns, without unnecessarily extending the proximity dummy region beyond the required region.

Figure 23:
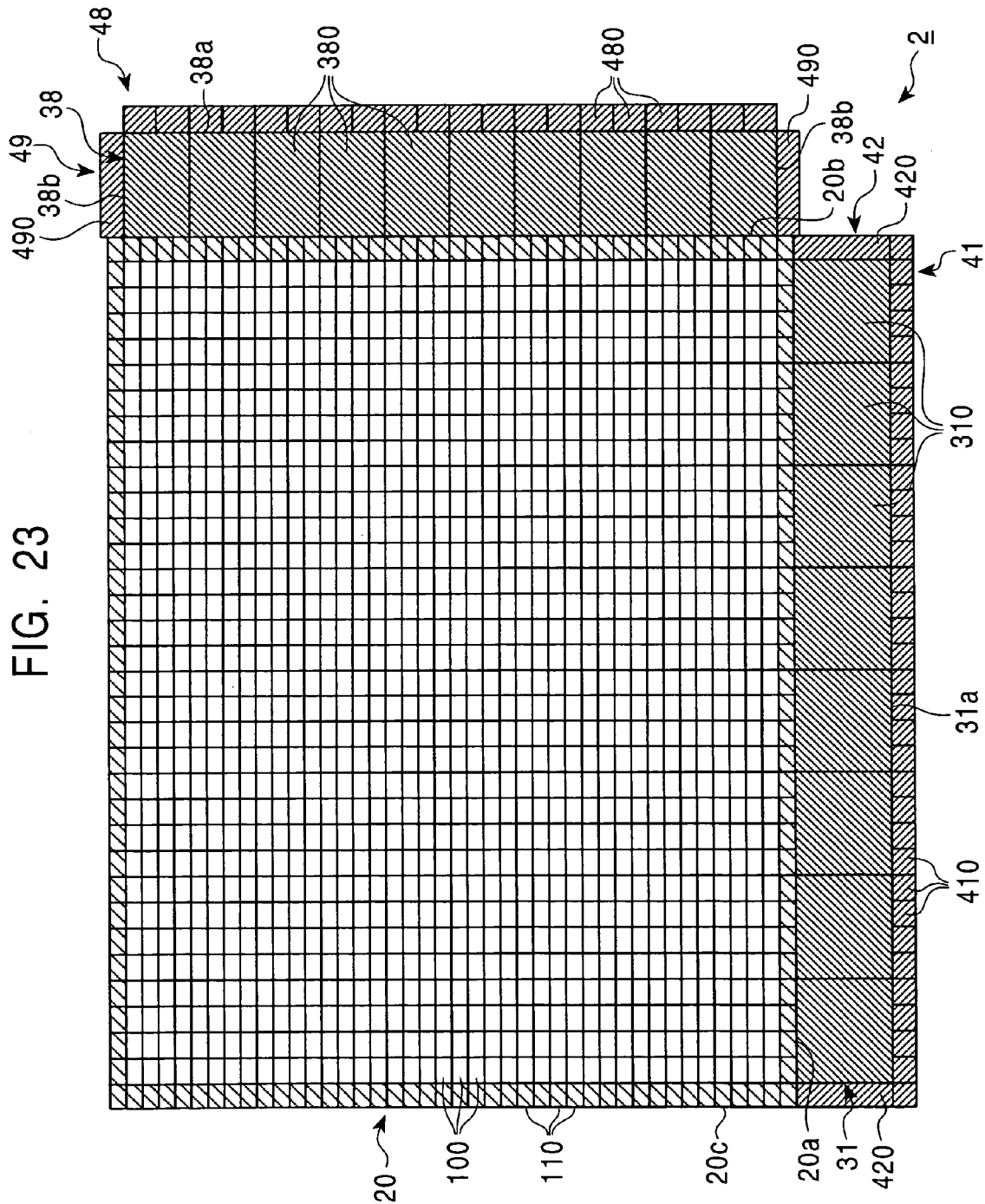
FIG. 23 is a diagram illustrating an exemplary layout structure of a semiconductor integrated circuit in which peripheral circuit regions are formed along two sides of the internal circuit region, and proximity dummy regions are formed along the sides of each of the peripheral circuit regions.

Finally, description is made below regarding the semiconductor integrated circuit having a layout structure different from that shown in FIG. 1, with reference to FIG. 23.

As described above, the exemplary semiconductor integrated circuit shown in FIG. 1 has the layout structure 1 in which the peripheral circuit region 31 is formed only along the lower side 20a of the internal circuit region 20, and the proximity dummy regions 41 and 42 are formed along the perimeters of the peripheral circuit region 31. On the contrary, in the exemplary layout structure 2 of the semiconductor integrated circuit shown in FIG. 23, a plurality of peripheral circuit cells 310 and 380 are arranged along respective sides 20a and 20b, which are perpendicular with each other, of the internal circuit region 20 to form the first and the second peripheral circuit regions 31 and 38. Furthermore, in the layout structure shown in FIG. 23, proximity dummy regions are formed along the sides of the peripheral circuit regions 31 and 38.

That is, for the first peripheral circuit region 31 formed along the lower side 20a of the internal circuit region 20, same as the layout structure 1 shown in FIG. 1, the outer proximity dummy region 41 and the side proximity dummy regions 42 are formed. In addition, for the second peripheral circuit region 38 formed along the right side 20b of the internal circuit region, a plurality of proximity dummy cells 480 are arranged along the right side 38a of the second peripheral circuit region 38 to form an outer proximity dummy region 48. Furthermore, a proximity dummy cell 490 is arranged along each of the upper and lower sides 38b of the second peripheral circuit region 38 to form side proximity dummy regions 49.

Each of the proximity dummy regions 48 and 49 formed along respective sides of the second peripheral circuit region 38 forms line-and-space repetition structure in the same way as the proximity dummy regions 41 and 42 formed along the sides of the first peripheral circuit region.

For example, the outer proximity dummy region 48 includes a line-and-space repetition structure formed of a plurality of line-shaped dummy patterns. The line-and-space repletion structure has a regularity of two or more pairs of lines and spaces every length of 8×λ along the direction of the repetition at any position along the right side 38a of the second peripheral circuit region 38, along which the outer proximity dummy region is formed.

On the other hand, a plurality of line-shaped gate patterns arranged in the peripheral circuit region 38 and one or more lines-shaped dummy pattern arranged in each of the upper-side and the lower-side proximity dummy regions 49 form a continuous line-and-space repetition structure extending over the entire region including the peripheral circuit region 38 and the upper-side and the lower-side proximity dummy regions 49. In this case, the repetition structure includes one or more lines within a length of 4×λ on both sides, i.e., in the peripheral circuit region and in the proximity dummy region, from each of the lines formed by the upper-most and the lower-most gate patterns in the peripheral circuit region 38.

Further, when the peripheral circuit regions are formed along three or more sides of the internal circuit region 20, the proximity dummy region is preferably formed along each of the peripheral circuit regions.

What is claimed is:

1. A layout structure of a semiconductor integrated circuit formed on a semiconductor substrate by a photolithographic process using an exposing light having a wavelength of λ, the layout structure comprising:
   an internal circuit region including a cell array formed by arranging a plurality of unit cells in rows and columns, an outer perimeter of the internal circuit region having an internal side;
   a peripheral circuit region formed by arranging a plurality of peripheral circuit cells along the internal side, each of the plurality of peripheral circuit cells being different from any of the plurality of unit cells and including a peripheral circuit pattern in at least one layer, an outer perimeter of the peripheral circuit region having a peripheral side that does not face the internal side; and
   a proximity dummy region formed by arranging a plurality of proximity dummy cells along the peripheral side, each of the plurality of proximity dummy cells having a proximity dummy pattern, which does not contribute to a logical function of the semiconductor integrated circuit, in the at least one layer,
   wherein the proximity dummy patterns in the plurality of proximity dummy cells arranged along the peripheral side form, in the at least one layer, a line-and-space repetition structure extending along the peripheral side and including two or more pairs of lines and spaces between the lines in every 8×λ at any position within the proximity dummy region.

2. The layout structure according to claim 1, wherein the peripheral side of the peripheral circuit region is opposite to the internal circuit region.

3. The layout structure according to claim 1, wherein the line-and-space repetition structure has a height of not less than 4×λ in a direction perpendicular to the peripheral side.

4. The layout structure according to claim 1, wherein the peripheral circuit patterns in the peripheral circuit cells arranged along the internal side form, in the at least one layer, a second line-and-space repetition structure extending along the peripheral side and including two or more pairs of lines and spaces between the lines every 8×λ.

5. The layout structure according to claim 1, wherein:
   the photolithographic process utilizes an optical proximity correction (OPC);
   the peripheral circuit pattern includes portions having dimensions that require the OPC; and
   the proximity dummy pattern has a minimum dimension that does not require the OPC.

6. The layout structure according to claim 5, wherein a distance, in a direction perpendicular to the peripheral side, between the line-and-space repetition structure and a portion of the peripheral circuit pattern having a dimension that requires the OPC closest to the peripheral side is not larger than 4×λ.

7. The layout structure according to claim 5, wherein the line-and-space repetition structure in the proximity dummy region includes three or more pairs of the lines and spaces between the lines in every 8×λ at any position within the proximity dummy region.

8. A layout structure of a semiconductor integrated circuit formed on a semiconductor substrate by a photolithographic process using an exposing light having a wavelength of λ, the layout structure comprising:
- an internal circuit region including a cell array formed by arranging a plurality of unit cells in rows and columns, an outer perimeter of the internal circuit region having an internal side;
- a peripheral circuit region formed by arranging a plurality of peripheral circuit cells along the internal side, each of the plurality of peripheral circuit cells being different from any of the plurality of unit cells and including a peripheral circuit pattern in at least one layer, an outer perimeter of the peripheral circuit region having a peripheral side that does not face the internal side; and
- a proximity dummy region formed by arranging a proximity dummy cell along the peripheral side, the proximity dummy cell having a proximity dummy pattern, which does not contribute to a logical function of the semiconductor integrated circuit, in the at least one layer, wherein:
- the peripheral circuit patterns in the peripheral circuit cells arranged along the internal side and the proximity dummy pattern in the proximity dummy cell arranged along the peripheral side form, in the at least one layer, a continuous line-and-space repetition structure including lines and spaces between the lines; and
- the line-and-space repetition structure includes one of the lines, in each of the peripheral circuit region and the proximity dummy region, within 4×λ from a first one of the lines in the peripheral circuit region closest to the peripheral side.

9. The layout structure according to claim 8, wherein the line-and-space repetition structure extends over an entire length of the peripheral circuit region in a direction parallel to the internal side and includes two or more pairs of the lines and spaces between the lines in every 8×λ.

10. The layout structure according to claim 8, wherein the peripheral side is perpendicular to the internal side.

11. The layout structure according to any claim 8, wherein:
- the photolithographic process utilizes an optical proximity correction (OPC);
- the peripheral circuit pattern includes portions having dimensions that require the OPC; and
- the proximity dummy pattern has a minimum dimension that does not require the OPC.

12. A method of forming; on a computer system, a layout structure of a semiconductor integrated circuit to be formed on a semiconductor substrate by a photolithographic process using an exposing light with a wavelength of λ, the method comprising:
- registering in a library, unit cell data, peripheral circuit cell data different from the unit cell data and including data regarding a peripheral circuit pattern in at least one layer of a peripheral circuit cell, and proximity dummy cell including data regarding a proximity dummy pattern, which does not contribute to a logical function of the semiconductor integrated circuit, in the at least one layer;
- forming an internal circuit region by arranging a plurality of unit cells in rows and columns based on the unit cell data, an outer perimeter of the internal circuit region having an internal side;
- forming a peripheral circuit region by arranging a plurality of peripheral circuit cells along the internal side based on the neripheral circuit cell data, an outer perimeter of the peripheral circuit region having a peripheral side that does not face the internal side; and
- forming a proximity dummy region by arranging a plurality of proximity dummy cells along the peripheral side based on the proximity circuit cell data, such that the proximity dummy patterns in the plurality of proximity dummy cells arranged along the peripheral side form, in the at least one layer, a line-and-space repetition structure extending along the peripheral side and including two or more pairs of lines and spaces between the lines in every 8×λ at any position within the proximity dummy region.

13. The method according to claim 12, wherein:
- each of the peripheral circuit cell and the proximity dummy cell prepared in the library includes a well pattern in a well layer; and
- the forming of the proximity dummy region is performed such that the well pattern in each of the plurality of proximity dummy cells merge with the well pattern in corresponding one of the plurality of peripheral circuit cells.

14. The method according to claim 12, wherein:
- the photolithographic process utilizes an optical proximity correction (OPC);
- the peripheral circuit pattern includes portions having dimensions that require the OPC; and
- the proximity dummy pattern has a minimum dimension that does not require the OPC.

15. The method according to claim 14, wherein the line-and-space repetition structure includes three or more pairs of the lines and spaces between the lines in every 8×λ at any position within the proximity dummy region.

16. A method of forming, on a computer system, a layout structure of a semiconductor integrated circuit to be formed on a semiconductor substrate by a photolithographic process using an exposing light having a wavelength of λ, the method comprising:
- registering, in a library, unit cell data, peripheral circuit cell data different from the unit cell data and including data regarding a peripheral circuit pattern in at least one layer of a peripheral circuit cell, and proximity dummy cell data including data regarding a proximity dummy pattern, which does not contribute to a logical function of the semiconductor integrated circuit, in the at least one layer;
- forming an internal circuit region by arranging a plurality unit cells in rows and columns based on the unit cell data, an outer perimeter of the internal circuit region having an internal side;
- forming a peripheral circuit region by arranging a plurality of peripheral circuit cells along the internal side based on the peripheral circuit cell data, an outer perimeter of the peripheral circuit region having a peripheral side that does not face the internal side; and forming a proximity dummy region by arranging a proximity dummy cell along the peripheral side based on the proximity dummy cell data, such that:

the peripheral circuit patterns in the peripheral circuit cells arranged along the internal side and the proximity dummy pattern in the proximity dummy cell arranged along the peripheral side form, in the at least one layer, a continuous line-and-space repetition structure including lines and spaces between the lines; and the line-and-space repetition structure includes one of the lines, in each of the peripheral circuit region and the proximity dummy region, within 4×λ from a first one of the lines in the peripheral circuit region closest to the peripheral side.

17. The method according to claim 16, wherein:

each of the peripheral circuit cell and the proximity dummy cell prepared in the library includes a well pattern in a well layer; and the forming of the proximity dummy region is performed such that the well pattern in the proximity dummy cell merge with the well pattern in corresponding one of the plurality of peripheral circuit cells.

18. The method according to claim 16, wherein:

the photolithographic process utilizes an optical proximity correction (OPC);

the peripheral circuit pattern includes portions having dimensions that require the OPC; and the proximity dummy pattern has a minimum dimension that does not require the OPC.

19. A method of forming, on a computer system, a layout structure of a semiconductor integrated circuit to be formed on a semiconductor substrate by a photolithographic process using an exposing light having a wavelength of λ, the method comprising:

registering unit cell data and combined peripheral circuit cell data in a library;

the combined peripheral circuit cell data including data regarding a peripheral circuit pattern, in at least one layer of a peripheral circuit cell, adjacent to a first side of a frame of a combined peripheral circuit cell, and data regarding a plurality of proximity dummy patterns, which do not contribute to a logical function of the semiconductor integrated circuit, in the at least one layer, adjacent to a second side of the frame opposite to the first side;

arranging a plurality of unit cells in rows and columns to form an internal circuit region based on the unit cell data, an outer perimeter of the internal circuit region having an internal side; and arranging a plurality of combined peripheral circuit cells along the internal side with the first sides of their frames facing the internal side based on the combined peripheral circuit cell data, such that:

the peripheral circuit patterns in the plurality of combined peripheral circuit cells form a peripheral circuit region; and the plurality of proximity dummy patterns in the plurality of combined peripheral circuit cells form a proximity dummy region having, in the at least one layer, a line-and-space repetition structure extending in a direction parallel to the internal side and including two or more pairs of lines and spaces between the lines in every 8×λ at any position within the proximity dummy region.

20. The method according to claim 19, wherein:

the photolithographic process utilized an optical proximity correction (OPC)

the peripheral circuit pattern includes portions having dimensions that require the OPC; and the proximity dummy pattern has a minimum dimension that does not require the OPC.

21. The method according to claim 20, wherein the line-and-space repetition structure includes three or more pairs of the lines and spaces between the lines in every 8×λ at any position within the proximity dummy region.

22. A photomask comprising a mask pattern for forming one of a plurality of layers in a layout structure of a semiconductor integrated circuit by producing a reduced image of the mask pattern on a semiconductor substrate using an exposing light having a wavelength of λ, the layout structure comprising:

an internal circuit region including a cell array formed by arranging a plurality of unit cells in rows and columns, an outer perimeter of the internal circuit region having an internal side;

a peripheral circuit region formed by arranging a plurality of peripheral circuit cells along the internal side, each of the plurality of peripheral circuit cells being different from any of the plurality of unit cells and including a peripheral circuit pattern in the one of the plurality of layers, an outer perimeter of the peripheral circuit region having a peripheral side that does not face the internal side; and a proximity dummy region formed by arranging a plurality of proximity dummy cells along the peripheral side, each of the plurality of proximity dummy cells having a proximity dummy pattern, which does not contribute to a logical function of the semiconductor integrated circuit, in the one of the plurality of layers, wherein the proximity dummy patterns in the plurality of proximity dummy cells arranged along the peripheral side form, in the one of the plurality of layers, a line-and-space repetition structure extending along the peripheral side and including two or more pairs of lines and spaces between the lines in every 8×λ at any position within the proximity dummy region.

23. The photomask according to claim 22, wherein an optical proximity correction (OPC) is performed for a first portion of the mask pattern for forming the peripheral circuit region, but not performed for a second portion of the mask pattern for forming the proximity dummy region.

24. The photomask according to claim 23, wherein:

λ is not larger than 248 nm; and the OPC is performed for, within the first portion, third portions of the mask pattern for forming portions of the peripheral circuit region having dimensions less than a critical dimension which is less than about λ.

25. The layout structure according to claim 23, wherein the line-and-space repetition structure includes three or more pairs of the lines and spaces between the lines in every 8×λ at any position within the proximity dummy region.

26. A photomask comprising a mask pattern for forming one of a plurality of layers in a layout structure of a semiconductor integrated circuit by producing a reduced image of the mask pattern on a semiconductor substrate using an exposing light having a wavelength of λ, the layout structure comprising:

an internal circuit region including a cell array formed by arranging a plurality of unit cells in rows and columns, an outer perimeter of the internal circuit region having an internal side;

a peripheral circuit region formed by arranging a plurality of peripheral circuit cells along the internal side, each of the plurality of peripheral circuit cells being different from any of the plurality of unit cells and including a peripheral circuit pattern in the one of the plurality of layers, an outer perimeter of the peripheral circuit region having a peripheral side that does not face the internal side; and a proximity dummy region formed by arranging a proximity dummy cell along the peripheral side, the proximity dummy cell having a proximity dummy pattern, which does not contribute to a logical function of the semiconductor integrated circuit, in the one of the plurality of layers, wherein:

the plurality of peripheral circuit patterns in the peripheral circuit cells arranged along the internal side and the proximity dummy pattern in the proximity dummy cell arranged along the peripheral side form, in the one of the plurality of layers, a continuous line-and-space repetition structure including lines and spaces between the lines; and the line-and-space repetition structure includes one of the lines, in each of the peripheral circuit region and the proximity dummy region, within $4\times\lambda$ from a first one of the lines in the peripheral circuit region closest to the peripheral side.

27. The photomask according to claim 26, wherein an optical proximity correction (OPC) is performed for a first portion of the mask pattern for forming the peripheral circuit region, but not performed for a second portion of the mask pattern for forming the proximity dummy region.

28. The photomask according to claim 27, wherein:

$\lambda$ is not larger than 248 nm; and the OPC is performed for, within the first portion, third portions of the mask pattern for forming portions of the peripheral circuit region having dimensions less than a critical dimension which is less than about $\lambda$.

* * * * *